(12) United States Patent
Jovovic et al.

(10) Patent No.: US 11,152,557 B2
(45) Date of Patent: Oct. 19, 2021

(54) THERMOELECTRIC MODULE WITH INTEGRATED PRINTED CIRCUIT BOARD

(71) Applicant: Gentherm Incorporated, Northville, MI (US)

(72) Inventors: Vladimir Jovovic, Ann Arbor, MI (US); Eric Poliquin, Claremont, CA (US); Ellen M. Heian, Glendora, CA (US)

(73) Assignee: GENTHERM INCORPORATED, Northville, MI (US)

( * ) Notice: Subject to any disclaimer, the term of this patent is extended or adjusted under 35 U.S.C. 154(b) by 35 days.

(21) Appl. No.: 16/417,149

(22) Filed: May 20, 2019

(65) Prior Publication Data
US 2020/0266327 A1    Aug. 20, 2020

Related U.S. Application Data

(60) Provisional application No. 62/808,205, filed on Feb. 20, 2019.

(51) Int. Cl.
| | |
|---|---|
| *H01L 35/32* | (2006.01) |
| *H05K 1/02* | (2006.01) |
| *H01L 35/34* | (2006.01) |

(52) U.S. Cl.
CPC .............. *H01L 35/32* (2013.01); *H01L 35/34* (2013.01); *H05K 1/0201* (2013.01); *H05K 2201/10219* (2013.01)

(58) Field of Classification Search
CPC ........ H01L 35/32; H01L 35/34; H05K 1/0201
See application file for complete search history.

(56) References Cited

U.S. PATENT DOCUMENTS

| | | |
|---|---|---|
| 1,120,781 A | 12/1914 | Altenkirch et al. |
| 1,839,156 A | 12/1931 | Lumpkin |

(Continued)

FOREIGN PATENT DOCUMENTS

| | | |
|---|---|---|
| CA | 979490 | 12/1975 |
| CN | 2044703 U | 9/1989 |

(Continued)

OTHER PUBLICATIONS

U.S. Appl. No. 14/821,514, filed Aug. 7, 2015, Lofy.

(Continued)

*Primary Examiner* — Jayne L Mershon
(74) *Attorney, Agent, or Firm* — Knobbe, Martens, Olson & Bear, LLP

(57) ABSTRACT

A thermoelectric module assembly for thermally conditioning a component is includes first and second heat spreaders spaced apart from one another and at least one thermoelectric sub-assembly between and in thermal communication with the first and second heat spreaders. The at least one thermoelectric sub-assembly includes a plurality of thermoelectric devices and a printed circuit board having a plurality of electrical conduits. Each of the thermoelectric devices has a first end portion and a second end portion, the second end portion opposite from the first end portion, the first end portion mechanically coupled to the printed circuit board and in electrical communication with the plurality of electrical conduits, and the second end portion spaced from the printed circuit board.

17 Claims, 20 Drawing Sheets

(56) References Cited

U.S. PATENT DOCUMENTS

| | | |
|---|---|---|
| 2,235,620 A | 3/1941 | Nessell |
| 2,362,259 A | 11/1944 | Findley |
| 2,363,168 A | 11/1944 | Findley |
| 2,461,432 A | 2/1949 | Mitchell |
| 2,462,984 A | 3/1949 | Maddison |
| 2,493,067 A | 1/1950 | Goldsmith |
| 2,499,901 A | 3/1950 | Brown, Jr. |
| 2,512,559 A | 6/1950 | Williams |
| 2,519,241 A | 8/1950 | Findley |
| 2,782,834 A | 2/1957 | Vigo |
| 2,791,956 A | 5/1957 | Guest |
| 2,813,708 A | 11/1957 | Frey |
| 2,884,956 A | 5/1959 | Perlin |
| 2,931,286 A | 4/1960 | Fry, Sr. et al. |
| 2,938,357 A | 5/1960 | Sheckler |
| 2,959,017 A | 11/1960 | Gilman et al. |
| 2,976,700 A | 3/1961 | Jackson |
| 2,984,077 A | 5/1961 | Gaskill |
| 2,992,538 A | 7/1961 | Siegfried |
| 3,004,393 A | 10/1961 | Alsing |
| 3,006,979 A | 10/1961 | Rich |
| 3,019,609 A | 2/1962 | Pietsch |
| 3,030,145 A | 4/1962 | Kottemann |
| 3,039,817 A | 6/1962 | Taylor |
| 3,071,495 A | 1/1963 | Hanlein |
| 3,077,079 A | 2/1963 | Pietsch |
| 3,085,405 A | 4/1963 | Frantti |
| 3,090,206 A | 5/1963 | Anders |
| 3,126,116 A | 3/1964 | Clinehens |
| 3,129,116 A | 4/1964 | Corry |
| 3,136,577 A | 6/1964 | Richard |
| 3,137,142 A | 6/1964 | Venema |
| 3,137,523 A | 6/1964 | Karner |
| 3,138,934 A | 6/1964 | Roane |
| 3,178,894 A | 4/1965 | Mole et al. |
| 3,178,895 A | 4/1965 | Mole et al. |
| 3,186,240 A | 6/1965 | Daubert |
| 3,197,342 A | 7/1965 | Neild |
| 3,212,275 A | 10/1965 | Tillman |
| 3,240,628 A | 3/1966 | Sonntag, Jr. |
| 3,253,649 A | 5/1966 | Laing |
| 3,266,064 A | 8/1966 | Figman |
| 3,282,267 A | 11/1966 | Eidus |
| 3,298,195 A | 1/1967 | Raskhodoff |
| 3,300,649 A | 1/1967 | Strawn |
| 3,325,312 A | 6/1967 | Sonntag, Jr. |
| 3,326,727 A | 6/1967 | Fritts |
| 3,351,498 A | 11/1967 | Shinn et al. |
| 3,366,164 A | 1/1968 | Newton |
| 3,392,535 A | 7/1968 | De Castelet |
| 3,486,177 A | 12/1969 | Marshack |
| 3,508,974 A | 4/1970 | Bressler |
| 3,522,106 A | 7/1970 | Debiesse et al. |
| 3,527,621 A | 9/1970 | Newton |
| 3,529,310 A | 9/1970 | Olmo |
| 3,550,523 A | 12/1970 | Segal |
| 3,554,815 A | 1/1971 | Osborn |
| 3,561,224 A | 2/1971 | Banks et al. |
| 3,599,437 A | 8/1971 | Panas |
| 3,607,444 A | 9/1971 | Debucs |
| 3,615,870 A | 10/1971 | Crouthamel |
| 3,626,704 A | 12/1971 | Coe, Jr. |
| 3,627,299 A | 12/1971 | Schwartze et al. |
| 3,632,451 A | 1/1972 | Abbott |
| 3,635,037 A | 1/1972 | Hubert |
| 3,640,456 A | 2/1972 | Sturgis |
| 3,648,469 A | 3/1972 | Chapman |
| 3,663,307 A | 5/1972 | Mole |
| 3,681,929 A | 8/1972 | Schering |
| 3,703,141 A | 11/1972 | Pernoud |
| 3,726,100 A | 4/1973 | Widakowich |
| 3,767,470 A | 10/1973 | Hines |
| 3,786,230 A | 1/1974 | Brandenburg, Jr. |
| 3,819,418 A | 6/1974 | Winkler et al. |
| 3,839,876 A | 10/1974 | Privas |
| 3,870,568 A | 3/1975 | Oesterhelt et al. |
| 3,876,860 A | 4/1975 | Nomura et al. |
| 3,894,213 A | 7/1975 | Agarwala |
| 3,899,054 A | 8/1975 | Huntress et al. |
| 3,902,923 A | 9/1975 | Evans et al. |
| 3,916,151 A | 10/1975 | Reix |
| 3,926,052 A | 12/1975 | Bechtel |
| 3,927,299 A | 12/1975 | Sturgis |
| 3,928,876 A | 12/1975 | Starr |
| 3,958,324 A | 5/1976 | Alais et al. |
| 4,002,108 A | 1/1977 | Drori |
| 4,038,831 A | 8/1977 | Gaudel et al. |
| 4,044,824 A | 8/1977 | Eskeli |
| 4,055,053 A | 10/1977 | Elfving |
| 4,056,406 A | 11/1977 | Markman et al. |
| 4,065,936 A | 1/1978 | Fenton et al. |
| 4,107,934 A | 8/1978 | Beitner |
| 4,124,794 A | 11/1978 | Eder |
| 4,195,687 A | 4/1980 | Taziker |
| 4,199,953 A | 4/1980 | Richter, Jr. et al. |
| 4,223,205 A | 9/1980 | Sturgis |
| 4,224,565 A | 9/1980 | Sosniak et al. |
| 4,229,687 A | 10/1980 | Newman |
| 4,242,778 A | 1/1981 | Kay |
| 4,281,516 A | 8/1981 | Berthet et al. |
| 4,297,841 A | 11/1981 | Cheng |
| 4,297,849 A | 11/1981 | Buffet |
| 4,301,658 A | 11/1981 | Reed |
| 4,314,008 A | 2/1982 | Blake |
| 4,315,599 A | 2/1982 | Biancardi |
| 4,324,845 A | 4/1982 | Stockel |
| 4,336,444 A | 6/1982 | Bice et al. |
| 4,338,944 A | 7/1982 | Arkans |
| 4,391,009 A | 7/1983 | Schild et al. |
| 4,402,188 A | 9/1983 | Skala |
| 4,413,857 A | 11/1983 | Hayashi |
| 4,420,940 A | 12/1983 | Buffet |
| 4,423,308 A | 12/1983 | Callaway et al. |
| 4,437,702 A | 3/1984 | Agosta |
| 4,438,070 A | 3/1984 | Stephens et al. |
| 4,444,851 A | 4/1984 | Maru |
| 4,448,028 A | 5/1984 | Chao et al. |
| 4,459,428 A | 7/1984 | Chou |
| 4,491,173 A | 1/1985 | Demand |
| 4,493,939 A | 1/1985 | Blaske et al. |
| 4,494,380 A | 1/1985 | Cross |
| 4,497,973 A | 2/1985 | Heath et al. |
| 4,499,329 A | 2/1985 | Benicourt et al. |
| 4,506,510 A | 3/1985 | Tircot |
| 4,518,700 A | 5/1985 | Stephens |
| 4,518,847 A | 5/1985 | Horst, Sr. et al. |
| 4,549,134 A | 10/1985 | Weiss |
| 4,554,968 A | 11/1985 | Haas |
| 4,567,351 A | 1/1986 | Kitagawa et al. |
| 4,572,430 A | 2/1986 | Takagi et al. |
| 4,611,089 A | 9/1986 | Elsner et al. |
| 4,634,803 A | 1/1987 | Mathiprakasam |
| 4,639,883 A | 1/1987 | Michaelis |
| 4,651,019 A | 3/1987 | Gilbert et al. |
| 4,665,707 A | 5/1987 | Hamilton |
| 4,671,567 A | 6/1987 | Frobose |
| 4,677,416 A | 6/1987 | Nishimoto et al. |
| 4,685,727 A | 8/1987 | Cremer et al. |
| 4,688,390 A | 8/1987 | Sawyer |
| 4,704,320 A | 11/1987 | Mizunoya et al. |
| 4,711,294 A | 12/1987 | Jacobs et al. |
| 4,712,832 A | 12/1987 | Antolini et al. |
| 4,730,459 A | 3/1988 | Schicklin et al. |
| 4,744,009 A | 5/1988 | Grabbe et al. |
| 4,777,802 A | 10/1988 | Feher |
| 4,782,664 A | 11/1988 | Sterna et al. |
| 4,791,274 A | 12/1988 | Horst |
| 4,793,651 A | 12/1988 | Inagaki et al. |
| 4,802,929 A | 2/1989 | Schock |
| 4,812,733 A | 3/1989 | Tobey |
| 4,823,554 A | 4/1989 | Trachtenberg et al. |
| 4,825,488 A | 5/1989 | Bedford |
| 4,828,627 A | 5/1989 | Connery |
| 4,853,992 A | 8/1989 | Yu |

(56) References Cited

U.S. PATENT DOCUMENTS

| | | |
|---|---|---|
| 4,865,929 A | 9/1989 | Eck |
| 4,907,060 A | 3/1990 | Nelson et al. |
| 4,923,248 A | 5/1990 | Feher |
| 4,947,648 A | 8/1990 | Harwell et al. |
| 4,969,684 A | 11/1990 | Zarotti |
| 4,981,324 A | 1/1991 | Law |
| 4,988,847 A | 1/1991 | Argos et al. |
| 4,989,626 A | 2/1991 | Takagi et al. |
| 4,997,230 A | 3/1991 | Spitalnick |
| 4,999,576 A | 3/1991 | Levinson |
| 5,002,336 A | 3/1991 | Feher |
| 5,006,178 A | 4/1991 | Bijvoets |
| 5,012,325 A | 4/1991 | Mansuria et al. |
| 5,014,909 A | 5/1991 | Yasuo |
| 5,015,545 A | 5/1991 | Brooks |
| 5,016,304 A | 5/1991 | Ryhiner |
| 5,022,462 A | 6/1991 | Flint et al. |
| 5,057,490 A | 10/1991 | Skertic |
| 5,070,937 A | 12/1991 | Mougin et al. |
| 5,071,652 A | 12/1991 | Jones et al. |
| 5,077,709 A | 12/1991 | Feher |
| 5,088,790 A | 2/1992 | Wainwright et al. |
| 5,097,674 A | 3/1992 | Imaiida et al. |
| 5,102,189 A | 4/1992 | Saito et al. |
| 5,106,161 A | 4/1992 | Meiller |
| 5,111,025 A | 5/1992 | Barma et al. |
| 5,111,664 A | 5/1992 | Yang |
| 5,117,638 A | 6/1992 | Feher |
| 5,119,640 A | 6/1992 | Conrad |
| 5,121,047 A | 6/1992 | Goedken et al. |
| 5,125,238 A | 6/1992 | Ragan et al. |
| 5,141,826 A | 8/1992 | Bohm et al. |
| 5,148,977 A | 9/1992 | Hibino et al. |
| 5,166,777 A | 11/1992 | Kataoka |
| 5,171,372 A | 12/1992 | Recine, Sr. |
| 5,180,293 A | 1/1993 | Hartl |
| 5,187,349 A | 2/1993 | Curhan et al. |
| 5,188,286 A | 2/1993 | Pence, IV |
| 5,197,291 A | 3/1993 | Levinson |
| 5,228,923 A | 7/1993 | Hed |
| 5,229,702 A | 7/1993 | Boehling |
| 5,232,516 A | 8/1993 | Hed |
| 5,254,178 A | 10/1993 | Yamada et al. |
| 5,255,735 A | 10/1993 | Raghava et al. |
| 5,256,857 A | 10/1993 | Curhan et al. |
| 5,265,599 A | 11/1993 | Stephenson et al. |
| 5,278,936 A | 1/1994 | Shao |
| 5,279,128 A | 1/1994 | Tomatsu et al. |
| 5,335,381 A | 8/1994 | Chang |
| 5,367,728 A | 11/1994 | Chang |
| 5,372,402 A | 12/1994 | Kuo |
| 5,375,421 A | 12/1994 | Hsieh |
| 5,382,075 A | 1/1995 | Shih |
| 5,385,382 A | 1/1995 | Single, II et al. |
| 5,395,708 A | 3/1995 | Hall |
| 5,409,547 A | 4/1995 | Watanabe et al. |
| 5,413,166 A | 5/1995 | Kerner et al. |
| 5,416,935 A | 5/1995 | Nieh |
| 5,419,489 A | 5/1995 | Burd |
| 5,419,780 A | 5/1995 | Suski |
| 5,429,680 A | 7/1995 | Fuschetti |
| 5,430,322 A | 7/1995 | Koyanagi et al. |
| 5,448,788 A | 9/1995 | Wu |
| 5,448,891 A | 9/1995 | Nakagiri et al. |
| 5,456,081 A | 10/1995 | Chrysler et al. |
| 5,473,783 A | 12/1995 | Allen |
| 5,493,742 A | 2/1996 | Klearman |
| 5,493,864 A | 2/1996 | Pomerene et al. |
| 5,497,625 A | 3/1996 | Manz et al. |
| 5,497,632 A | 3/1996 | Robinson |
| 5,505,520 A | 4/1996 | Frusti et al. |
| 5,515,238 A | 5/1996 | Fritz et al. |
| 5,524,439 A | 6/1996 | Gallup et al. |
| 5,542,503 A | 8/1996 | Dunn et al. |
| 5,544,487 A | 8/1996 | Attey et al. |
| 5,544,488 A | 8/1996 | Reid |
| 5,555,732 A | 9/1996 | Whiticar |
| 5,561,981 A | 10/1996 | Quisenberry et al. |
| 5,576,512 A | 11/1996 | Doke |
| 5,584,084 A | 12/1996 | Klearman et al. |
| 5,584,183 A | 12/1996 | Wright et al. |
| 5,592,363 A | 1/1997 | Atarashi et al. |
| 5,594,609 A | 1/1997 | Lin |
| 5,597,200 A | 1/1997 | Gregory et al. |
| 5,601,399 A | 2/1997 | Okpara et al. |
| 5,606,639 A | 2/1997 | Lehoe et al. |
| 5,613,729 A | 3/1997 | Summer, Jr. |
| 5,613,730 A | 3/1997 | Buie et al. |
| 5,623,195 A | 4/1997 | Bullock et al. |
| 5,623,828 A | 4/1997 | Harrington |
| 5,626,021 A | 5/1997 | Karunasiri et al. |
| 5,626,386 A | 5/1997 | Lush |
| 5,634,342 A | 6/1997 | Peeters et al. |
| 5,637,921 A | 6/1997 | Burward-Hoy |
| 5,640,728 A | 6/1997 | Graebe |
| 5,642,539 A | 7/1997 | Kuo |
| 5,645,314 A | 7/1997 | Liou |
| 5,650,904 A | 7/1997 | Gilley et al. |
| 5,653,741 A | 8/1997 | Grant |
| 5,660,310 A | 8/1997 | LeGrow |
| 5,667,622 A | 9/1997 | Hasegawa et al. |
| 5,675,852 A | 10/1997 | Watkins |
| 5,682,748 A | 11/1997 | DeVilbiss et al. |
| 5,690,849 A | 11/1997 | DeVilbiss et al. |
| 5,692,952 A | 12/1997 | Chih-Hung |
| 5,704,213 A | 1/1998 | Smith et al. |
| 5,705,770 A | 1/1998 | Ogassawara et al. |
| 5,715,695 A | 2/1998 | Lord |
| 5,721,804 A | 2/1998 | Greene, III |
| 5,724,818 A | 3/1998 | Iwata et al. |
| 5,729,981 A | 3/1998 | Markus et al. |
| 5,734,122 A | 3/1998 | Aspden |
| 5,761,908 A | 6/1998 | Oas et al. |
| 5,761,909 A | 6/1998 | Hughes et al. |
| 5,772,500 A | 6/1998 | Harvey et al. |
| 5,784,890 A | 7/1998 | Polkinghorne |
| 5,798,583 A | 8/1998 | Morita |
| 5,800,490 A | 9/1998 | Patz et al. |
| 5,802,855 A | 9/1998 | Yamaguchi et al. |
| 5,802,856 A | 9/1998 | Schaper et al. |
| 5,809,785 A | 9/1998 | Polkinghorne |
| 5,822,993 A | 10/1998 | Attey |
| 5,827,424 A | 10/1998 | Gillis et al. |
| 5,833,321 A | 11/1998 | Kim et al. |
| 5,850,741 A | 12/1998 | Feher |
| 5,860,472 A | 1/1999 | Batchelder |
| 5,865,031 A | 2/1999 | Itakura |
| 5,867,990 A | 2/1999 | Ghoshal |
| 5,871,151 A | 2/1999 | Fiedrich |
| 5,871,859 A | 2/1999 | Parise |
| 5,884,485 A | 3/1999 | Yamaguchi et al. |
| 5,884,486 A | 3/1999 | Hughes et al. |
| 5,887,304 A | 3/1999 | Von der Heyde |
| 5,888,261 A | 3/1999 | Fortune |
| 5,895,964 A | 4/1999 | Nakayama |
| 5,902,014 A | 5/1999 | Dinkel et al. |
| 5,912,092 A | 6/1999 | Maruyama et al. |
| 5,921,100 A | 7/1999 | Yoshinori et al. |
| 5,921,314 A | 7/1999 | Schuller et al. |
| 5,921,858 A | 7/1999 | Kawai et al. |
| 5,924,289 A | 7/1999 | Bishop, II |
| 5,924,766 A | 7/1999 | Esaki et al. |
| 5,924,767 A | 7/1999 | Pietryga |
| 5,927,817 A | 7/1999 | Ekman et al. |
| 5,934,748 A | 8/1999 | Faust et al. |
| 5,936,192 A | 8/1999 | Tauchi |
| 5,937,908 A | 8/1999 | Inoshiri et al. |
| 5,948,303 A | 9/1999 | Larson |
| 5,950,067 A | 9/1999 | Maegawa et al. |
| 5,952,728 A | 9/1999 | Imanishi et al. |
| 5,959,341 A | 9/1999 | Tsuno et al. |
| 5,966,940 A | 10/1999 | Gower et al. |
| 5,966,941 A | 10/1999 | Ghoshal |
| 5,987,890 A | 11/1999 | Chiu et al. |

(56) References Cited

U.S. PATENT DOCUMENTS

| | | |
|---|---|---|
| 5,987,893 A | 11/1999 | Schultz-Harder et al. |
| 5,988,568 A | 11/1999 | Drews |
| 5,992,154 A | 11/1999 | Kawada et al. |
| 5,994,637 A | 11/1999 | Imanushi et al. |
| 5,995,711 A | 11/1999 | Fukuoka et al. |
| 6,000,225 A | 12/1999 | Ghoshal |
| 6,003,950 A | 12/1999 | Larsson |
| 6,006,524 A | 12/1999 | Park |
| 6,019,420 A | 2/2000 | Faust et al. |
| 6,038,865 A | 3/2000 | Watanabe et al. |
| 6,048,024 A | 4/2000 | Wallman |
| 6,049,655 A | 4/2000 | Vazirani |
| 6,050,326 A | 4/2000 | Evans |
| 6,052,853 A | 4/2000 | Schmid |
| 6,053,163 A | 4/2000 | Bass |
| 6,057,050 A | 5/2000 | Parise |
| 6,059,018 A | 5/2000 | Yoshinori et al. |
| 6,062,641 A | 5/2000 | Suzuki et al. |
| 6,072,924 A | 6/2000 | Sato et al. |
| 6,072,938 A | 6/2000 | Peterson et al. |
| 6,073,998 A | 6/2000 | Siarkowski et al. |
| 6,079,485 A | 6/2000 | Esaki et al. |
| 6,082,445 A | 7/2000 | Dugan |
| 6,084,172 A | 7/2000 | Kishi et al. |
| 6,085,369 A | 7/2000 | Feher |
| 6,086,831 A | 7/2000 | Harness et al. |
| 6,087,638 A | 7/2000 | Silverbrook |
| 6,094,919 A | 8/2000 | Bhatia |
| 6,096,966 A | 8/2000 | Nishimoto et al. |
| 6,097,088 A | 8/2000 | Sakuragi |
| 6,100,463 A | 8/2000 | Ladd et al. |
| 6,101,815 A | 8/2000 | Van Oort et al. |
| 6,103,967 A | 8/2000 | Cauchy et al. |
| 6,105,373 A | 8/2000 | Watanabe et al. |
| 6,109,688 A | 8/2000 | Wurz et al. |
| 6,112,525 A | 9/2000 | Yoshida et al. |
| 6,112,531 A | 9/2000 | Yamaguchi |
| 6,116,029 A | 9/2000 | Krawec |
| 6,119,463 A | 9/2000 | Bell |
| 6,120,370 A | 9/2000 | Asou et al. |
| 6,127,619 A | 10/2000 | Xi et al. |
| 6,138,466 A | 10/2000 | Lake et al. |
| 6,141,969 A | 11/2000 | Launchbury et al. |
| 6,145,925 A | 11/2000 | Eksin et al. |
| 6,151,214 A | 11/2000 | Yeh |
| 6,158,224 A | 12/2000 | Hu et al. |
| 6,161,241 A | 12/2000 | Zysman |
| 6,161,388 A | 12/2000 | Ghoshal |
| 6,164,076 A | 12/2000 | Chu et al. |
| 6,164,719 A | 12/2000 | Rauh |
| 6,171,333 B1 | 1/2001 | Nelson et al. |
| 6,178,292 B1 | 1/2001 | Fukuoka et al. |
| 6,179,706 B1 | 1/2001 | Yoshinori et al. |
| 6,186,592 B1 | 2/2001 | Orizakis et al. |
| 6,189,966 B1 | 2/2001 | Faust et al. |
| 6,189,967 B1 | 2/2001 | Short |
| 6,196,627 B1 | 3/2001 | Faust et al. |
| 6,196,839 B1 | 3/2001 | Ross |
| 6,206,465 B1 | 3/2001 | Faust et al. |
| 6,213,198 B1 | 4/2001 | Shikata et al. |
| 6,222,243 B1 | 4/2001 | Kishi et al. |
| 6,223,539 B1 | 5/2001 | Bell |
| 6,226,994 B1 | 5/2001 | Yamada et al. |
| 6,233,959 B1 | 5/2001 | Kang et al. |
| 6,250,083 B1 | 6/2001 | Chou |
| 6,256,996 B1 | 7/2001 | Ghoshal |
| 6,257,329 B1 | 7/2001 | Balzano |
| 6,262,357 B1 | 7/2001 | Johnson et al. |
| 6,263,530 B1 | 7/2001 | Feher |
| 6,266,962 B1 | 7/2001 | Ghoshal |
| 6,282,907 B1 | 9/2001 | Ghoshal |
| 6,289,982 B1 | 9/2001 | Naji |
| 6,291,803 B1 | 9/2001 | Fourrey |
| 6,294,721 B1 | 9/2001 | Oravetz et al. |
| 6,302,196 B1 | 10/2001 | Haussmann |
| 6,306,673 B1 | 10/2001 | Imanishi et al. |
| 6,320,280 B1 | 11/2001 | Kanesaka |
| 6,326,610 B1 | 12/2001 | Muramatsu et al. |
| 6,336,237 B1 | 1/2002 | Schmid |
| 6,338,251 B1 | 1/2002 | Ghoshal |
| 6,341,395 B1 | 1/2002 | Chao |
| 6,341,490 B1 | 1/2002 | Jones |
| 6,347,521 B1 | 2/2002 | Kadotani et al. |
| 6,357,518 B1 | 3/2002 | Sugimoto et al. |
| 6,378,311 B1 | 4/2002 | McCordic |
| 6,385,976 B1 | 5/2002 | Yamamura et al. |
| 6,391,676 B1 | 5/2002 | Tsuzaki et al. |
| 6,393,842 B2 | 5/2002 | Kim et al. |
| 6,400,013 B1 | 6/2002 | Tsuzaki et al. |
| 6,402,470 B1 | 6/2002 | Kvasnak et al. |
| 6,410,971 B1 | 6/2002 | Otey |
| 6,425,527 B1 | 7/2002 | Smole |
| 6,427,449 B1 | 8/2002 | Logan et al. |
| 6,434,328 B2 | 8/2002 | Rutherford |
| 6,438,964 B1 | 8/2002 | Giblin |
| 6,444,893 B1 | 9/2002 | Onoue et al. |
| 6,446,442 B1 | 9/2002 | Batchelor et al. |
| 6,452,740 B1 | 9/2002 | Ghoshal |
| 6,455,186 B1 | 9/2002 | Moores, Jr. et al. |
| 6,464,027 B1 | 10/2002 | Dage et al. |
| 6,470,696 B1 | 10/2002 | Palfy et al. |
| 6,474,073 B1 | 11/2002 | Uetsuji et al. |
| 6,477,844 B2 | 11/2002 | Ohkubo et al. |
| 6,481,801 B1 | 11/2002 | Schmale |
| 6,487,739 B1 | 12/2002 | Harker |
| 6,489,551 B2 | 12/2002 | Chu et al. |
| 6,490,879 B1 | 12/2002 | Lloyd et al. |
| 6,492,585 B1 | 12/2002 | Zamboni et al. |
| 6,493,888 B1 | 12/2002 | Salvatini et al. |
| 6,493,889 B2 | 12/2002 | Kocurek |
| 6,499,306 B2 | 12/2002 | Gillen |
| 6,509,704 B1 | 1/2003 | Brown |
| 6,511,125 B1 | 1/2003 | Gendron |
| 6,519,949 B1 | 2/2003 | Wernlund et al. |
| 6,530,231 B1 | 3/2003 | Nagy et al. |
| 6,532,746 B1 | 3/2003 | Bloom et al. |
| 6,539,725 B2 | 4/2003 | Bell |
| 6,541,737 B1 | 4/2003 | Eksin et al. |
| 6,541,743 B2 | 4/2003 | Chen |
| 6,546,576 B1 | 4/2003 | Lin |
| 6,548,750 B1 | 4/2003 | Picone |
| 6,548,894 B2 | 4/2003 | Chu et al. |
| 6,552,256 B2 | 4/2003 | Shakouri et al. |
| 6,557,353 B1 | 5/2003 | Fusco et al. |
| 6,563,039 B2 | 5/2003 | Caillat et al. |
| 6,570,362 B1 | 5/2003 | Estes et al. |
| RE38,128 E | 6/2003 | Gallup et al. |
| 6,571,564 B2 | 6/2003 | Upadhye et al. |
| 6,573,596 B2 | 6/2003 | Saika |
| 6,574,967 B1 | 6/2003 | Park et al. |
| 6,578,986 B2 | 6/2003 | Swaris et al. |
| 6,580,025 B2 | 6/2003 | Guy |
| 6,581,225 B2 | 6/2003 | Imai |
| 6,583,638 B2 | 6/2003 | Costello et al. |
| 6,588,217 B2 | 7/2003 | Ghoshal |
| 6,598,251 B2 | 7/2003 | Habboub et al. |
| 6,598,403 B1 | 7/2003 | Ghoshal |
| 6,598,405 B2 | 7/2003 | Bell |
| 6,604,576 B2 | 8/2003 | Noda et al. |
| 6,604,785 B2 | 8/2003 | Bargheer et al. |
| 6,605,955 B1 | 8/2003 | Costello et al. |
| 6,606,754 B1 | 8/2003 | Flick |
| 6,606,866 B2 | 8/2003 | Bell |
| 6,613,972 B2 | 9/2003 | Cohen et al. |
| 6,619,044 B2 | 9/2003 | Batchelor et al. |
| 6,619,736 B2 | 9/2003 | Stowe et al. |
| 6,625,990 B2 | 9/2003 | Bell |
| 6,626,488 B2 | 9/2003 | Pfahler |
| 6,629,724 B2 | 10/2003 | Ekern et al. |
| 6,637,210 B2 | 10/2003 | Bell |
| 6,644,735 B2 | 11/2003 | Bargheer et al. |
| 6,645,666 B1 | 11/2003 | Moores, Jr. et al. |
| 6,653,002 B1 | 11/2003 | Parise |
| 6,658,861 B1 | 12/2003 | Ghoshal et al. |

(56) References Cited

U.S. PATENT DOCUMENTS

| | | |
|---|---|---|
| 6,672,076 B2 | 1/2004 | Bell |
| 6,676,207 B2 | 1/2004 | Rauh et al. |
| 6,684,437 B2 | 2/2004 | Koenig |
| 6,686,532 B1 | 2/2004 | Macris |
| 6,687,937 B2 | 2/2004 | Harker |
| 6,695,402 B2 | 2/2004 | Sloan, Jr. |
| 6,700,052 B2 | 3/2004 | Bell |
| 6,705,089 B2 | 3/2004 | Chu et al. |
| 6,708,352 B2 | 3/2004 | Salvatini et al. |
| 6,711,767 B2 | 3/2004 | Klamm |
| 6,711,904 B1 | 3/2004 | Law et al. |
| 6,718,954 B2 | 4/2004 | Ryon |
| 6,719,039 B2 | 4/2004 | Calaman et al. |
| 6,725,669 B2 | 4/2004 | Melaragni |
| 6,727,422 B2 | 4/2004 | Macris |
| 6,730,115 B1 | 5/2004 | Heaton |
| 6,739,138 B2 | 5/2004 | Saunders et al. |
| 6,739,655 B1 | 5/2004 | Schwochert et al. |
| 6,743,972 B2 | 6/2004 | Macris |
| 6,761,399 B2 | 7/2004 | Bargheer et al. |
| 6,764,502 B2 | 7/2004 | Bieberich |
| 6,767,666 B2 | 7/2004 | Nemoto |
| 6,767,766 B2 | 7/2004 | Chu et al. |
| 6,772,829 B2 | 8/2004 | Lebrun |
| 6,774,346 B2 | 8/2004 | Clothier |
| 6,786,541 B2 | 9/2004 | Haupt et al. |
| 6,786,545 B2 | 9/2004 | Bargheer et al. |
| 6,790,481 B2 | 9/2004 | Bishop et al. |
| 6,793,016 B2 | 9/2004 | Aoki et al. |
| 6,804,966 B1 | 10/2004 | Chu et al. |
| 6,808,230 B2 | 10/2004 | Buss et al. |
| 6,812,395 B2 | 11/2004 | Bell |
| 6,815,814 B2 | 11/2004 | Chu et al. |
| 6,817,191 B2 | 11/2004 | Watanabe |
| 6,817,197 B1 | 11/2004 | Padfield |
| 6,817,675 B2 | 11/2004 | Buss et al. |
| 6,818,817 B2 | 11/2004 | Macris |
| 6,823,678 B1 | 11/2004 | Li |
| 6,828,528 B2 | 12/2004 | Stowe et al. |
| 6,832,732 B2 | 12/2004 | Burkett et al. |
| 6,834,509 B2 | 12/2004 | Palfy et al. |
| 6,840,305 B2 | 1/2005 | Zheng et al. |
| 6,840,576 B2 | 1/2005 | Ekern et al. |
| 6,841,957 B2 | 1/2005 | Brown |
| 6,845,622 B2 | 1/2005 | Sauciuc et al. |
| 6,855,158 B2 | 2/2005 | Stolpmann |
| 6,855,880 B2 | 2/2005 | Feher |
| 6,857,697 B2 | 2/2005 | Brennan et al. |
| 6,857,954 B2 | 2/2005 | Luedtke |
| 6,868,690 B2 | 3/2005 | Faqih |
| 6,871,365 B2 | 3/2005 | Flick et al. |
| 6,876,549 B2 | 4/2005 | Beitmal et al. |
| 6,880,346 B1 | 4/2005 | Tseng et al. |
| 6,886,351 B2 | 5/2005 | Palfy et al. |
| 6,892,807 B2 | 5/2005 | Fristedt et al. |
| 6,893,086 B2 | 5/2005 | Bajic et al. |
| 6,904,629 B2 | 6/2005 | Wu |
| 6,907,739 B2 | 6/2005 | Bell |
| 6,923,216 B2 | 8/2005 | Extrand et al. |
| 6,935,122 B2 | 8/2005 | Huang |
| 6,948,321 B2 | 9/2005 | Bell |
| 6,949,309 B2 | 9/2005 | Moores, Jr. et al. |
| 6,954,944 B2 | 10/2005 | Feher |
| 6,959,555 B2 | 11/2005 | Bell |
| 6,962,195 B2 | 11/2005 | Smith et al. |
| 6,963,053 B2 | 11/2005 | Lutz |
| 6,967,309 B2 | 11/2005 | Wyatt et al. |
| 6,976,734 B2 | 12/2005 | Stoewe |
| 6,977,360 B2 | 12/2005 | Weiss |
| 6,981,380 B2 | 1/2006 | Chrysler et al. |
| 6,990,701 B1 | 1/2006 | Litvak |
| 7,000,490 B1 | 2/2006 | Micheels |
| 7,014,945 B2 | 3/2006 | Moores, Jr. et al. |
| 7,036,163 B2 | 5/2006 | Schmid |
| 7,040,710 B2 | 5/2006 | White et al. |
| 7,052,091 B2 | 5/2006 | Bajic et al. |
| 7,056,616 B2 | 6/2006 | Moores, Jr. et al. |
| 7,061,208 B2 | 6/2006 | Nishihata et al. |
| 7,063,163 B2 | 6/2006 | Steele et al. |
| 7,066,306 B2 | 6/2006 | Gavin |
| 7,070,231 B1 | 7/2006 | Wong |
| 7,070,232 B2 | 7/2006 | Minegishi et al. |
| 7,075,034 B2 | 7/2006 | Bargheer et al. |
| 7,082,772 B2 | 8/2006 | Welch |
| 7,084,502 B2 | 8/2006 | Bottner et al. |
| 7,100,978 B2 | 9/2006 | Ekern et al. |
| 7,108,319 B2 | 9/2006 | Hartwich et al. |
| 7,111,465 B2 | 9/2006 | Bell |
| 7,114,771 B2 | 10/2006 | Lofy et al. |
| 7,124,593 B2 | 10/2006 | Feher |
| 7,131,689 B2 | 11/2006 | Brennan et al. |
| 7,134,715 B1 | 11/2006 | Fristedt et al. |
| 7,141,763 B2 | 11/2006 | Moroz |
| 7,147,279 B2 | 12/2006 | Bevan et al. |
| 7,165,281 B2 | 1/2007 | Larssson et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,213,876 B2 | 5/2007 | Stoewe |
| 7,220,048 B2 | 5/2007 | Kohlgruber et al. |
| 7,222,489 B2 | 5/2007 | Pastorino |
| 7,224,059 B2 | 5/2007 | Shimada et al. |
| 7,230,404 B2 | 6/2007 | Kimoto et al. |
| 7,231,772 B2 | 6/2007 | Bell |
| 7,235,735 B2 | 6/2007 | Venkatasubramanian et al. |
| 7,244,887 B2 | 7/2007 | Miley |
| 7,246,496 B2 | 7/2007 | Goenka et al. |
| 7,252,904 B2 | 8/2007 | Moores, Jr. et al. |
| 7,270,910 B2 | 9/2007 | Yahnker et al. |
| 7,272,936 B2 | 9/2007 | Feher |
| 7,273,981 B2 | 9/2007 | Bell |
| 7,299,639 B2 | 11/2007 | Leija et al. |
| 7,326,490 B2 | 2/2008 | Moores, Jr. et al. |
| 7,337,615 B2 | 3/2008 | Reidy |
| 7,338,117 B2 | 3/2008 | Iqbal et al. |
| 7,340,907 B2 | 3/2008 | Vogh et al. |
| 7,355,146 B2 | 4/2008 | Angelis et al. |
| 7,356,912 B2 | 4/2008 | Iqbal et al. |
| 7,360,365 B2 | 4/2008 | Codecasa et al. |
| 7,360,416 B2 | 4/2008 | Manaka et al. |
| 7,370,479 B2 | 5/2008 | Pfannenberg |
| 7,370,911 B2 | 5/2008 | Bajic et al. |
| 7,380,586 B2 | 6/2008 | Gawthrop |
| 7,384,704 B2 | 6/2008 | Scott |
| 7,421,845 B2 | 9/2008 | Bell |
| 7,425,034 B2 | 9/2008 | Bajic et al. |
| 7,426,835 B2 | 9/2008 | Bell et al. |
| 7,462,028 B2 | 12/2008 | Cherala et al. |
| 7,469,432 B2 | 12/2008 | Chambers |
| 7,475,464 B2 | 1/2009 | Lofy et al. |
| 7,475,551 B2 | 1/2009 | Ghoshal |
| 7,475,938 B2 | 1/2009 | Stoewe et al. |
| 7,478,869 B2 | 1/2009 | Lazanja et al. |
| 7,480,950 B2 | 1/2009 | Feher |
| 7,506,924 B2 | 3/2009 | Bargheer et al. |
| 7,506,938 B2 | 3/2009 | Brennan et al. |
| 7,513,273 B2 | 4/2009 | Bivin |
| 7,523,617 B2 | 4/2009 | Venkatasubramanian et al. |
| 7,531,270 B2 | 5/2009 | Buck et al. |
| 7,581,785 B2 | 9/2009 | Heckmann et al. |
| 7,587,901 B2 | 9/2009 | Petrovski |
| 7,587,902 B2 | 9/2009 | Bell |
| 7,591,507 B2 | 9/2009 | Giffin et al. |
| 7,592,776 B2 | 9/2009 | Tsukamoto et al. |
| 7,608,777 B2 | 10/2009 | Bell et al. |
| 7,621,594 B2 | 11/2009 | Hartmann et al. |
| 7,640,754 B2 | 1/2010 | Wolas |
| 7,665,803 B2 | 2/2010 | Wolas |
| 7,708,338 B2 | 5/2010 | Wolas |
| 7,731,279 B2 | 6/2010 | Asada et al. |
| RE41,765 E | 9/2010 | Gregory et al. |
| 7,788,933 B2 | 9/2010 | Goenka |
| 7,827,620 B2 | 11/2010 | Feher |
| 7,827,805 B2 | 11/2010 | Comiskey et al. |

(56) References Cited

U.S. PATENT DOCUMENTS

| | | |
|---|---|---|
| 7,862,113 B2 | 1/2011 | Knoll |
| 7,863,866 B2 | 1/2011 | Wolf |
| 7,866,017 B2 | 1/2011 | Knoll |
| 7,870,745 B2 | 1/2011 | Goenka |
| 7,877,827 B2 | 2/2011 | Marquette et al. |
| 7,915,516 B2 | 3/2011 | Hu |
| 7,926,293 B2 | 4/2011 | Bell |
| 7,932,460 B2 | 4/2011 | Bell |
| 7,937,789 B2 | 5/2011 | Feher |
| 7,942,010 B2 | 5/2011 | Bell |
| 7,946,120 B2 | 5/2011 | Bell |
| 7,963,594 B2 | 6/2011 | Wolas |
| 7,966,835 B2 | 6/2011 | Petrovski |
| 7,969,738 B2 | 6/2011 | Koo |
| 7,996,936 B2 | 8/2011 | Marquette et al. |
| 8,039,726 B2 | 10/2011 | Zhang et al. |
| 8,062,797 B2 | 11/2011 | Fisher et al. |
| 8,065,763 B2 | 11/2011 | Brykalski et al. |
| 8,079,223 B2 | 12/2011 | Bell |
| 8,104,295 B2 | 1/2012 | Lofy |
| 8,143,554 B2 | 3/2012 | Lofy |
| 8,163,647 B2 | 4/2012 | Kawabata et al. |
| 8,181,290 B2 | 5/2012 | Brykalski et al. |
| 8,191,187 B2 | 6/2012 | Brykalski et al. |
| 8,222,511 B2 | 7/2012 | Lofy |
| 8,256,236 B2 | 9/2012 | Lofy |
| 8,332,975 B2 | 12/2012 | Brykalski et al. |
| 8,375,728 B2 | 2/2013 | Bell |
| 8,397,518 B1 | 3/2013 | Vistakula |
| 8,402,579 B2 | 3/2013 | Marquette et al. |
| 8,405,363 B2 | 3/2013 | Lee |
| 8,418,286 B2 | 4/2013 | Brykalski et al. |
| 8,424,315 B2 | 4/2013 | Goenka |
| 8,434,314 B2 | 5/2013 | Comiskey et al. |
| 8,438,863 B2 | 5/2013 | Lofy |
| RE44,272 E | 6/2013 | Bell |
| 8,492,642 B2 | 7/2013 | Kim |
| 8,495,884 B2 | 7/2013 | Bell et al. |
| 8,505,320 B2 | 8/2013 | Lofy |
| 8,516,842 B2 | 8/2013 | Petrovski |
| 8,539,624 B2 | 9/2013 | Terech et al. |
| 8,540,466 B2 | 9/2013 | Halliar |
| 8,564,129 B2 | 10/2013 | Therrien et al. |
| 8,575,518 B2 | 11/2013 | Walsh |
| 8,614,390 B2 | 12/2013 | Watts |
| 8,621,687 B2 | 1/2014 | Brykalski et al. |
| 8,640,466 B2 | 2/2014 | Bell et al. |
| 8,646,262 B2 | 2/2014 | Magneto |
| 8,658,881 B2 | 2/2014 | Cheng et al. |
| 8,701,422 B2 | 4/2014 | Bell et al. |
| 8,722,222 B2 | 5/2014 | Kossakovski et al. |
| 8,732,874 B2 | 5/2014 | Brykalski et al. |
| 8,782,830 B2 | 7/2014 | Brykalski et al. |
| 8,841,015 B2 | 9/2014 | Yoon |
| 8,869,596 B2 | 10/2014 | Hagl |
| 8,893,329 B2 | 11/2014 | Petrovksi |
| 8,893,513 B2 | 11/2014 | June et al. |
| 8,901,612 B2 | 12/2014 | Gray et al. |
| 8,915,091 B2 | 12/2014 | Goenka |
| 8,969,704 B2 | 3/2015 | Bruck et al. |
| 8,974,942 B2 | 3/2015 | Bell et al. |
| 9,006,557 B2 | 4/2015 | LaGrandeur et al. |
| 9,020,572 B2 | 4/2015 | Mensinger et al. |
| 9,105,808 B2 | 8/2015 | Petrovksi |
| 9,105,809 B2 | 8/2015 | Lofy |
| 9,121,414 B2 | 9/2015 | Lofy et al. |
| 9,125,497 B2 | 9/2015 | Brykalski et al. |
| 9,144,180 B2 | 9/2015 | Olsson et al. |
| 9,218,979 B2 | 12/2015 | Reed et al. |
| 9,293,680 B2 | 3/2016 | Poliquin et al. |
| 9,306,143 B2 | 4/2016 | Ranalli et al. |
| 9,310,112 B2 | 4/2016 | Bell et al. |
| 9,335,073 B2 | 5/2016 | Lofy |
| 9,341,394 B2 | 5/2016 | Edwards et al. |
| 9,445,524 B2 | 9/2016 | Lofy et al. |
| 9,451,723 B2 | 9/2016 | Lofy et al. |
| 9,581,362 B2 | 2/2017 | Stanley et al. |
| 9,590,282 B2 | 3/2017 | Kossakovski et al. |
| 9,593,871 B2 | 3/2017 | Stanley et al. |
| 9,603,459 B2 | 3/2017 | Brykalski et al. |
| 9,651,279 B2 | 5/2017 | Lofy |
| 9,662,962 B2 | 5/2017 | Steinman et al. |
| 9,666,914 B2 | 5/2017 | Bell et al. |
| 9,671,142 B2 | 6/2017 | Kossakovski et al. |
| 9,683,752 B2 | 6/2017 | Edwards et al. |
| 9,685,599 B2 | 6/2017 | Petrovski et al. |
| 9,719,701 B2 | 8/2017 | Bell et al. |
| 9,746,247 B2 | 8/2017 | Edwards et al. |
| 9,797,631 B2 | 10/2017 | Grunwald et al. |
| 9,814,641 B2 | 11/2017 | Brykalski et al. |
| 9,857,107 B2 | 1/2018 | Inaba et al. |
| 9,863,672 B2 | 1/2018 | Goenka |
| 9,899,711 B2 | 2/2018 | Piggott et al. |
| D816,198 S | 4/2018 | Newman |
| 9,989,267 B2 | 6/2018 | Brykalski et al. |
| 10,005,337 B2 | 6/2018 | Petrovski |
| 10,012,417 B2 | 7/2018 | Edwards et al. |
| D825,723 S | 8/2018 | Newman |
| 10,170,811 B2 | 1/2019 | Kossakovski et al. |
| 10,208,990 B2 | 2/2019 | Petrovski et al. |
| 10,228,166 B2 | 3/2019 | Lofy |
| 10,236,547 B2 | 3/2019 | Kossakovski et al. |
| 10,266,031 B2 | 4/2019 | Steinman et al. |
| 10,270,141 B2 | 4/2019 | Piggott et al. |
| 10,288,084 B2 | 5/2019 | Lofy et al. |
| 10,290,796 B2 | 5/2019 | Boukai et al. |
| 10,337,770 B2 | 7/2019 | Kossakovski et al. |
| 10,405,667 B2 | 9/2019 | Marquette et al. |
| 10,457,173 B2 | 10/2019 | Lofy et al. |
| 10,473,365 B2 | 11/2019 | Bell et al. |
| 10,495,322 B2 | 12/2019 | Brykalski et al. |
| 10,686,232 B2 | 6/2020 | Kossakovski et al. |
| 10,700,393 B2 | 6/2020 | Piggott et al. |
| 10,784,546 B2 | 9/2020 | Piggott et al. |
| 10,991,869 B2 | 4/2021 | Jovovic et al. |
| 2001/0005990 A1 | 7/2001 | Kim et al. |
| 2001/0014212 A1 | 8/2001 | Rutherford |
| 2001/0028185 A1 | 10/2001 | Stowe et al. |
| 2002/0017102 A1 | 2/2002 | Bell |
| 2002/0026226 A1 | 2/2002 | Ein |
| 2002/0062854 A1 | 5/2002 | Sharp |
| 2002/0092308 A1 | 7/2002 | Bell |
| 2002/0100121 A1 | 8/2002 | Kocurek |
| 2002/0108380 A1 | 8/2002 | Nelsen et al. |
| 2002/0121094 A1 | 9/2002 | VanHoudt |
| 2002/0171132 A1 | 11/2002 | Buchwalter et al. |
| 2002/0195844 A1 | 12/2002 | Hipwell |
| 2003/0039298 A1 | 2/2003 | Eriksson et al. |
| 2003/0041892 A1 | 3/2003 | Fleurial et al. |
| 2003/0070235 A1 | 4/2003 | Suzuki et al. |
| 2003/0084511 A1 | 5/2003 | Salvatini et al. |
| 2003/0094265 A1 | 5/2003 | Chu et al. |
| 2003/0106677 A1 | 6/2003 | Memory et al. |
| 2003/0110779 A1 | 6/2003 | Otey et al. |
| 2003/0133492 A1 | 7/2003 | Watanabe |
| 2003/0145380 A1 | 8/2003 | Schmid |
| 2003/0150060 A1 | 8/2003 | Huang |
| 2003/0160479 A1 | 8/2003 | Minuth et al. |
| 2003/0188382 A1 | 10/2003 | Klamm et al. |
| 2003/0234247 A1 | 12/2003 | Stern |
| 2004/0028562 A1 | 2/2004 | Greve et al. |
| 2004/0089336 A1 | 5/2004 | Hunt |
| 2004/0090093 A1 | 5/2004 | Kamiya et al. |
| 2004/0098991 A1 | 5/2004 | Heyes |
| 2004/0113549 A1 | 6/2004 | Roberts et al. |
| 2004/0164594 A1 | 8/2004 | Stoewe et al. |
| 2004/0177622 A1 | 9/2004 | Harvie |
| 2004/0177876 A1 | 9/2004 | Hightower |
| 2004/0177877 A1 | 9/2004 | Hightower |
| 2004/0195870 A1 | 10/2004 | Bohlender |
| 2004/0238022 A1 | 12/2004 | Hiller et al. |
| 2004/0255364 A1 | 12/2004 | Feher |
| 2004/0264009 A1 | 12/2004 | Hwang et al. |
| 2005/0000558 A1 | 1/2005 | Moriyama et al. |

(56) References Cited

U.S. PATENT DOCUMENTS

| | | |
|---|---|---|
| 2005/0011009 A1 | 1/2005 | Wu |
| 2005/0012204 A1 | 1/2005 | Strnad |
| 2005/0056310 A1 | 3/2005 | Shikata et al. |
| 2005/0067862 A1 | 3/2005 | Iqbal et al. |
| 2005/0072165 A1 | 4/2005 | Bell |
| 2005/0076944 A1 | 4/2005 | Kanatzidis et al. |
| 2005/0078451 A1 | 4/2005 | Sauciuc et al. |
| 2005/0086739 A1 | 4/2005 | Wu |
| 2005/0121065 A1 | 6/2005 | Otey |
| 2005/0126184 A1 | 6/2005 | Cauchy |
| 2005/0140180 A1 | 6/2005 | Hesch |
| 2005/0143797 A1 | 6/2005 | Parish et al. |
| 2005/0145285 A1 | 7/2005 | Extrand |
| 2005/0161072 A1 | 7/2005 | Esser et al. |
| 2005/0173950 A1 | 8/2005 | Bajic et al. |
| 2005/0180113 A1 | 8/2005 | Shirakami et al. |
| 2005/0183763 A1 | 8/2005 | Christiansen |
| 2005/0193742 A1 | 9/2005 | Arnold |
| 2005/0200166 A1 | 9/2005 | Noh |
| 2005/0202774 A1 | 9/2005 | Lipke |
| 2005/0220167 A1 | 10/2005 | Kanai et al. |
| 2005/0251120 A1 | 11/2005 | Anderson et al. |
| 2005/0257532 A1 | 11/2005 | Ikeda et al. |
| 2005/0268956 A1 | 12/2005 | Take |
| 2005/0278863 A1 | 12/2005 | Bahash et al. |
| 2005/0280140 A1 | 12/2005 | Corbin, Jr. et al. |
| 2005/0285438 A1 | 12/2005 | Ishima et al. |
| 2005/0288749 A1 | 12/2005 | Lachenbruch |
| 2006/0005548 A1 | 1/2006 | Ruckstuhl |
| 2006/0005873 A1 | 1/2006 | Kambe |
| 2006/0005944 A1 | 1/2006 | Wang et al. |
| 2006/0028182 A1 | 2/2006 | Yang et al. |
| 2006/0053529 A1 | 3/2006 | Feher |
| 2006/0075760 A1 | 4/2006 | Im et al. |
| 2006/0078319 A1 | 4/2006 | Maran |
| 2006/0080778 A1 | 4/2006 | Chambers |
| 2006/0087160 A1 | 4/2006 | Dong et al. |
| 2006/0093896 A1 | 5/2006 | Hong et al. |
| 2006/0102224 A1 | 5/2006 | Chen et al. |
| 2006/0118158 A1 | 6/2006 | Zhang et al. |
| 2006/0123799 A1 | 6/2006 | Tateyama et al. |
| 2006/0124165 A1 | 6/2006 | Bierschenk et al. |
| 2006/0137099 A1 | 6/2006 | Feher |
| 2006/0137359 A1 | 6/2006 | Ghoshal |
| 2006/0137360 A1 | 6/2006 | Ghoshal |
| 2006/0157102 A1 | 7/2006 | Nakajima et al. |
| 2006/0158011 A1 | 7/2006 | Marlovits et al. |
| 2006/0162074 A1 | 7/2006 | Bader |
| 2006/0162341 A1 | 7/2006 | Milazzo |
| 2006/0168969 A1 | 8/2006 | Mei et al. |
| 2006/0175877 A1 | 8/2006 | Alionte et al. |
| 2006/0197363 A1 | 9/2006 | Lofy et al. |
| 2006/0200398 A1 | 9/2006 | Botton et al. |
| 2006/0201161 A1 | 9/2006 | Hirai et al. |
| 2006/0201162 A1 | 9/2006 | Hsieh |
| 2006/0213682 A1* | 9/2006 | Moon .................... H05K 1/028 174/255 |
| 2006/0214480 A1 | 9/2006 | Terech |
| 2006/0216582 A1 | 9/2006 | Lee et al. |
| 2006/0219281 A1 | 10/2006 | Kuroyanagi et al. |
| 2006/0219699 A1 | 10/2006 | Geisel et al. |
| 2006/0225441 A1 | 10/2006 | Goenka et al. |
| 2006/0225773 A1 | 10/2006 | Venkatasubramanian et al. |
| 2006/0237166 A1 | 10/2006 | Otey et al. |
| 2006/0237730 A1 | 10/2006 | Abramov |
| 2006/0243317 A1 | 11/2006 | Venkatasubramanian |
| 2006/0244289 A1 | 11/2006 | Bedro |
| 2006/0273646 A1 | 12/2006 | Comiskey et al. |
| 2006/0289051 A1 | 12/2006 | Niimi et al. |
| 2007/0017666 A1 | 1/2007 | Goenka et al. |
| 2007/0034356 A1 | 2/2007 | Kenny et al. |
| 2007/0035162 A1 | 2/2007 | Bier et al. |
| 2007/0040421 A1 | 2/2007 | Zuzga et al. |
| 2007/0069554 A1 | 3/2007 | Comiskey et al. |
| 2007/0086757 A1 | 4/2007 | Feher |
| 2007/0089773 A1 | 4/2007 | Koester et al. |
| 2007/0095378 A1 | 5/2007 | Ito et al. |
| 2007/0095383 A1 | 5/2007 | Tajima |
| 2007/0101602 A1 | 5/2007 | Bae et al. |
| 2007/0107450 A1 | 5/2007 | Sasao et al. |
| 2007/0125413 A1 | 6/2007 | Olsen et al. |
| 2007/0138844 A1 | 6/2007 | Kim |
| 2007/0142883 A1 | 6/2007 | Quincy, III |
| 2007/0145808 A1 | 6/2007 | Minuth et al. |
| 2007/0157630 A1 | 7/2007 | Kadle et al. |
| 2007/0158981 A1 | 7/2007 | Almasi et al. |
| 2007/0163269 A1 | 7/2007 | Chung et al. |
| 2007/0190712 A1 | 8/2007 | Lin et al. |
| 2007/0193279 A1 | 8/2007 | Yoneno et al. |
| 2007/0193280 A1 | 8/2007 | Tuskiewicz et al. |
| 2007/0200398 A1 | 8/2007 | Wolas et al. |
| 2007/0204850 A1 | 9/2007 | Pickard et al. |
| 2007/0214956 A1 | 9/2007 | Carlson et al. |
| 2007/0220902 A1 | 9/2007 | Matsuoka et al. |
| 2007/0220907 A1 | 9/2007 | Ehlers |
| 2007/0227158 A1 | 10/2007 | Kuchimachi |
| 2007/0234742 A1 | 10/2007 | Aoki et al. |
| 2007/0241592 A1 | 10/2007 | Giffin et al. |
| 2007/0251016 A1 | 11/2007 | Feher |
| 2007/0256722 A1 | 11/2007 | Kondoh |
| 2007/0261412 A1 | 11/2007 | Heine |
| 2007/0261413 A1 | 11/2007 | Hatamian et al. |
| 2007/0261548 A1 | 11/2007 | Vrzalik et al. |
| 2007/0261914 A1 | 11/2007 | Wahlgren et al. |
| 2007/0262621 A1 | 11/2007 | Dong et al. |
| 2007/0296251 A1 | 12/2007 | Krobok et al. |
| 2008/0000025 A1 | 1/2008 | Feher |
| 2008/0000511 A1 | 1/2008 | Kuroyanagi et al. |
| 2008/0022694 A1 | 1/2008 | Anderson et al. |
| 2008/0023056 A1 | 1/2008 | Kambe et al. |
| 2008/0028536 A1 | 2/2008 | Hadden-Cook |
| 2008/0028768 A1 | 2/2008 | Goenka |
| 2008/0028769 A1 | 2/2008 | Goenka |
| 2008/0041067 A1 | 2/2008 | Matsuoka et al. |
| 2008/0053108 A1 | 3/2008 | Wen |
| 2008/0053509 A1 | 3/2008 | Flitsch et al. |
| 2008/0077211 A1 | 3/2008 | Levinson et al. |
| 2008/0078186 A1 | 4/2008 | Cao |
| 2008/0084095 A1 | 4/2008 | Wolas |
| 2008/0087316 A1 | 4/2008 | Inaba et al. |
| 2008/0154518 A1 | 6/2008 | Manaka et al. |
| 2008/0155990 A1 | 7/2008 | Gupta et al. |
| 2008/0163916 A1 | 7/2008 | Tsuneoka et al. |
| 2008/0164733 A1 | 7/2008 | Giffin et al. |
| 2008/0166224 A1 | 7/2008 | Giffin et al. |
| 2008/0239675 A1 | 10/2008 | Speier |
| 2008/0245092 A1 | 10/2008 | Forsberg et al. |
| 2008/0263776 A1 | 10/2008 | O'Reagan |
| 2008/0289677 A1 | 11/2008 | Bell et al. |
| 2008/0307796 A1 | 12/2008 | Bell et al. |
| 2008/0311466 A1 | 12/2008 | Yang et al. |
| 2009/0000031 A1 | 1/2009 | Feher |
| 2009/0007952 A1 | 1/2009 | Kondoh et al. |
| 2009/0015042 A1 | 1/2009 | Bargheer et al. |
| 2009/0026813 A1 | 1/2009 | Lofy |
| 2009/0032080 A1 | 2/2009 | Kawauchi et al. |
| 2009/0033130 A1 | 2/2009 | Marquette et al. |
| 2009/0106907 A1 | 4/2009 | Chambers |
| 2009/0108094 A1 | 4/2009 | Ivri |
| 2009/0126110 A1 | 5/2009 | Feher |
| 2009/0178700 A1 | 7/2009 | Heremans et al. |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2009/0293488 A1 | 12/2009 | Coughlan, III et al. |
| 2010/0031987 A1 | 2/2010 | Bell et al. |
| 2010/0104935 A1 | 4/2010 | Hermann et al. |
| 2010/0112419 A1 | 5/2010 | Jang et al. |
| 2010/0128439 A1 | 5/2010 | Tilak et al. |
| 2010/0132379 A1 | 6/2010 | Wu |
| 2010/0132380 A1 | 6/2010 | Robinson, II |
| 2010/0133883 A1 | 6/2010 | Walker |
| 2010/0147351 A1 | 6/2010 | Takahashi |

(56) References Cited

U.S. PATENT DOCUMENTS

| | | |
|---|---|---|
| 2010/0153066 A1 | 6/2010 | Federer et al. |
| 2010/0154437 A1 | 6/2010 | Nepsha |
| 2010/0154911 A1 | 6/2010 | Yoskowitz |
| 2010/0186399 A1 | 7/2010 | Huttinger |
| 2010/0198322 A1 | 8/2010 | Joseph et al. |
| 2010/0243346 A1 | 9/2010 | Anderson et al. |
| 2010/0307168 A1 | 12/2010 | Kohl et al. |
| 2010/0326092 A1 | 12/2010 | Goenka |
| 2011/0005562 A1 | 1/2011 | Bisges |
| 2011/0066217 A1 | 3/2011 | Diller et al. |
| 2011/0101741 A1 | 5/2011 | Kolich |
| 2011/0189523 A1 | 8/2011 | Eom |
| 2011/0209740 A1 | 9/2011 | Bell et al. |
| 2011/0236731 A1 | 9/2011 | Bell et al. |
| 2011/0244300 A1 | 10/2011 | Closek et al. |
| 2011/0271994 A1 | 11/2011 | Gilley |
| 2011/0289684 A1 | 12/2011 | Parish et al. |
| 2012/0000901 A1 | 1/2012 | Bajic et al. |
| 2012/0003510 A1 | 1/2012 | Eisenhour |
| 2012/0017371 A1 | 1/2012 | Pollard |
| 2012/0046823 A1 | 2/2012 | Schneider et al. |
| 2012/0080911 A1 | 4/2012 | Brykalski et al. |
| 2012/0111386 A1 | 5/2012 | Bell et al. |
| 2012/0129020 A1 | 5/2012 | Lachenmeier et al. |
| 2012/0132242 A1 | 5/2012 | Chu et al. |
| 2012/0174567 A1 | 7/2012 | Limbeck et al. |
| 2012/0174956 A1* | 7/2012 | Smythe .................. H01L 35/32 136/230 |
| 2012/0189902 A1 | 7/2012 | Kim |
| 2012/0198616 A1 | 8/2012 | Makansi et al. |
| 2012/0201008 A1 | 8/2012 | Hershberger et al. |
| 2012/0235444 A1 | 9/2012 | Dilley et al. |
| 2012/0239123 A1 | 9/2012 | Weber et al. |
| 2012/0244404 A1 | 9/2012 | Obasih et al. |
| 2012/0261399 A1 | 10/2012 | Lofy |
| 2012/0282497 A1 | 11/2012 | Yang et al. |
| 2012/0285758 A1 | 11/2012 | Bell et al. |
| 2012/0289761 A1 | 11/2012 | Boyden et al. |
| 2012/0305043 A1 | 12/2012 | Kossakovski |
| 2012/0325281 A1 | 12/2012 | Akiyama |
| 2013/0008181 A1 | 1/2013 | Makansi et al. |
| 2013/0097777 A1 | 4/2013 | Marquette et al. |
| 2013/0125563 A1 | 5/2013 | Jun |
| 2013/0160809 A1 | 6/2013 | Mueller |
| 2013/0183566 A1 | 7/2013 | Wayne et al. |
| 2013/0186448 A1 | 7/2013 | Ranalli et al. |
| 2013/0200424 A1 | 8/2013 | An et al. |
| 2013/0207617 A1 | 8/2013 | Houchin-Miller et al. |
| 2013/0213449 A1 | 8/2013 | Parish et al. |
| 2013/0216887 A1 | 8/2013 | Wayne et al. |
| 2013/0232996 A1 | 9/2013 | Goenka et al. |
| 2013/0236753 A1 | 9/2013 | Yue et al. |
| 2013/0239592 A1 | 9/2013 | Lofy |
| 2013/0255739 A1 | 10/2013 | Kossakovski |
| 2013/0340802 A1 | 12/2013 | Jovovic et al. |
| 2014/0014871 A1 | 1/2014 | Haddon et al. |
| 2014/0023897 A1 | 1/2014 | Suga |
| 2014/0026320 A1 | 1/2014 | Marquette et al. |
| 2014/0030082 A1 | 1/2014 | Helmenstein |
| 2014/0030560 A1 | 1/2014 | Lev et al. |
| 2014/0090513 A1 | 4/2014 | Zhang et al. |
| 2014/0096807 A1 | 4/2014 | Ranalli |
| 2014/0113536 A1 | 4/2014 | Goenka et al. |
| 2014/0124176 A1 | 5/2014 | Zhamu et al. |
| 2014/0131343 A1 | 5/2014 | Walsh |
| 2014/0137569 A1 | 5/2014 | Parish et al. |
| 2014/0159442 A1 | 6/2014 | Helmenstein |
| 2014/0165597 A1 | 6/2014 | Hernon et al. |
| 2014/0165608 A1 | 6/2014 | Tseng |
| 2014/0180493 A1 | 6/2014 | Csonti et al. |
| 2014/0182646 A1 | 7/2014 | Choi et al. |
| 2014/0187140 A1 | 7/2014 | Lazanja et al. |
| 2014/0194959 A1 | 7/2014 | Fries et al. |
| 2014/0230455 A1 | 8/2014 | Chandler et al. |
| 2014/0250918 A1 | 9/2014 | Lofy |
| 2014/0256244 A1 | 9/2014 | Sakurai et al. |
| 2014/0260331 A1 | 9/2014 | Lofy et al. |
| 2014/0305625 A1 | 10/2014 | Petrovski |
| 2014/0338366 A1 | 11/2014 | Adldinger et al. |
| 2015/0075184 A1 | 3/2015 | Edwards et al. |
| 2015/0101353 A1 | 4/2015 | Oh et al. |
| 2015/0101354 A1 | 4/2015 | Oh et al. |
| 2015/0101355 A1 | 4/2015 | Oh et al. |
| 2015/0107640 A1 | 4/2015 | Caylor et al. |
| 2015/0110156 A1 | 4/2015 | Wellenius et al. |
| 2015/0116943 A1* | 4/2015 | Olsson .................... H01L 35/32 361/708 |
| 2015/0171489 A1 | 6/2015 | Inaba et al. |
| 2015/0194590 A1 | 7/2015 | LaGrandeur |
| 2015/0231636 A1* | 8/2015 | Lim ...................... C12Q 1/6806 435/3 |
| 2015/0238020 A1 | 8/2015 | Petrovski et al. |
| 2015/0298524 A1 | 10/2015 | Goenka |
| 2016/0018139 A1 | 1/2016 | Olsson et al. |
| 2016/0018141 A1 | 1/2016 | Edwards et al. |
| 2016/0030234 A1 | 2/2016 | Lofy et al. |
| 2016/0079510 A1 | 3/2016 | Newman et al. |
| 2016/0133817 A1 | 5/2016 | Makansi et al. |
| 2016/0161155 A1 | 6/2016 | Guichard et al. |
| 2016/0190660 A1 | 6/2016 | Yue et al. |
| 2016/0240585 A1 | 8/2016 | Ranalli et al. |
| 2017/0047500 A1 | 2/2017 | Shiraishi et al. |
| 2017/0066355 A1 | 3/2017 | Kozlowski |
| 2017/0071359 A1 | 3/2017 | Petrovski et al. |
| 2017/0108254 A1 | 4/2017 | Edwards et al. |
| 2017/0294692 A1 | 10/2017 | Bell et al. |
| 2017/0354190 A1 | 12/2017 | Cauchy |
| 2017/0363307 A1 | 12/2017 | Edwards et al. |
| 2017/0365764 A1 | 12/2017 | Shingai et al. |
| 2017/0365767 A1 | 12/2017 | Edwards et al. |
| 2018/0111527 A1 | 4/2018 | Tait et al. |
| 2018/0123013 A1 | 5/2018 | Williams et al. |
| 2018/0170223 A1 | 6/2018 | Wolas |
| 2018/0172325 A1 | 6/2018 | Inaba et al. |
| 2018/0259231 A1 | 9/2018 | Barus |
| 2018/0261748 A1 | 9/2018 | Williams et al. |
| 2018/0279416 A1 | 9/2018 | Sajic et al. |
| 2018/0290574 A1 | 10/2018 | Kozlowski |
| 2019/0051807 A1 | 2/2019 | Okumura et al. |
| 2019/0252745 A1 | 8/2019 | Piggott et al. |
| 2020/0025424 A1 | 1/2020 | Cauchy |
| 2020/0035896 A1 | 1/2020 | Jovovic et al. |
| 2020/0035897 A1 | 1/2020 | Jovovic |
| 2020/0035898 A1 | 1/2020 | Jovovic et al. |
| 2020/0035899 A1 | 1/2020 | Bück |
| 2020/0067150 A1 | 2/2020 | Bell et al. |
| 2021/0041147 A9 | 2/2021 | Cauchy |

FOREIGN PATENT DOCUMENTS

| | | |
|---|---|---|
| CN | 2128076 | 3/1993 |
| CN | 2155318 | 2/1994 |
| CN | 1295345 | 5/2001 |
| CN | 1299950 | 6/2001 |
| CN | 1320087 | 10/2001 |
| CN | 1343294 | 4/2002 |
| CN | 1535220 | 10/2004 |
| CN | 2735256 Y | 10/2005 |
| CN | 1929761 | 3/2007 |
| CN | 101 033 878 | 9/2007 |
| CN | 101 097 986 | 1/2008 |
| CN | 101 219 025 | 7/2008 |
| CN | 100 446 339 | 12/2008 |
| CN | 101 332 785 | 12/2008 |
| CN | 101 662 054 | 3/2010 |
| CN | 102 769 157 | 11/2012 |
| CN | 102 801 105 | 11/2012 |
| CN | 104 282 643 | 1/2015 |
| CN | 303 655 502 | 4/2016 |
| CN | 303655502 S | 4/2016 |
| CN | 106 030 989 | 10/2016 |
| CN | 106 937 799 | 7/2017 |
| CN | 208 355 060 | 1/2019 |
| DE | 11 26 426 | 3/1962 |

(56) References Cited

FOREIGN PATENT DOCUMENTS

| | | |
|---|---|---|
| DE | 1126426 B | 3/1962 |
| DE | 43 29 816 | 3/1994 |
| DE | 195 03 291 | 8/1996 |
| DE | 199 12 764 | 9/2000 |
| DE | 299 11 519 | 11/2000 |
| DE | 102 38 552 | 8/2001 |
| DE | 10114960 C1 | 8/2002 |
| DE | 101 15 242 | 10/2002 |
| DE | 202 17 645 | 3/2003 |
| DE | 201 20 516 | 4/2003 |
| DE | 10196995 B4 | 10/2005 |
| DE | 10 2005 015 190 | 1/2006 |
| DE | 202005015190 U1 | 1/2006 |
| DE | 10 2009 036 332 | 2/2011 |
| DE | 10 2010 012 629 | 9/2011 |
| DE | 10 2010 035 152 | 2/2012 |
| DE | 102012203127 A1 | 9/2012 |
| EM | 0027025550003 S | 6/2015 |
| EP | 0 272 937 | 6/1988 |
| EP | 0 368 741 | 5/1990 |
| EP | 0 368 741 A1 | 5/1990 |
| EP | 0 424 160 | 4/1991 |
| EP | 0 411 375 | 5/1994 |
| EP | 0 621 026 | 10/1994 |
| EP | 0 834 421 | 4/1998 |
| EP | 0 862 901 | 9/1998 |
| EP | 0 878 851 | 11/1998 |
| EP | 1 174 996 | 1/2002 |
| EP | 1 220 313 A1 | 7/2002 |
| EP | 0 678 917 | 6/2003 |
| EP | 0 678 917 A1 | 6/2003 |
| EP | 1 475 532 | 11/2004 |
| EP | 1 515 376 | 3/2005 |
| EP | 1 598 223 | 11/2005 |
| EP | 1 641 067 | 3/2006 |
| EP | 1 780 807 | 5/2007 |
| EP | 1 906 463 | 4/2008 |
| EP | 1 972 312 | 9/2008 |
| EP | 1 845 914 | 9/2009 |
| EP | 2 275 755 | 1/2011 |
| EP | 2 363 881 A1 | 9/2011 |
| EP | 2 378 577 | 10/2011 |
| EP | 2 439 799 | 4/2012 |
| EP | 2 541 634 | 1/2013 |
| EP | 2 565 977 | 3/2013 |
| EP | 2 396 619 | 8/2015 |
| EP | 2 921 083 | 9/2015 |
| EP | 3 099 986 | 12/2016 |
| EP | 3 099 986 A1 | 12/2016 |
| EP | 3 172 503 | 5/2017 |
| EP | 3 172 503 A1 | 5/2017 |
| FR | 1 280 711 | 1/1962 |
| FR | 2 261 638 | 9/1975 |
| FR | 2 316 557 | 1/1977 |
| FR | 2 419 479 | 10/1979 |
| FR | 2 481 786 | 11/1981 |
| FR | 2 543 275 | 9/1984 |
| FR | 2 550 324 | 2/1985 |
| FR | 2 806 666 | 9/2001 |
| FR | 2 879 728 | 6/2006 |
| FR | 2 882 307 | 8/2006 |
| FR | 2 893 826 | 6/2007 |
| FR | 2 903 057 | 1/2008 |
| FR | 2 986 663 | 8/2013 |
| FR | 2986663 A1 | 8/2013 |
| GB | 231192 | 5/1926 |
| GB | 817077 | 7/1959 |
| GB | 874660 | 8/1961 |
| GB | 952678 | 3/1964 |
| GB | 978057 | 12/1964 |
| GB | 1 151 947 | 5/1969 |
| GB | 2 027 534 | 2/1980 |
| GB | 2039387 A | 8/1980 |
| GB | 2 267 338 | 12/1993 |
| GB | 2 333 352 | 7/1999 |
| JP | 45-008280 | 3/1970 |
| JP | 56-097416 | 8/1981 |
| JP | 59-097457 | 6/1984 |
| JP | 60-080044 | 5/1985 |
| JP | 60-085297 | 5/1985 |
| JP | 63-262076 | 10/1988 |
| JP | 01-131830 | 5/1989 |
| JP | 01-200122 | 8/1989 |
| JP | 01-281344 | 11/1989 |
| JP | 04-052470 | 6/1990 |
| JP | 03-102219 | 10/1991 |
| JP | 03-263382 | 11/1991 |
| JP | 04-165234 | 6/1992 |
| JP | H 04273484 A | 9/1992 |
| JP | 05-006687 | 1/1993 |
| JP | 05-026762 | 2/1993 |
| JP | 05-277020 | 10/1993 |
| JP | 06-089955 | 3/1994 |
| JP | 06-207771 | 7/1994 |
| JP | H 06207762 A | 7/1994 |
| JP | 06-342940 | 12/1994 |
| JP | 07-007187 | 1/1995 |
| JP | 07-198284 | 1/1995 |
| JP | 07-074397 | 3/1995 |
| JP | 07-202275 | 8/1995 |
| JP | 07-226538 | 8/1995 |
| JP | 07-253264 | 10/1995 |
| JP | 07-307493 | 11/1995 |
| JP | 08-222771 | 8/1996 |
| JP | 08-293627 | 11/1996 |
| JP | 09-042801 | 2/1997 |
| JP | 09-089284 | 4/1997 |
| JP | 09-276076 | 10/1997 |
| JP | 09-321355 | 12/1997 |
| JP | 10-012935 | 1/1998 |
| JP | 10-035268 | 2/1998 |
| JP | 10-044756 | 2/1998 |
| JP | H 1030856 A | 2/1998 |
| JP | 10-092394 | 4/1998 |
| JP | 10-227508 | 8/1998 |
| JP | 10-238406 | 9/1998 |
| JP | 10-275943 | 10/1998 |
| JP | 10-290590 | 10/1998 |
| JP | 10-297243 | 11/1998 |
| JP | 10-325561 | 12/1998 |
| JP | 10-332883 | 12/1998 |
| JP | 11-032492 | 2/1999 |
| JP | 11-046021 | 2/1999 |
| JP | 11-182907 | 7/1999 |
| JP | 11-201475 | 7/1999 |
| JP | 11-274574 | 10/1999 |
| JP | 11-274575 | 10/1999 |
| JP | 11-317481 | 11/1999 |
| JP | 2000-018095 | 1/2000 |
| JP | 2000-058930 | 2/2000 |
| JP | 2000-060681 | 2/2000 |
| JP | 2000-164945 | 6/2000 |
| JP | 2000-208823 | 7/2000 |
| JP | 2000-214934 | 8/2000 |
| JP | 2000-244024 | 9/2000 |
| JP | 2000-274788 | 10/2000 |
| JP | 2000-274871 | 10/2000 |
| JP | 2000-274874 | 10/2000 |
| JP | 2000-325384 | 11/2000 |
| JP | 2001-007263 | 1/2001 |
| JP | 2001-024240 | 1/2001 |
| JP | 2001-174028 | 6/2001 |
| JP | 2001-208405 | 8/2001 |
| JP | 2001-210879 | 8/2001 |
| JP | 2001-267642 | 9/2001 |
| JP | 2001-304778 | 10/2001 |
| JP | 2001-336853 | 12/2001 |
| JP | 2002-013758 | 1/2002 |
| JP | 2002-059736 | 2/2002 |
| JP | 2002-514735 | 5/2002 |
| JP | 2002-227798 | 8/2002 |
| JP | 2002-232028 | 8/2002 |
| JP | 2003-007356 | 1/2003 |
| JP | 2003-174203 | 6/2003 |

(56) References Cited

FOREIGN PATENT DOCUMENTS

| | | |
|---|---|---|
| JP | 2003-204087 | 7/2003 |
| JP | 2003-217735 | 7/2003 |
| JP | 2003-254636 | 9/2003 |
| JP | 2003-259671 | 9/2003 |
| JP | 2003-332642 | 11/2003 |
| JP | 2004-055621 | 2/2004 |
| JP | 2004-079883 | 3/2004 |
| JP | 2004-174138 | 6/2004 |
| JP | 2004-360522 | 12/2004 |
| JP | 2005-079210 | 2/2005 |
| JP | 2005-057006 | 3/2005 |
| JP | 2005-116839 | 4/2005 |
| JP | 2005-228954 | 8/2005 |
| JP | 2005-251950 | 9/2005 |
| JP | 2005-294695 | 10/2005 |
| JP | 2005-303183 | 10/2005 |
| JP | 2005-317648 | 11/2005 |
| JP | 2005-333083 | 12/2005 |
| JP | 2006-001392 | 1/2006 |
| JP | 2006-021572 | 1/2006 |
| JP | 2006-024608 A | 1/2006 |
| JP | 2006-076398 | 3/2006 |
| JP | 2006-093526 | 4/2006 |
| JP | 2006-127920 | 5/2006 |
| JP | 2006-278327 | 10/2006 |
| JP | 2008-047371 | 2/2008 |
| JP | 2008-091183 | 4/2008 |
| JP | 2008-108509 | 5/2008 |
| JP | 2008-166292 | 7/2008 |
| JP | 2008-218352 | 9/2008 |
| JP | 2008-226617 | 9/2008 |
| JP | 2008-274790 | 11/2008 |
| JP | 2008-300465 | 12/2008 |
| JP | 2009-010138 | 1/2009 |
| JP | 2009-033806 | 2/2009 |
| JP | 2009-170259 | 7/2009 |
| JP | 2009-181853 | 8/2009 |
| JP | 2009-245730 | 10/2009 |
| JP | 2009-289429 | 12/2009 |
| JP | 2009-302054 | 12/2009 |
| JP | 2010-108932 | 5/2010 |
| JP | 2010-113861 | 5/2010 |
| JP | 2010-198930 | 9/2010 |
| JP | 2011-023180 | 2/2011 |
| JP | 2012-079553 | 4/2012 |
| JP | 2012-512504 | 5/2012 |
| JP | 2012-124319 | 6/2012 |
| JP | 2012-516007 | 7/2012 |
| JP | 2012-156131 | 8/2012 |
| JP | 2012-174496 | 9/2012 |
| JP | 2012-522176 | 9/2012 |
| JP | 2012-216422 | 11/2012 |
| JP | 2012-216423 | 11/2012 |
| JP | 2012-234749 | 11/2012 |
| JP | 2013-077432 | 4/2013 |
| JP | 2013-211436 | 10/2013 |
| JP | 2014-135455 | 7/2014 |
| JP | 1542321 | 1/2016 |
| JP | 1542321 S | 1/2016 |
| JP | 5893556 | 3/2016 |
| JP | 2016-540344 | 12/2016 |
| KR | 10-2009-0043712 | 5/2000 |
| KR | 10-2001-0060500 | 7/2001 |
| KR | 10-2003-0082589 | 10/2003 |
| KR | 10-2005-0011494 | 1/2005 |
| KR | 10-2005-0018184 | 2/2005 |
| KR | 10-2005-0089645 | 9/2005 |
| KR | 10-2008-0090162 | 10/2008 |
| KR | 10-2011-0100263 | 9/2011 |
| KR | 10-2011-0128639 | 11/2011 |
| KR | 10-2011-0134960 A | 12/2011 |
| KR | 10-2012-0053476 | 5/2012 |
| KR | 10-2012-0062314 | 6/2012 |
| KR | 30-0851618 | 4/2016 |
| KR | 30-0851619 | 4/2016 |
| KR | 30-0851620 | 4/2016 |
| KR | 300851618 S | 4/2016 |
| KR | 300851619 S | 4/2016 |
| KR | 300851620 S | 4/2016 |
| KR | 10-1721256 | 3/2017 |
| LU | 66619 | 2/1973 |
| RU | 2142178 | 11/1999 |
| RU | 2154875 | 8/2000 |
| RU | 2562507 | 9/2015 |
| SE | 329 870 | 10/1970 |
| SE | 337 227 | 5/1971 |
| SU | 184886 | 7/1966 |
| SU | 1142711 | 2/1985 |
| SU | 1170234 | 7/1985 |
| WO | WO 94/01893 | 1/1994 |
| WO | WO 94/20801 | 9/1994 |
| WO | WO 95/14899 | 6/1995 |
| WO | WO 95/31688 | 11/1995 |
| WO | WO 96/05475 | 2/1996 |
| WO | WO 97/22486 | 6/1997 |
| WO | WO 97/47930 | 12/1997 |
| WO | WO 98/07898 | 2/1998 |
| WO | WO 98/31311 | 7/1998 |
| WO | WO 98/34451 | 8/1998 |
| WO | WO 98/56047 | 12/1998 |
| WO | WO 99/10191 | 3/1999 |
| WO | WO 99/23980 | 5/1999 |
| WO | WO 99/34451 | 7/1999 |
| WO | WO 99/44552 | 9/1999 |
| WO | WO 99/58907 | 11/1999 |
| WO | WO 01/52332 | 7/2001 |
| WO | WO 02/11968 | 2/2002 |
| WO | WO 02/053400 | 7/2002 |
| WO | WO 02/058165 | 7/2002 |
| WO | WO 02/065029 | 8/2002 |
| WO | WO 02/065030 | 8/2002 |
| WO | WO 02/081982 | 10/2002 |
| WO | WO 2002/086980 A1 | 10/2002 |
| WO | WO 03/014634 | 2/2003 |
| WO | WO 03/051666 | 6/2003 |
| WO | WO 03/063257 | 7/2003 |
| WO | WO 03/074951 | 9/2003 |
| WO | WO 2003/090286 | 10/2003 |
| WO | WO 2004/011861 | 2/2004 |
| WO | WO 2004/019379 | 3/2004 |
| WO | WO 2004/026757 | 4/2004 |
| WO | WO 2004/054007 A2 | 6/2004 |
| WO | WO 2005/023571 | 3/2005 |
| WO | WO 2005/115794 | 12/2005 |
| WO | WO 2006/001827 | 1/2006 |
| WO | WO 2006/037178 | 4/2006 |
| WO | WO 2006/041935 | 4/2006 |
| WO | WO 2006/064432 | 6/2006 |
| WO | WO 2006/078394 | 7/2006 |
| WO | WO 2006/102509 | 9/2006 |
| WO | WO 2007/060371 | 5/2007 |
| WO | WO 2007/089789 | 8/2007 |
| WO | WO 2007/097059 | 8/2007 |
| WO | WO 2007/109368 | 9/2007 |
| WO | WO 2008/013946 | 1/2008 |
| WO | WO 2008/023942 | 2/2008 |
| WO | WO 2008/025707 | 3/2008 |
| WO | WO 2008/045964 | 4/2008 |
| WO | WO 2008/046110 | 4/2008 |
| WO | WO 2008/057962 | 5/2008 |
| WO | WO 2008/076588 | 6/2008 |
| WO | WO 2008/086499 | 7/2008 |
| WO | WO 2008/091293 | 7/2008 |
| WO | WO 2008/115831 | 9/2008 |
| WO | WO 2009/015235 | 1/2009 |
| WO | WO 2009/036077 | 3/2009 |
| WO | WO 2009/053858 | 4/2009 |
| WO | WO 2009/097572 | 8/2009 |
| WO | WO 2010/009422 | 1/2010 |
| WO | WO 2010/071463 | 6/2010 |
| WO | WO 2010/088405 | 8/2010 |
| WO | WO 2010/0112961 | 10/2010 |
| WO | WO 2010/129803 | 11/2010 |
| WO | WO 2010/135371 | 11/2010 |

(56) References Cited

FOREIGN PATENT DOCUMENTS

| | | |
|---|---|---|
| WO | WO 2011/011795 | 1/2011 |
| WO | WO 2011/026040 | 3/2011 |
| WO | WO 2011/156643 | 12/2011 |
| WO | WO 2012/022684 | 2/2012 |
| WO | WO 2012/023249 | 2/2012 |
| WO | WO 2012/031980 | 3/2012 |
| WO | WO 2012/045542 | 4/2012 |
| WO | WO 2012/061763 | 5/2012 |
| WO | WO 2012/061777 | 5/2012 |
| WO | WO 2012/113930 | 8/2012 |
| WO | WO 2012/137289 | 10/2012 |
| WO | WO 2012/170443 | 12/2012 |
| WO | WO 2013/029744 | 3/2013 |
| WO | WO 2013/050961 A1 | 4/2013 |
| WO | WO 2013/052823 | 4/2013 |
| WO | WO 2014/055447 | 4/2014 |
| WO | WO 2014/110524 | 7/2014 |
| WO | WO 2014/120688 | 8/2014 |
| WO | WO 2014/134369 | 9/2014 |
| WO | WO 2014/164887 | 10/2014 |
| WO | WO 2015/066079 A1 | 5/2015 |
| WO | WO 2016/014541 | 1/2016 |
| WO | WO 2016/040872 | 3/2016 |
| WO | WO 2016/044420 | 3/2016 |
| WO | WO 2016/077843 | 5/2016 |
| WO | WO 2017/059256 | 4/2017 |
| WO | WO 2017/066261 | 4/2017 |
| WO | WO 2017/086043 | 5/2017 |
| WO | WO 2017/100718 | 6/2017 |
| WO | WO 2017/136793 | 8/2017 |
| WO | WO 2018/165414 A2 | 9/2018 |
| WO | WO 2018/165582 A1 | 9/2018 |
| WO | WO 2018/175506 | 9/2018 |
| WO | WO 2019/173553 | 9/2019 |
| WO | WO 2020/112902 | 6/2020 |
| WO | WO 2020/172255 | 8/2020 |
| WO | WO 2020/180632 | 9/2020 |
| WO | WO 2021/025663 | 2/2021 |

OTHER PUBLICATIONS

U.S. Appl. No. 15/042,846, filed Feb. 12, 2016.
U.S. Appl. No. 15/685,912, filed Aug. 24, 2017, Petrovski et al.
U.S. Appl. No. 16/277,765, filed Feb. 15, 2019, Petrovski et al.
Kwon, H. et al., Hyundai Motor Co., corresponding to KR 97026106 A, published Jun. 24, 1997, in 2 pages.
Diller, R. W., et al., "Experimental Results Confirming Improved Performance of Systems Using Thermal Isolation", 21st International Conference on Thermoelectronics, Aug. 25-29, 2002, Piscataway, NJ, USA, IEEE, pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles", 22nd International Conference on Thermoelectrics, 2003, IEEE, pp. 571-573.
Feher, S., "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Funahashi, R. et al., "Preparation and properties of thermoelectric pipe-type modules", ICT 25th International Conference, Aug. 6-10, 2006, Thermoelectrics, 2006, pp. 58-61.
Hendricks, T. et al., "Advanced Thermoelectric Power System Investigations for Light-Duty and Heavy Duty Applications", National Renewable Energy Laboratory, Center for Transportation Technology & Systems, Colorado, Proc. 21st Int'l Cont. on Thermoelectrics, Aug. 2002, pp. 381-386.
Kambe, M., et al., "Encapsulated Thermoelectric Modules and Compliant Pads for Advanced Thermoelectric Systems," Journal of Electronic Materials, vol. 39, No. 9, Nov. 9, 2010, pp. 1418-1421.
Lofy, J., et al., "Thermoelectrics for Environmental Control in Automobiles", Proceeding of Twenty-First International Conference on Thermoelectrics (ICT 2002), 2002, pp. 471-476.
Luo, Z., "A Simple Method to Estimate the Physical Characteristics of a Thermoelectric Cooler from Vendor Datasheets", Electronics Cooling, Aug. 2008, in 17 pages from https://www.electronics-cooling.com/2008/08/a-simple-method-to-estimate-the-physical-characteristics-of-a-thermoelectric-cooler-from-vendor-datasheets/.
Menchen, W. et al., "Thermoelectric Conversion to Recover Heavy Duty Diesel Exhaust Energy", Proceedings of the Annual Automotive Technology Development Contractors Meeting, Apr. 1991, pp. 445-449.
Min, G. et al., "Ring-structured thermoelectric module", Semiconductor Science and Technology, vol. 22, Jun. 29, 2007, pp. 880-883.
Miner, A., et al., "Thermoelectromechanical Refrigeration Based on Transient Thermoelectric Effects", Applied Physics letters, vol. 75, No. 8, Aug. 23, 1999, pp. 1176-1178.
Photographs and accompanying description of climate control seat assembly system components publicly disclosed as early as Jan. 1998.
Photographs and accompanying description of a component of a climate control seat assembly system sold prior to Nov. 1, 2005.
Photographs and accompanying description of a component of a climate control seat assembly system sold prior to Dec. 20, 2003.
Snyder, G., et al., "Thermoelectric Efficiency and Compatibility", The American Physical Society, Oct. 2, 2003, vol. 91, No. 14, pp. 148301-1 to 148301-4.
Tada, S., et al., "A New Concept of Porous Thermoelectric Module Using a Reciprocating Flow for Cooling/Heating Systems (Numerical Analysis for Heating Systems)", 16th International Conference on Thermoelectrics, 1977, pp. 664-667.
Thermoelectrics Handbook: Macro to Nano, Thermoelectric Module Design Theories, 11.7 Ring-Structure Module, edited by D.M. Rowe, CRC Press, 2006.pp. 11-11 to 11-15.
Invitation to Pay Additional Fees received in PCT Application No. PCT/US2020/018801, dated Mar. 18, 2020.
International Search Report and Written Opinion received in PCT Application No. PCT/US2020/018801, dated May 4, 2020.
U.S. Appl. No. 16/355,550, filed Mar. 15, 2019, Kossakovski et al.
U.S. Appl. No. 16/459,289, filed Jul. 1, 2019, Kossakovski et al.
Behr, "Li-on Battery Cooling", Power Point Presentation, Stuttgart, May 20, 2009, 13 pages.
Behr, "Thermal Management for Hybrid Vehicles", Power Point Presentation, Technical Press Day 2009, 20 pages.
Chacko, Salvio et al., "Thermal modelling of Li-ion polymer battery for electric vehicle drive cycles", Journal of Power Sources, vol. 213, Sep. 2012, pp. 296-303.
Esfahanian, Vahid et al., "Design and Simulation of Air Cooled Battery Thermal Management System Using Thermoelectric for a Hybrid Electric Bus", Proceedings of the FISITA 2012 World Automotive Congress, vol. 3, Lecture notes in Electrical Engineering, vol. 191, 2013.
Goldsmid, H.J., "Electronic Refrigeration", Pion Ltd, 207 Brondesbury Park, London (1986), in 235 pages.
Horie, et al., "A Study on an Advanced Lithium-ion Battery System for EVs", The World Electric Vehicle Journal, 2008, vol. 2, Issue 2, pp. 25-31.
International Search Report and Written Opinion, re PCT Application No. PCT/US2014/013452, dated May 8, 2014.
International Preliminary Report on Patentability, re PCT Application No. PCT/US2014/013452, dated Aug. 4, 2015.
Ioffe, A.F., "Semiconductor Thermoelements and Thermoelectronic Cooling", Infosearch Limited., London (1957), in 41 pages.
Jeon et al., "Development of Battery Pack Design for High Power Li-Ion Battery Pack of HEV", The World Electric Vehicle Association Journal, 2007, vol. 1, pp. 94-99.
Jeon et al., "Thermal modeling of cylindrical lithium ion battery during discharge cycle," Energy Conversion and Management, Aug. 2011, vol. 52, Issues 8-9, pp. 2973-2981.
Kays, W.M. et al., "Compact Heat Exchangers", McGraw-Hill Book Company (1984), in 12 pages.
Morawietz, et al., "Thermoelektrische Modellierung eines Lithium-Lonen-Energiespeichers fuer den Fahrzeugeinsatz," VDI-Berichte, Nov. 2008, Issue 2030, pp. 299-318, along with its English translation.

(56) References Cited

OTHER PUBLICATIONS

Sabbah et al., "Passive Thermal Management System for Plug-in Hybrid and Comparison with Active Cooling: Limitation of Temperature Rise and Uniformity of Temperature Distribution," ECS Transactions, The Electrochemical Society, 2008, 13 (19) pp. 41-52.
Snyder, G. Jeffrey, et al., "Thermoelectric Efficiency and Compatibility", The American Physical Society, Oct. 2, 2003, vol. 91, No. 14, pp. 148301-1 to 148301-4.

* cited by examiner

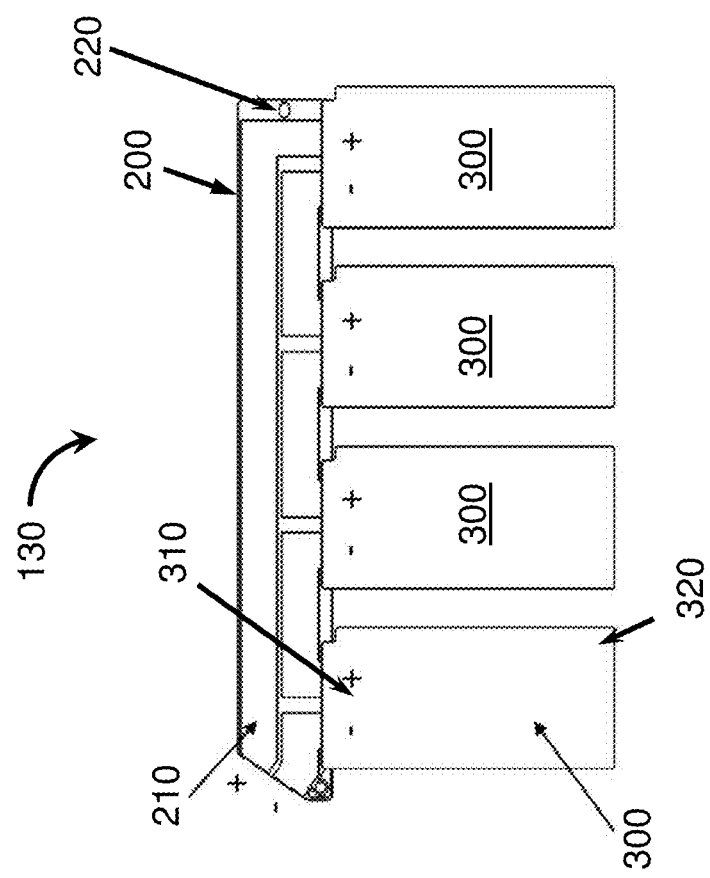
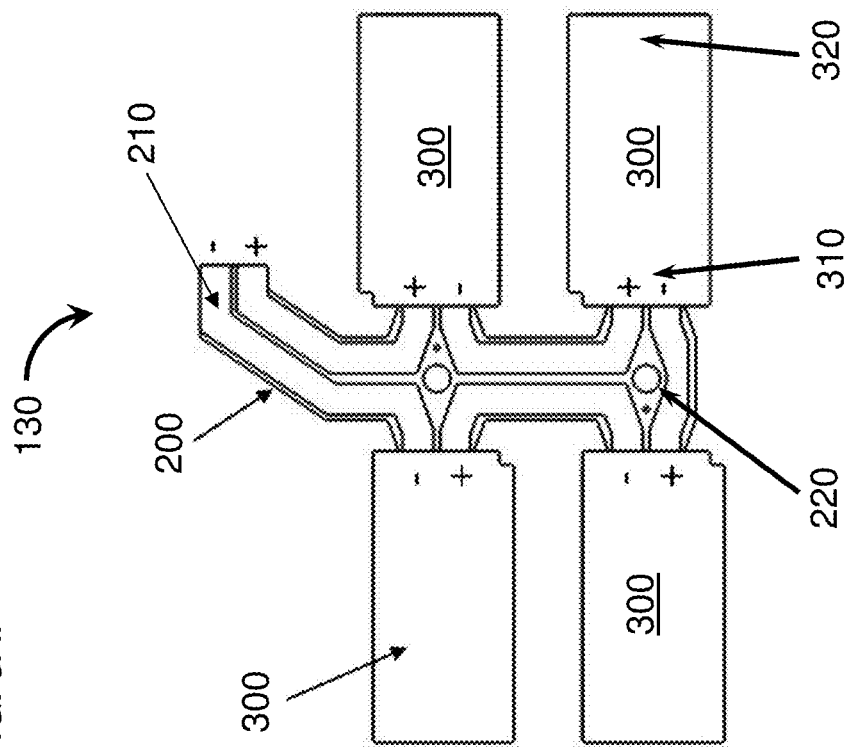
FIG. 3A:
FIG. 3B:

FIG. 7B:
FIG. 7C:
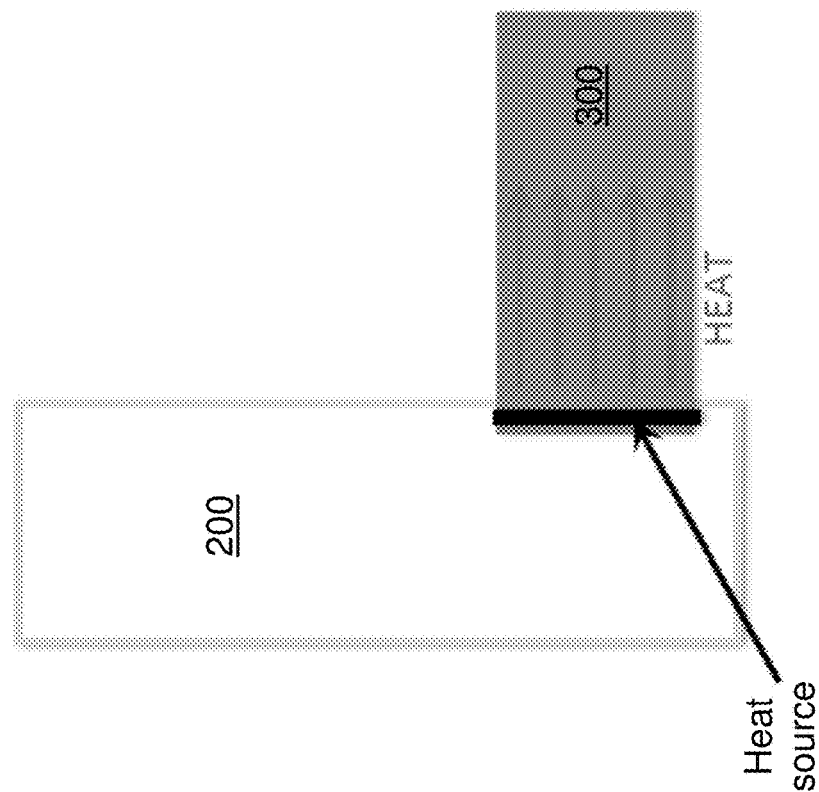
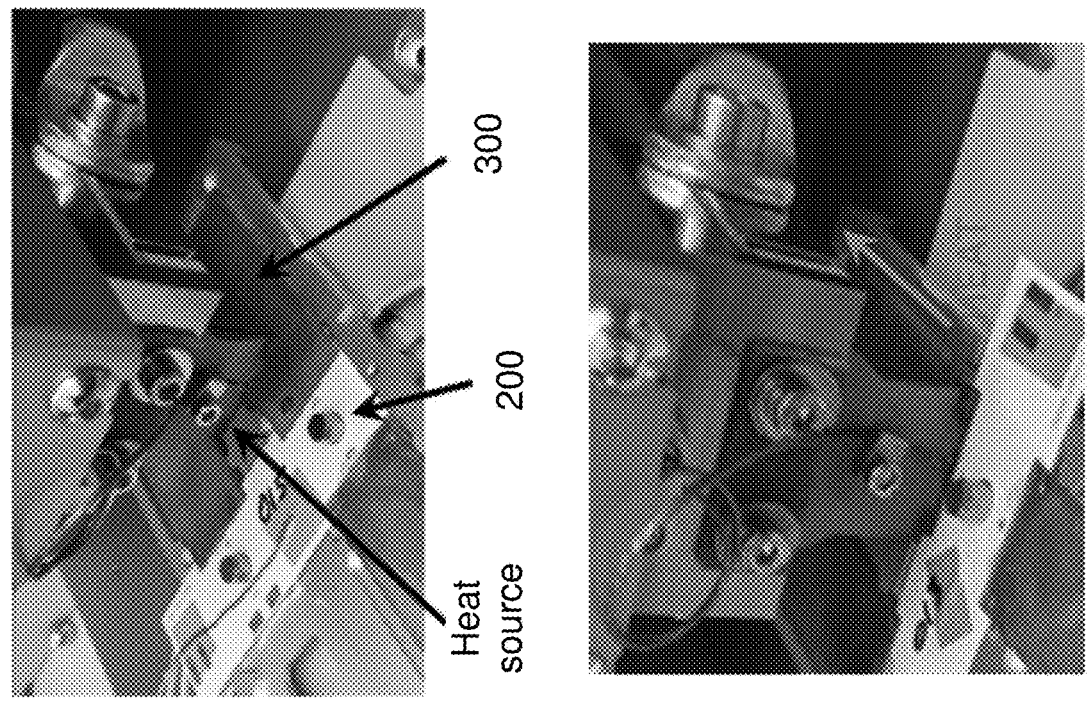

THERMOELECTRIC MODULE WITH INTEGRATED PRINTED CIRCUIT BOARD

CLAIM OF PRIORITY

This application claims the benefit of priority to U.S. Provisional Appl. No. 62/808,205 filed Feb. 20, 2019 and incorporated in its entirety by reference herein.

BACKGROUND

Field

This application relates to thermoelectric devices and modules used for thermal management of components and/or systems, including but not limited to batteries.

Description of the Related Art

Power electronics and other electrical devices, such as batteries, can be sensitive to overheating, cold temperatures, extreme temperatures, and operating temperature limits. The performance of such devices may be diminished, sometimes severely, when the devices are operated outside of recommended temperature ranges. In semiconductor devices, integrated circuit dies can overheat and malfunction. In batteries, including, for example, batteries used for automotive applications in electrified or electrical vehicles, battery cells and their components can degrade when overheated or overcooled. Such degradation can manifest itself in reduced battery storage capacity and/or reduced ability for the battery to be recharged over multiple duty cycles. Furthermore, high performance batteries for use in large systems (including, for example, lithium based batteries used in electrical vehicles) have certain properties (e.g., charging characteristics) and/or safety-related events (e.g., potential fires due to over-temperature conditions) that make thermal management of the batteries and/or containment system desirable.

SUMMARY

In certain embodiments, a thermoelectric module assembly for thermally conditioning a component is provided. The assembly comprises first and second heat spreaders spaced apart from one another. The assembly further comprises at least one thermoelectric sub-assembly between and in thermal communication with the first and second heat spreaders. The at least one thermoelectric sub-assembly comprises a printed circuit board comprising a plurality of electrical conduits. The at least one thermoelectric sub-assembly further comprises a plurality of thermoelectric devices. Each thermoelectric device of the plurality of thermoelectric devices has a first end portion and a second end portion, the second end portion opposite from the first end portion, the first end portion mechanically coupled to the printed circuit board and in electrical communication with the plurality of electrical conduits, and the second end portion spaced from the printed circuit board.

In certain embodiments, a thermoelectric system is provided. The system comprises a printed circuit board comprising a plurality of electrically conductive first tabs at a surface of the printed circuit board. The system further comprises at least one thermoelectric device mechanically coupled to the printed circuit board. The at least one thermoelectric device comprises a thermally conductive first plate, a thermally conductive second plate, and a plurality of thermoelectric elements in thermal communication with and in a region between the first plate and the second plate. The second plate comprises a first portion extending beyond a perimeter of the first plate and over an edge of the printed circuit board and over two first tabs of the plurality of first tabs. The first portion comprises two electrically conductive second tabs, each of the two second tabs in mechanical and electrical communication with a corresponding first tab of the two first tabs.

In certain embodiments, a thermoelectric system is provided. The system comprises a plurality of thermoelectric devices and a printed circuit board. Each thermoelectric device of the plurality of thermoelectric devices comprises a thermally conductive first plate, a thermally conductive second plate, and a plurality of thermoelectric elements in thermal communication with and in a region between the first plate and the second plate. The printed circuit board comprises a plurality of first electrical conduits and a plurality of second electrical conduits. The first electrical conduits are in electrical communication with the thermoelectric elements of the plurality of thermoelectric devices, and the second electrical conduits are in electrical communication with at least one thermal sensor on at least one thermoelectric device of the plurality of thermoelectric devices and/or on the printed circuit board.

In certain embodiments, a method of fabricating at least one thermoelectric sub-assembly comprising a printed circuit board and a plurality of thermoelectric devices is provided. The method comprises providing the printed circuit board which comprises a plurality of electrical conduits and a plurality of electrically conductive first tabs in electrical communication with the plurality of electrical conduits. The method further comprises providing the plurality of thermoelectric devices, each thermoelectric device comprises a first end portion and a second end portion. The second end portion is opposite to the first end portion, and the first end portion comprises at least two electrically conductive second tabs. The method further comprises mechanically coupling the at least two second tabs of each thermoelectric device of the plurality of thermoelectric devices to corresponding first tabs of the printed circuit board such that the at least two second tabs are in electrical communication with the corresponding first tabs and the second end portion is spaced from the printed circuit board.

In certain embodiments, a method of fabricating a thermoelectric device comprising a first plate, a second plate, and a plurality of thermoelectric elements between and in electrical communication between the first plate and the second plate is provided. The method comprises providing the thermoelectric device. The second plate extends beyond a perimeter of the first plate along a portion of the thermoelectric device. The method further comprises applying a first sealant between the first plate and the second plate along the portion.

BRIEF DESCRIPTION OF THE DRAWINGS

FIGS. 3A and 3B schematically illustrate the example thermoelectric sub-assemblies of FIGS. 2A and 2B, respectively, in accordance with certain embodiments described herein.

FIGS. 7B and 7C illustrate heat conduction during the soldering process from the first portion of the second plate along the second plate in accordance with certain embodiments described herein.

DETAILED DESCRIPTION

Figure 1A:
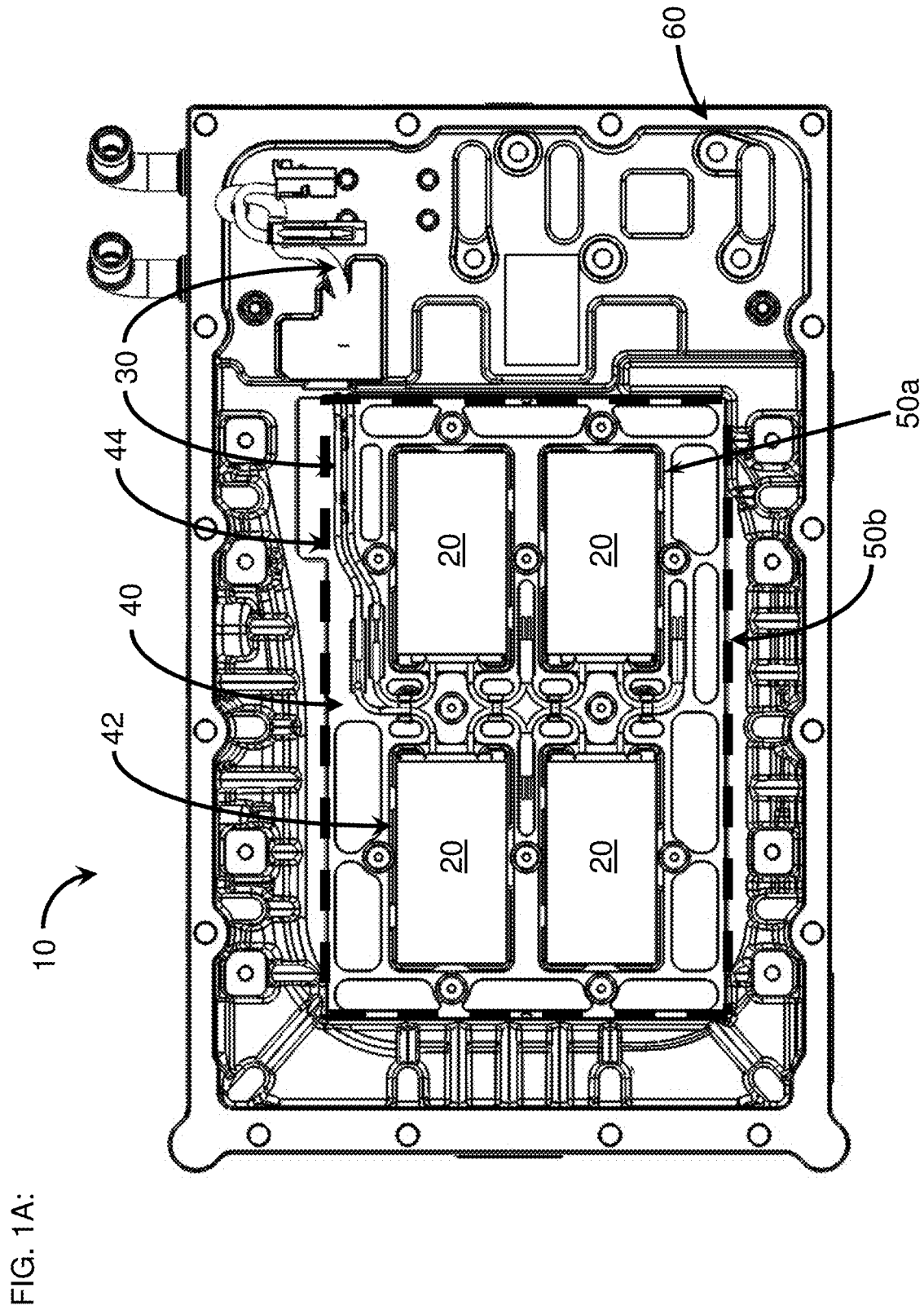
FIGS. 1A and 1B schematically illustrate a top view and an exploded view, respectively, of a portion of a thermoelectric module assembly.
Figure 1B:
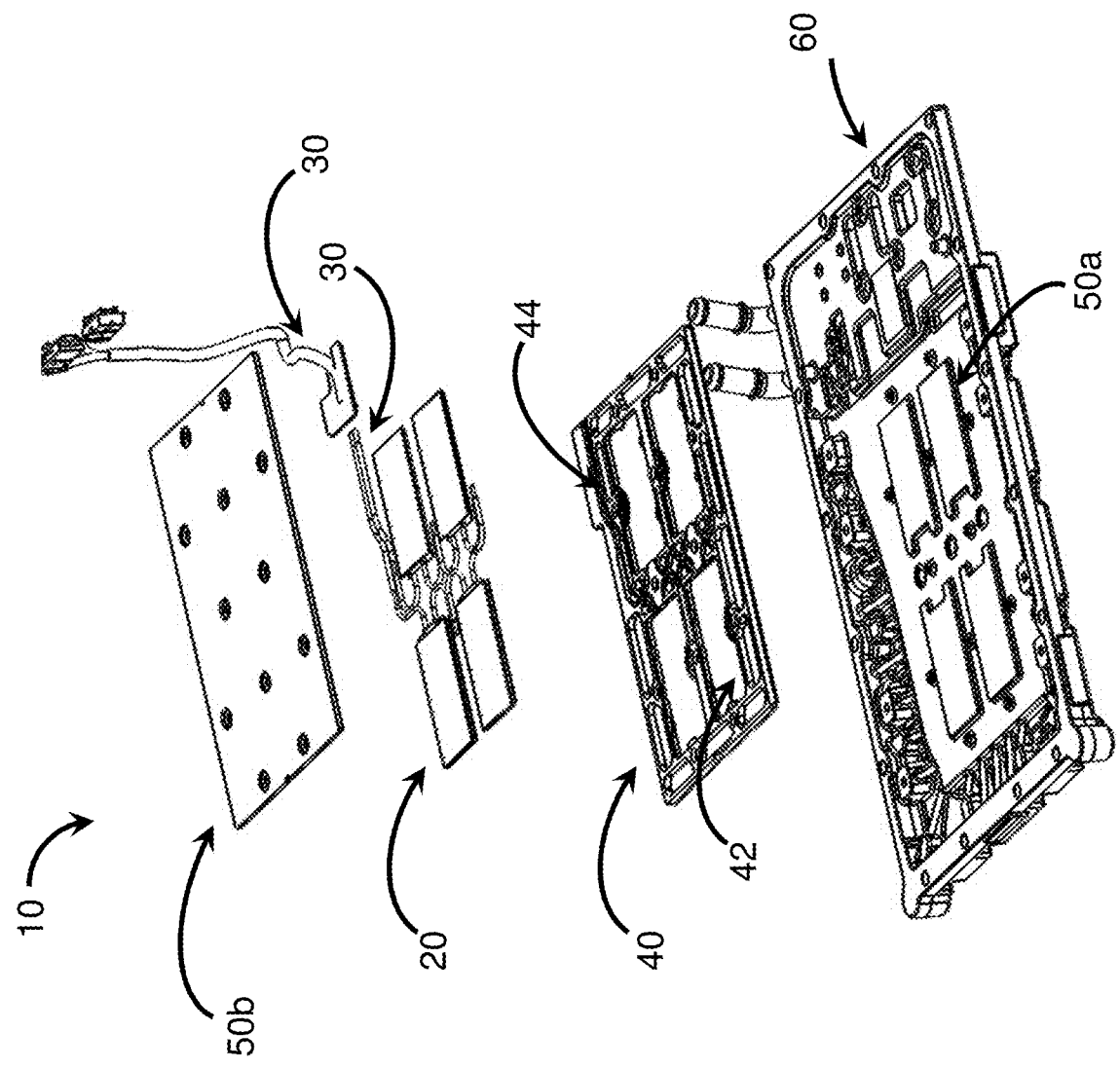

FIGS. 1A and 1B schematically illustrate a top view and an exploded view, respectively, of a portion of a thermoelectric module assembly 10 comprising a plurality of thermoelectric devices 20 that are electrically interconnected with one another and to external circuitry by electrically conductive wires 30. The thermoelectric devices 20 are held in place (e.g., aligned and secured) by a molded plastic insert 40 with a plurality of holes 42 configured to receive and hold the thermoelectric devices 20 onto a first heat spreader 50a and below a second heat spreader 50b, the first heat spreader 50a in thermal communication with the cooling plate 60 (e.g., heat exchanger) of the thermoelectric module assembly 10. The plastic insert 40 also has a plurality of channels 44 configured to receive and hold the electrically conductive wires 30. Fabrication of the thermoelectric module assembly 10 of FIGS. 1A and 1B can be challenging and time-consuming since each of the thermoelectric devices 20 has to be separately inserted into the corresponding hole 42 of the plastic insert 40 and the various electrically conductive wires 30 have to be separately inserted into the corresponding channel 44 of the plastic insert 40, which can be cumbersome. In addition, due to the fragility of the connections between the electrical wires 30 and the thermoelectric devices 20, such fabrication has a significant probability of introducing failure conditions (e.g., broken electrical connections) which then must be corrected, further increasing the time and cost involved in the fabricating the thermoelectric module assembly 10.

Figure 2A:
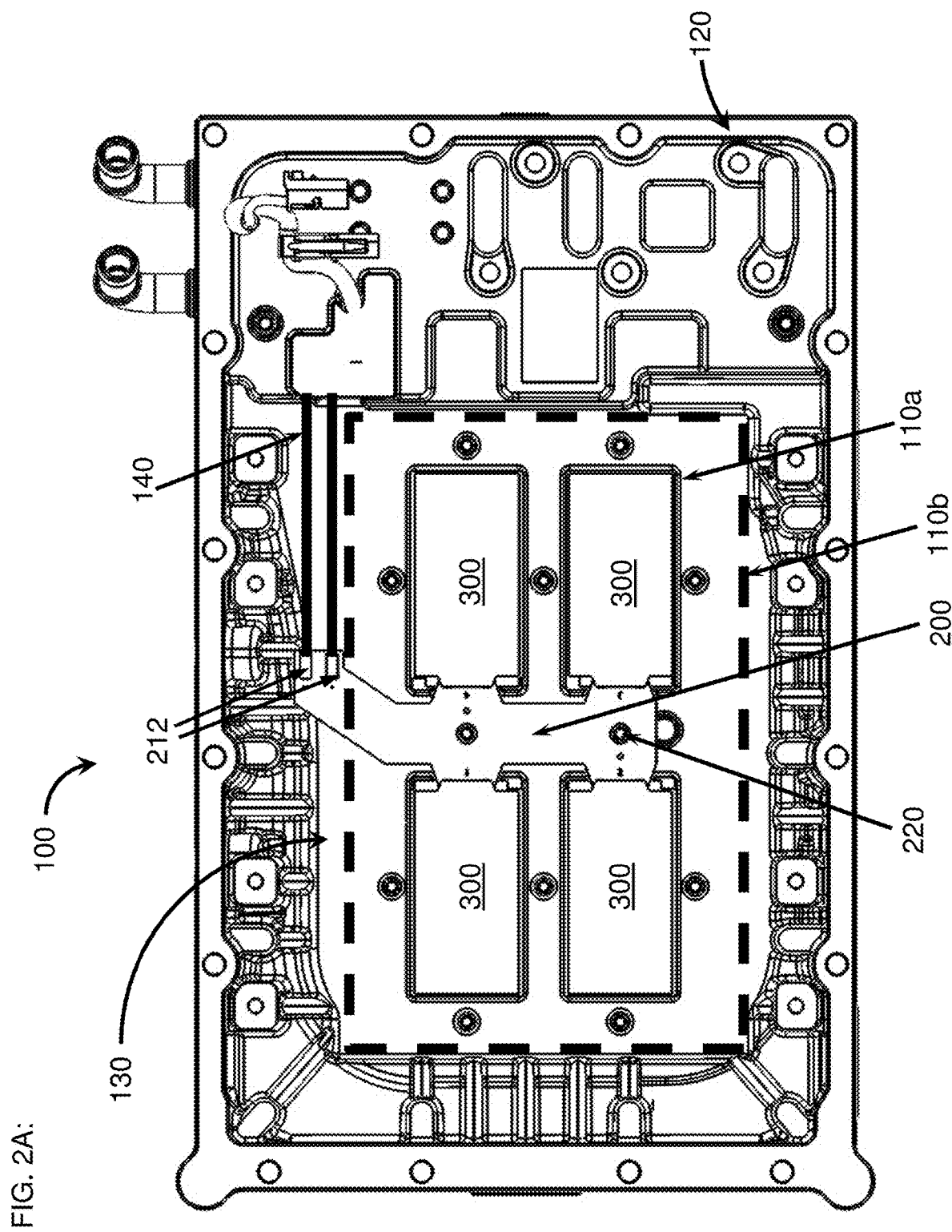
FIGS. 2A and 2B schematically illustrate top views of portions of two example thermoelectric module assemblies in accordance for certain embodiments described herein.
Figure 2B:
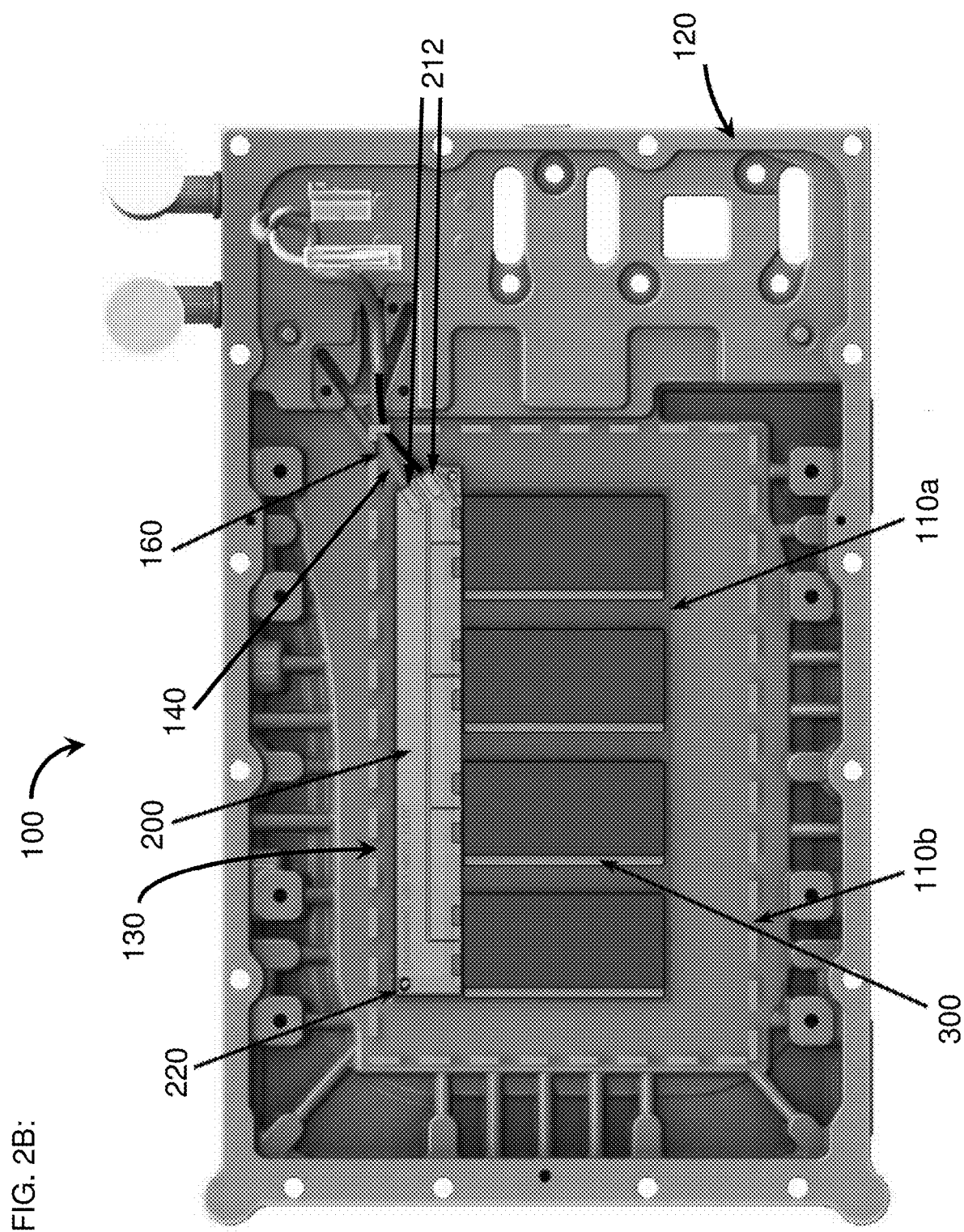

FIGS. 2A and 2B schematically illustrate top views of portions of two example thermoelectric module assemblies 100 in accordance with certain embodiments described herein. The thermoelectric module assemblies 100 of FIGS. 2A and 2B can be configured for thermally conditioning a component (e.g., pumping heat from at least one electronic component, such as a battery, that can generate heat and/or has a performance that is sensitive to heat). The assembly 100 comprises first and second heat spreaders 110a,b (the second heat spreader 110b denoted by a dashed line in FIGS. 2A and 2B) spaced apart from one another. In certain embodiments, one or both of the first and second heat spreaders 110a,b can be in thermal communication with a heat exchanger 120 that is air-cooled, water-cooled, and/or solid-cooled. The assembly 100 further comprises at least one thermoelectric sub-assembly 130 between and in thermal communication with (e.g., in contact with) the first and second heat spreaders 110a,b. For example, the first heat spreader 110a can be below the at least one thermoelectric sub-assembly 130 and the second heat spreader 110b can be above the at least one thermoelectric sub-assembly 130. While the portions of the example thermoelectric module assemblies 100 shown in FIGS. 2A and 2B each comprise one thermoelectric sub-assembly 130, in certain other embodiments, the assembly 100 can comprise other numbers (e.g., two or more) of thermoelectric sub-assemblies 130.

FIGS. 3A and 3B schematically illustrate the example thermoelectric sub-assemblies 130 of FIGS. 2A and 2B, respectively, in accordance with certain embodiments described herein. The at least one thermoelectric sub-assembly 130 comprises a printed circuit board (PCB) 200 comprising a plurality of electrical conduits 210 and a plurality of thermoelectric devices (TEDs) 300. Each TED 300 of the plurality of TEDs 300 has a first end portion 310 and a second end portion 320, the second end portion 320 opposite from the first end portion 310. The first end portion 310 is mechanically coupled to the PCB 200 and is in electrical communication with the plurality of electrical conduits 210, and the second end portion 320 is spaced from the PCB 200. While the thermoelectric sub-assemblies 130 shown in FIGS. 3A and 3B each comprise one PCB 200 and four TEDs 300, in certain other embodiments, the thermoelectric sub-assembly 130 can comprise other numbers (e.g., two or more) of PCBs 200 per thermoelectric sub-assembly 130 and/or other numbers (e.g., two, three, five or more) of TEDs 300 per thermoelectric sub-assembly 130.

In certain embodiments, the PCB 200 comprises a planar laminate structure having one or more electrically conductive layers (e.g., copper; aluminum; metal; metal alloy or composite) and one or more electrically insulating layers (e.g., fiberglass; resin; polymer; fibrous material preimpregnated with a resin material such as epoxy; solder mask). The one or more electrically conductive layers can be configured to provide the plurality of electrical conduits 210 which are in electrical communication with the plurality of TEDs 300. For example, portions of an electrically conductive layer can be electrically insulated from one another (e.g., with solder mask, plastic coating, conformal coating), and each of these portions can be in electrical communication with a corresponding TED 300, as shown schematically in FIGS. 3A and 3B. At least some of the electrical conduits 210 are configured to provide electrical power to the TEDs 300. In certain embodiments, the PCB 200 comprises one or more alignment holes 220 configured to receive a corresponding one or more alignment protrusions (e.g., pins) extending from other portions of the assembly 100 (see, e.g., FIGS. 2A-2B and 3A-3B). For example, the one or more alignment holes 220 can be configured to mate with corresponding one or more alignment protrusions of a heat exchanger 120. The one or more alignment holes 220 and one or more alignment protrusions are configured to facilitate positioning of the thermoelectric sub-assembly 130 within the assembly 100. In certain embodiments, the PCB 200 is configured to hold in place (e.g., align and secure) the TEDs 300 and to eliminate cumbersome wire routing. In certain embodiments, the PCB 200 comprises a flexible, thin foil PCB.

Figure 4A:
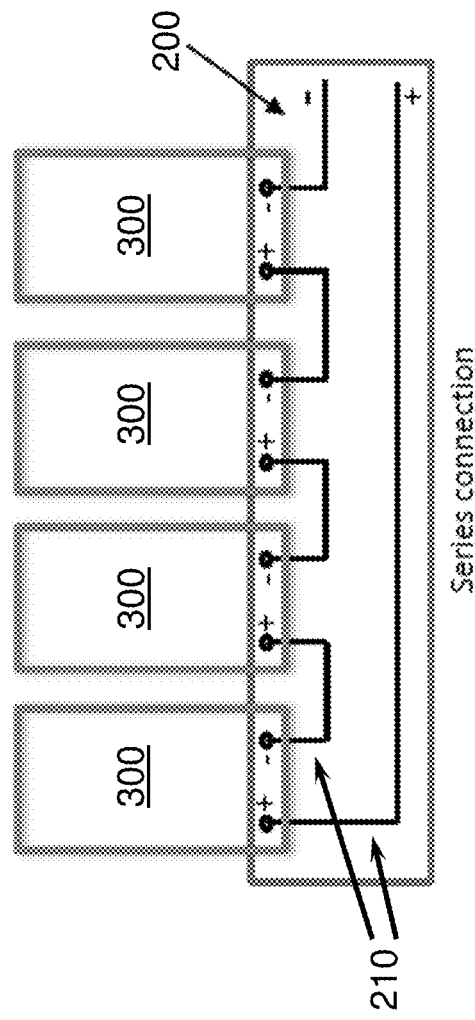
FIGS. 4A and 4B schematically illustrate two electrical configurations of the PCB in accordance with certain embodiments described herein.
Figure 4B:
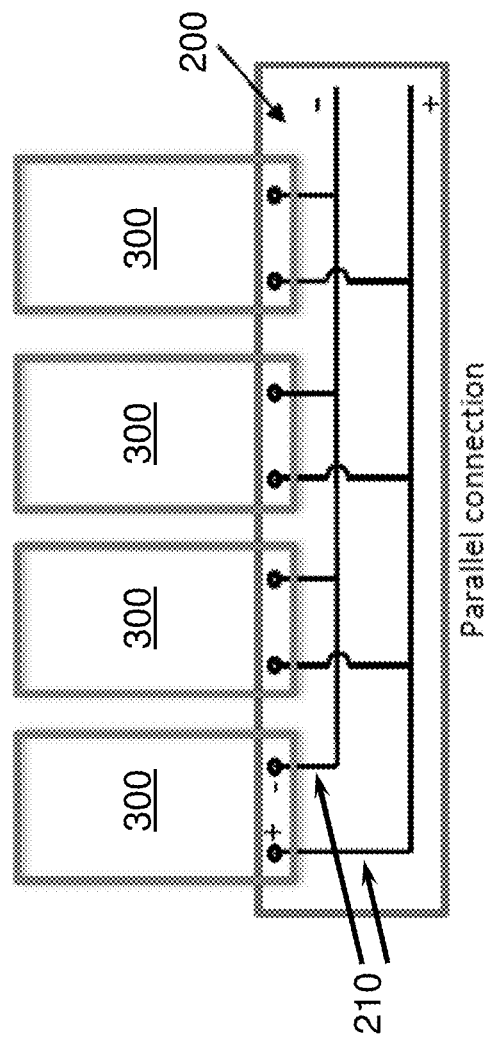

In certain embodiments, at least some of the TEDs 300 are in series electrical communication with one another. For example, FIG. 4A schematically illustrates an example electrical configuration of the PCB 200 in which the electrical conduits 210 connect all of the TEDs 300 in series electrical communication with one another in accordance with certain embodiments described herein (e.g., as also shown in FIGS. 3A and 3B). In certain embodiments, at least some of the TEDs 300 are in parallel electrical communication with one another. For example, FIG. 4B schematically illustrates an example electrical configuration of the PCB 200 in which the electrical conduits 210 connect all of the TEDs 300 in parallel electrical communication with one another. In certain other embodiments, at least some of the TEDs 300 are in series electrical communication with one another and at least some of the TEDs 300 are in parallel electrical communication with one another.

In certain embodiments, each TED 300 of the plurality of TEDs 300 comprises a thermally conductive first plate 330, a thermally conductive second plate 340, and a plurality of thermoelectric (TE) elements 350 in thermal communication with the first plate 330 and the second plate 340 and in a region between the first plate 330 and the second plate 340. In certain embodiments, each of the first plate 330 and the second plate 340 comprises a planar laminate structure (e.g., a printed circuit board) having one or more electrically conductive layers (e.g., copper; aluminum; metal; metal alloy or composite) and one or more electrically insulating layers (e.g., fiberglass; resin; polymer; fibrous material pre-impregnated with a resin material such as epoxy). The one or more electrically conductive layers can be configured to provide electrical connections to the plurality of TE elements 350. For example, an outer electrically conductive layer of the one or more electrically conductive layers can comprise electrically conductive pads configured to be coupled (e.g., soldered) to the TE elements 350, and the pads can be in electrical communication with other pads (e.g., by electrically conductive lines formed by selective chemical etching of the electrically conductive layers and by electrically conductive vias formed through the electrically insulating layers). In certain embodiments, at least one TED 300 of the plurality of TEDs 300 has one or more heat radiative elements (e.g., fins) on at least one side of the TED 300.

In certain embodiments, each of the first plate 330 and the second plate 340 has an elongate shape, for example, a planar parallelogram shape (e.g., rhombus shape; rectangular shape; square shape) with four edges (e.g., a rectangular shape with two shorter edges and two longer edges, as shown in FIGS. 2A-2B and 3A-3B). Each of the first plate 330 and the second plate 340 can have other planar shapes (e.g., polygonal) with other numbers of edges in accordance with certain embodiments described herein (e.g., triangular shapes with three edges; trapezoidal shapes with four edges; pentagonal shapes with five edges; hexagonal shapes with six edges; etc.). In certain embodiments, the first plate 330 has a first surface (e.g., a top surface of the first plate 330) configured to be in thermal communication with (e.g., in contact with) one of the first heat spreader 110a and the second heat spreader 110b and the second plate 340 has a second surface (e.g., a bottom surface of the second plate 340) configured to be in thermal communication with (e.g., in contact with) the other of the first heat spreader 110a and the second heat spreader 110b.

In certain embodiments, the plurality of TE elements 350 comprises p-type TE elements and n-type TE elements in electrical communication with one another through a plurality of shunts 352 (e.g., electrically conductive pads of the first plate 330 and the second plate 340). For example, the plurality of TE elements 350 can be arranged in a "stonehenge" configuration in which p-type and n-type TE elements 350 alternate with one another and are in series electrical communication with one another by shunts 352 which are alternately positioned on the first plate 330 and the second plate 340 such that electrical current can flow serially through the TE elements 350 and the shunts 352 in a serpentine fashion. In certain embodiments, the plurality of TE elements 350 are in thermal communication with the first plate 330 through the shunts 352 (e.g., electrically conductive pads) of the first plate 330 and in thermal communication with the second plate 340 through the shunts 352 (e.g., electrically conductive pads) of the second plate 340. In certain embodiments, some or all of a perimeter of the first plate 330 and the second plate 340 is sealed by at least one sealing material 360 (e.g., silicone; epoxy) which forms a seal (e.g., a water-tight seal; a hermetic seal) between a region containing the TE elements 350 between the first plate 330 and the second plate 340 and an environment surrounding the TED 300.

In certain embodiments, the PCB 200 is planar and each of the TEDs 300 of the thermoelectric sub-assembly 130 are planar. In certain such embodiments, the PCB 200 and the TEDs 300 are substantially planar with one another (e.g., as shown in FIGS. 2A-2B and 3A-3B), while in certain other embodiments, at least some of the TEDs 300 are not planar with one another (e.g., are parallel with but offset from one another; are at a non-zero angle relative to one another) and/or the PCB 200 is not planar with one or more of the TEDs 300 (e.g., is parallel with but offset from one or more of the TEDs 300; is at a non-zero angle relative to one or more of the TEDs 300; is planar with one or more other TEDs 300).

In certain embodiments, at least a first TED 300 extends from the PCB 200 in a first direction and at least a second TED 300 extends from the PCB 200 in a second direction parallel to the first direction. In certain such embodiments, all of the TEDs 300 extend from the PCB 200 in directions that are parallel to one another. For example, as schematically illustrated by FIGS. 2A and 3A, two of the TEDs 300 extend from the PCB 200 in a first direction (e.g., towards the left) and two other TEDs 300 extend from the PCB 200 in a second direction (e.g., towards the right) which is opposite and parallel to the first direction. For another example, as schematically illustrated by FIGS. 2B and 3B, the four TEDs 300 all extend in the same direction (e.g., two of the TEDs 300 extending from the PCB 200 in FIG. 3B in a first downward direction and two other TEDs 300 extending from the PCB 200 in FIG. 3B in a second downward direction that is the same as the first downward direction). In certain other embodiments, each of the TEDs 300 extends from the PCB 200 in a corresponding direction that is not parallel to any of the directions in which the other TEDs 300 extend from the PCB 200.

The portions of the example thermoelectric module assemblies 100 shown in FIGS. 2A and 2B are coplanar with the thermoelectric sub-assembly 130 between and in thermal communication with the first and second heat spreaders 110a,b. As schematically illustrated in FIG. 2A, the first heat spreader 110a comprises a plurality of thermally conductive portions (e.g., generally rectangular islands), each of which is below and in thermal communication with a corresponding TED 300 of the assembly 100. As schematically illustrated in FIG. 2B, the first heat spreader 110a comprises a single continuous thermally conductive portion (e.g., a generally rectangular island) which is below and in thermal communication with the TEDs 300 of the assembly 100. In FIGS. 2A and 2B, the PCB 200 does not contact the first heat spreader 110a and comprises one or more alignment holes 220 which mate with one or more protrusions (e.g., alignment pins) which extend from one or more support surfaces beneath the PCB 200. The one or more support surfaces and the one or more protrusions are configured to hold and support the PCB 200 such that the TEDs 300 extending from the PCB 200 are in mechanical and thermal communication with the first heat spreader 110a. FIGS. 2A and 2B do not show the second heat spreader 110b (e.g., which is above the PCB 200 and TEDs 300 of FIGS. 2A and 2B), but these figures use a dashed rectangular line to denote an area (e.g., footprint) of the second heat spreader 110b relative to the thermoelectric sub-assembly 130.

In certain embodiments, the first heat spreader 110a and the second heat spreader 110b are configured to transfer heat away from the component to be thermally conditioned. For example, the second heat spreader 110b can be configured to transfer heat to the TEDs 300 from the component to be thermally conditioned, and the first heat spreader 110a can be configured to transfer heat away from the TEDs 300. The second heat spreader 110b can comprise at least one first surface configured to be in thermal communication with the TEDs 300 and at least one second surface configured to be in thermal communication with the component to be thermally conditioned by the thermoelectric module assembly 100. The first heat spreader 110a can comprise at least one first surface configured to be in thermal communication with the TEDs 300. For example, at least one second surface of the first heat spreader 110a can comprise at least one heat dissipation structure (e.g., at least one fin) configured to transfer heat from the first heat spreader 110a to the ambient surroundings. For another example, the first heat spreader 110a can be configured to have a fluid coolant (e.g., liquid; air; refrigerant) flow therethrough. In certain embodiments, the second heat spreader 110b provides at least one cold side that receives heat from the component to be thermally conditioned and the first heat spreader 110a provides at least one hot side that serves as a heat sink which receives heat from the TEDs 300. In certain other embodiments, the first heat spreader 110a provides the at least one cold side and the second heat spreader 110b provides the at least one hot side.

In certain embodiments, the second heat spreader 110b (e.g., denoted by the dashed lines in FIGS. 2A and 2B) bounds a portion of a region between the first and second heat spreaders 110a,b, and the plurality of TEDs 300 is wholly within the region (e.g., as shown in FIGS. 2A and 2B). In certain embodiments, the assembly 100 further comprises at least one material (e.g., a sealing material; silicone; epoxy) extending along a perimeter of the region between the first and second heat spreaders 110a,b and sealing (e.g., water-tight; hermetically) the region from ambient environment.

In certain embodiments, the PCB 200 extends from within the region to outside the region (e.g., as shown in FIG. 2A), while in certain other such embodiments, the PCB 200 is wholly within the region (e.g., as shown in FIG. 2B). Certain embodiments in which the PCB 200 extends across the perimeter of the region (see, e.g., FIG. 2A) such that the electrical connections between the PCB 200 (e.g., wire tabs 212) and the wires 140 are located outside the region (e.g., the sealed region) advantageously allow these electrical connections to be modified (e.g., repaired; replaced) without affecting the seal of the region and/or without further adversely impacting (e.g., disassembling) the thermoelectric module assembly 100. Certain embodiments in which the PCB 200 is wholly within the region (e.g., as shown in FIG. 2B) such that the electrical connections between the PCB 200 (e.g., wire tabs 212) and the wires 140 are located within the region (e.g., the sealed region) advantageously allow these electrical connections to be protected from the ambient environment.

In certain embodiments, the assembly 100 further comprises an insulator plate (not shown) comprising a thermally insulating material (e.g., polymer, plastic, rubber, and/or fiberglass) configured to be at least partially compressed by the first heat spreader 110a and the second heat spreader 110b during fabrication and during operation of the thermoelectric module assembly 100 while keeping the first heat spreader 110a and the second heat spreader 110b from contacting one another. In certain embodiments, the insulator plate generally surrounds the TEDs 300 and the PCB 200, and comprises at least one hole (e.g., cut-out) configured to accommodate the TEDs 300 and the at least one PCB 200. For example, the at least one hole can be configured to hold the at least one thermoelectric sub-assembly 130 such that the TEDs 300 are in thermal communication with the first and second heat spreaders 110a,b while the at least one PCB 200 is thermally insulated from the first and second heat spreaders 110a,b. In certain embodiments, the insulator plate is configured to allow the PCB 200 to extend from the TEDs 300 within the region between the first and second heat spreaders 110a,b to outside this region, while in certain other embodiments, the insulator plate is configured to allow the wires 140 to extend from the PCB 200 within the region to outside the region (e.g., via a trench 160 as shown in FIG. 2B).

In certain embodiments, the assembly 100 further comprises a first thermally conductive material (e.g., copper layer, graphite foil, thermal grease, phase change material, gap filler) between and in thermal communication with the first heat spreader 110a and the first plates 330 of the TEDs 300 and/or a second thermally conductive material (e.g., copper layer, graphite foil, thermal grease, phase change material, gap filler; shown in FIG. 2B) between and in thermal communication with the second heat spreader 110b and the second plates 340 of the TEDs 300. In certain such embodiments, the holes of the insulator plate are configured to accommodate the first and second thermally conductive materials.

Figure 5C:
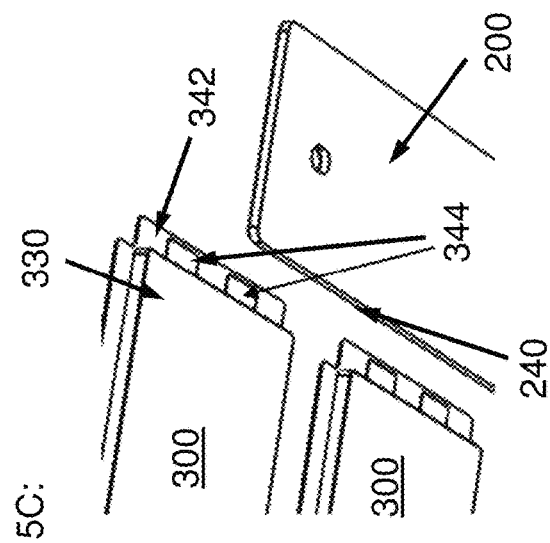
FIGS. 5A-5C schematically illustrate an exploded view of an example thermoelectric system in accordance with certain embodiments described herein.
Figure 5A:
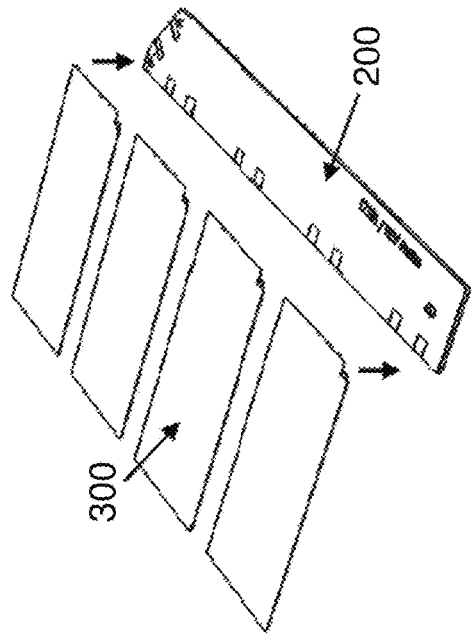
Figure 5B:
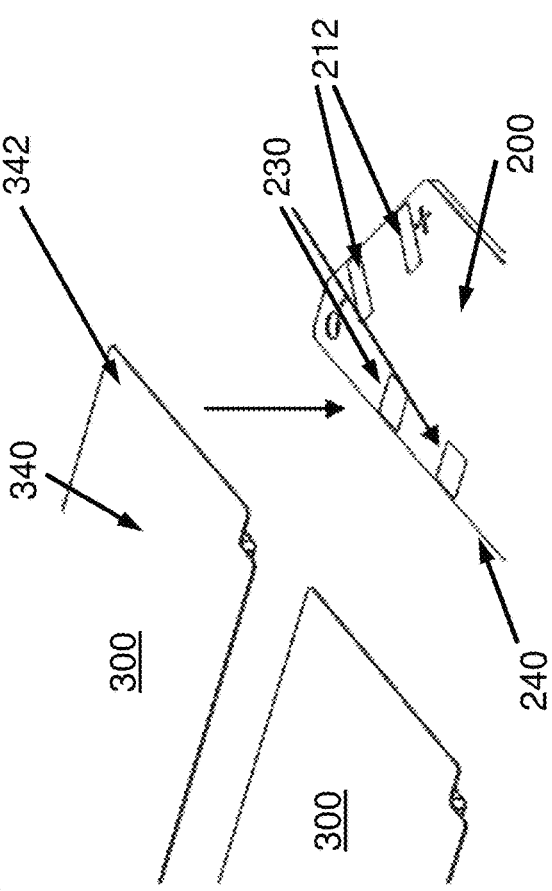

FIGS. 5A-5C schematically illustrate an exploded view of an example thermoelectric system in accordance with certain embodiments described herein. The thermoelectric system (e.g., a thermoelectric sub-assembly 130 as described herein with reference to FIGS. 2A-2B, 3A-3B, and 4A-4B) comprises a printed circuit board (PCB) 200 comprising a plurality of electrically conductive first tabs 230 at a surface of the PCB 200 and at least one thermoelectric device (TED) 300 mechanically coupled to the PCB 200. The at least one TED 300 comprises a thermally conductive first plate 330 and a thermally conductive second plate 340. The second plate 340 comprises a first portion 342 extending beyond a perimeter of the first plate 330 and over an edge 240 of the PCB 200 and over two first tabs 230 of the plurality of first tabs 230. The first portion 342 of the second plate 340 comprises two electrically conductive second tabs 344, each of the two second tabs 344 in mechanical and electrical communication with a corresponding first tab 230 of the two first tabs 230. The TED 300 further comprises a plurality of thermoelectric elements 350 in thermal communication with and in a region between the first plate 330 and the second plate 340.

Figure 6:
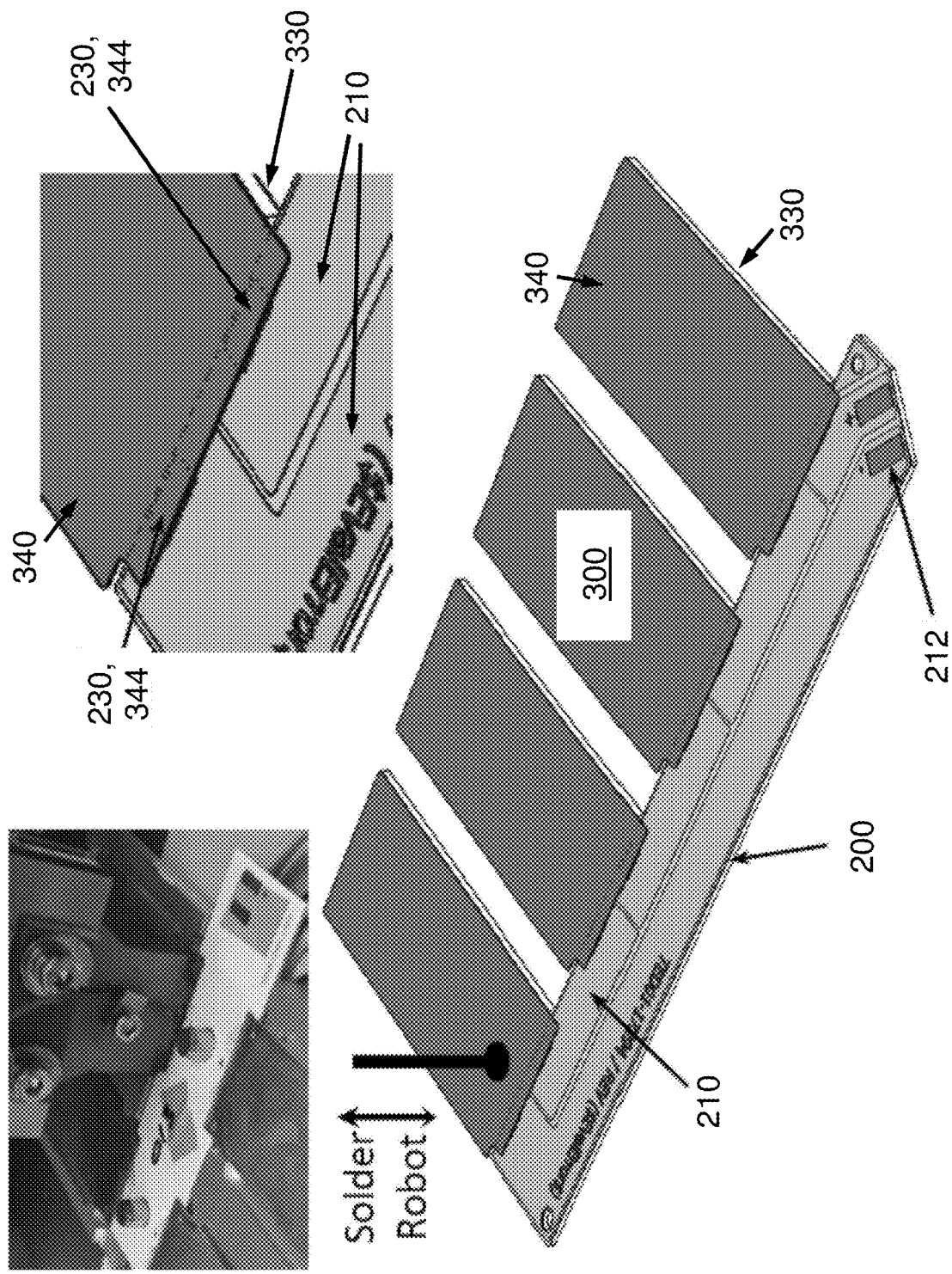
FIG. 6 schematically illustrates an example soldering configuration in accordance with certain embodiments described herein.

In certain embodiments, the first tabs 230 comprise portions of the electrically conductive conduits 210 of the PCB 200, and the second tabs 344 comprise portions of the electrically conductive layers of the planar laminate structure (e.g., printed circuit board) of the second plate 340 of the TED 300. In certain embodiments, the first tabs 230 and the second tabs 344 are configured to be soldered together. For example, the first tabs 230 and/or the second tabs 344 can comprise a solder material (e.g., solder with a hot air solder leveling (HASL) finish, solder preform, solder paste, solder flux, pre-flowed solder). FIG. 6 schematically illustrates an example soldering configuration in accordance with certain embodiments described herein. The top-left portion of FIG. 6 schematically illustrates an example mechanism (e.g., "solder robot") for fabricating an example thermoelectric system (e.g., a thermoelectric sub-assembly 130 as shown in FIGS. 2A and 3A), in which the PCB 200 is positioned and held fixed (e.g., by two protrusions of a mounting fixture extending through the PCB 200). The four TEDs 300 are positioned such that the second tabs 344 (e.g., solder tabs) of the second plates 340 are over and contacting the first tabs 230 (e.g., solder tabs) of the PCB 200. A heat source (e.g., "hot bar") of the mechanism is moved into position to press the corresponding first tabs 230 and second tabs 344 together while applying sufficient heat to allow flow of the solder of the first tabs 230 and the second tabs 344 and then removing the heat source, thereby affixing the second tabs 344 of the TED 300 to be in mechanical and electrical communication with the corresponding first tabs 230 of the PCB 200. In certain embodiments, the mechanism moves the heat source into position to repeat the soldering process for another TED 300. In certain embodiments, the mechanism can comprise multiple heat sources configured to solder multiple TEDs 300 to the PCB 200 simultaneously. In certain embodiments, a heated fixture is used to pre-warm the PCB 200 so that the solder reflow can be done with the heat source of the mechanism at a lower temperature, thereby facilitating soldering the second tabs 344 of the TEDs 300 to the first tabs 230 of the PCB 200.

The top-right portion of FIG. 6 schematically illustrates the first portion 342 of the second plate 340 of the TED 300 overlapping the edge 240 of the PCB 200 with the second tabs 344 of the TED 300 affixed to the first tabs 230 of the PCB 200. The PCB 200 comprises a plurality of electrical conduits 210 in electrical communication with the plurality of first tabs 230, with the plurality of electrical conduits 210 configured to provide electrical power to the at least one TED 300. For example, each of the two electrical conduits 210 shown in the top-right portion of FIG. 6 is in electrical communication with the TED 300 via the corresponding first tabs 230 and second tabs 344. The bottom portion of FIG. 6 schematically illustrates an example thermoelectric system (e.g., a thermoelectric sub-assembly 130 as shown in FIGS. 2B and 3B) with the four TEDs 300 affixed to the surface of the PCB 200. In certain embodiments, the first plate 330 of the at least one TED 300 does not extend over the surface of the PCB 200.

Figure 7A:
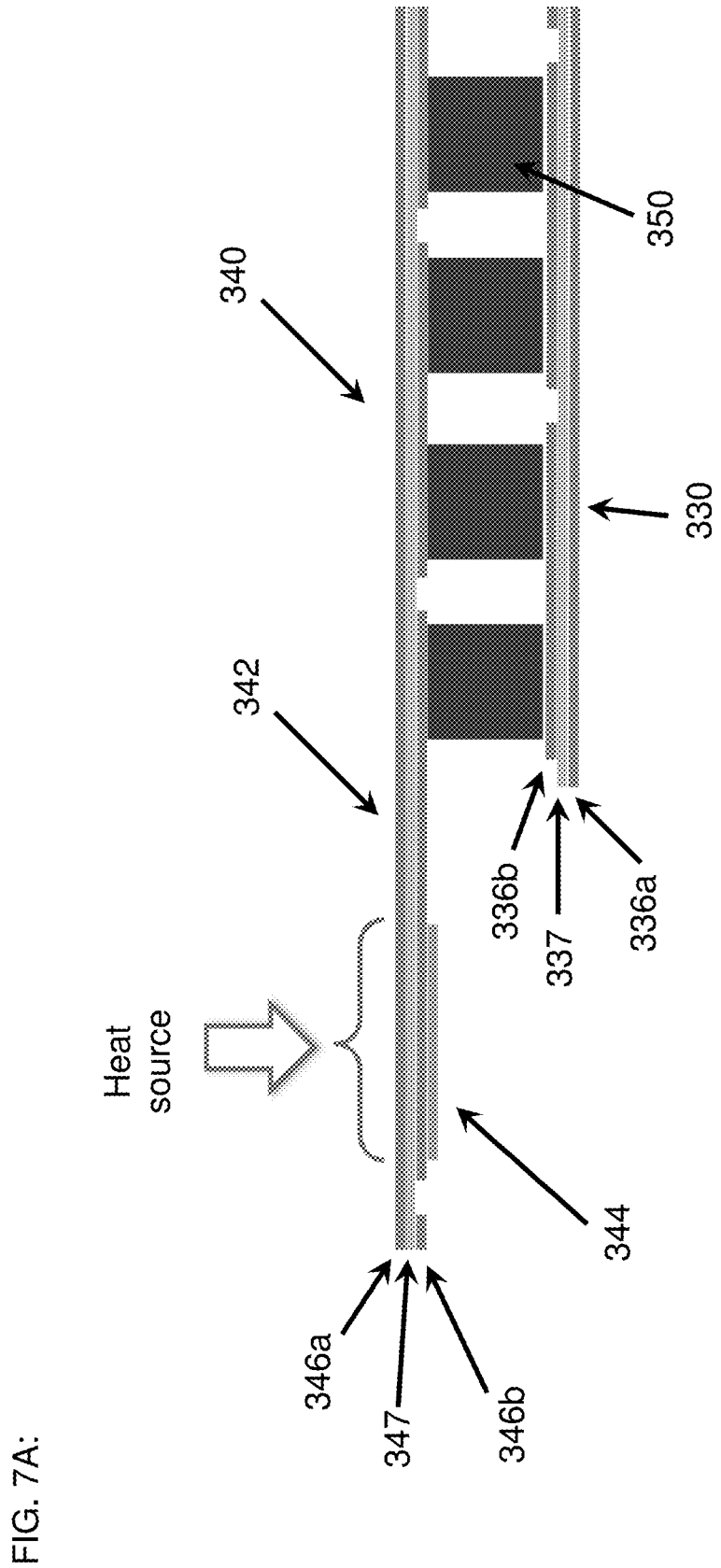
FIG. 7A schematically illustrates a cross-sectional view of an example TED in accordance with certain embodiments described herein.

FIG. 7A schematically illustrates a cross-sectional view of an example TED 300 in accordance with certain embodiments described herein. The first plate 330 of the TED 300 comprises first and second electrically and thermally conductive (e.g., copper) layers 336a,b laminated together with an electrically insulating (e.g., epoxy) layer 337 between the first and second layers 336a,b, and the second plate 340 of the TED 330 comprises first and second electrically conductive and thermally conductive (e.g., copper) layers 346a,b laminated together with an electrically insulating (e.g., epoxy) layer 347 between the first and second layers 346a,b. The second plate 340 further comprises second tabs 344 on the first portion 342 of the second plate 340. As shown in FIG. 7A, during the soldering process, the heat source (e.g., "hot bar") can be positioned to apply heat to the first layer 346a on the first portion 342 of the second plate 340 while pressing the second tabs 344 to the corresponding first tabs 230 of the PCB 200 (not shown in FIG. 7A) such that the first tabs 230 and the second tabs 344 are soldered together. However, in certain embodiments, as the heat source is pressed against the first layer 346a on the first portion 342 of the second plate 340 to reflow the solder on the second tabs 344, which are on the opposite face of the first portion 342 (e.g., on the second layer 346b), heat is lost via heat conduction by the first layer 346a of the second plate 340. FIGS. 7B and 7C illustrate this heat conduction by arrows extending from the first portion 342 of the second plate 340 along the second plate 340.

Figure 7D:
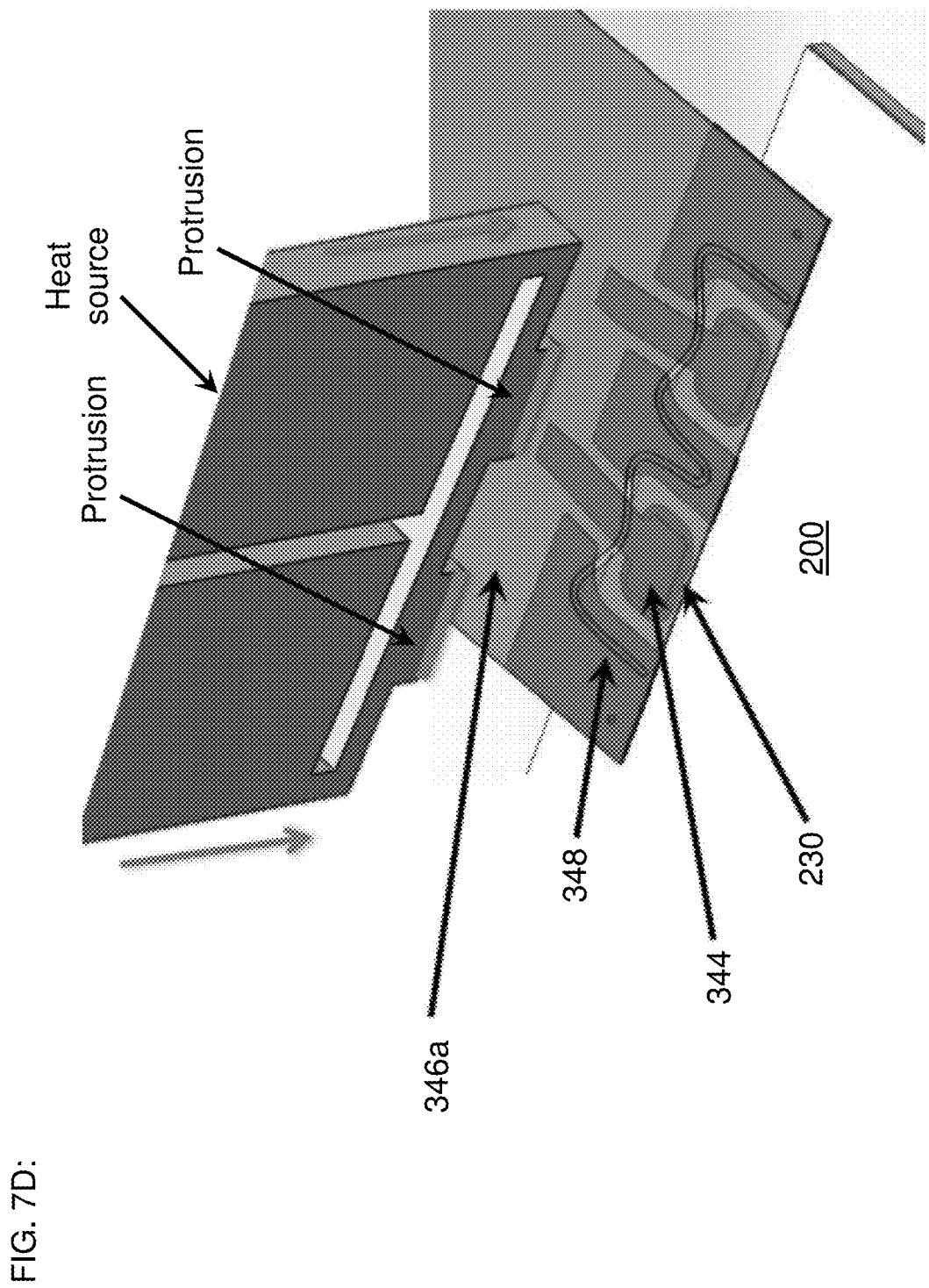
FIGS. 7D-7F schematically illustrate an example electrically and thermally conductive first layer of the second plate in accordance with certain embodiments described herein.
Figure 7E:
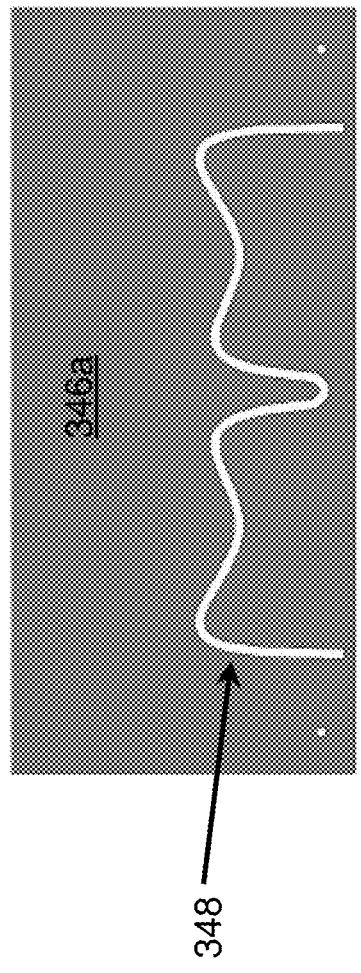
Figure 7F:
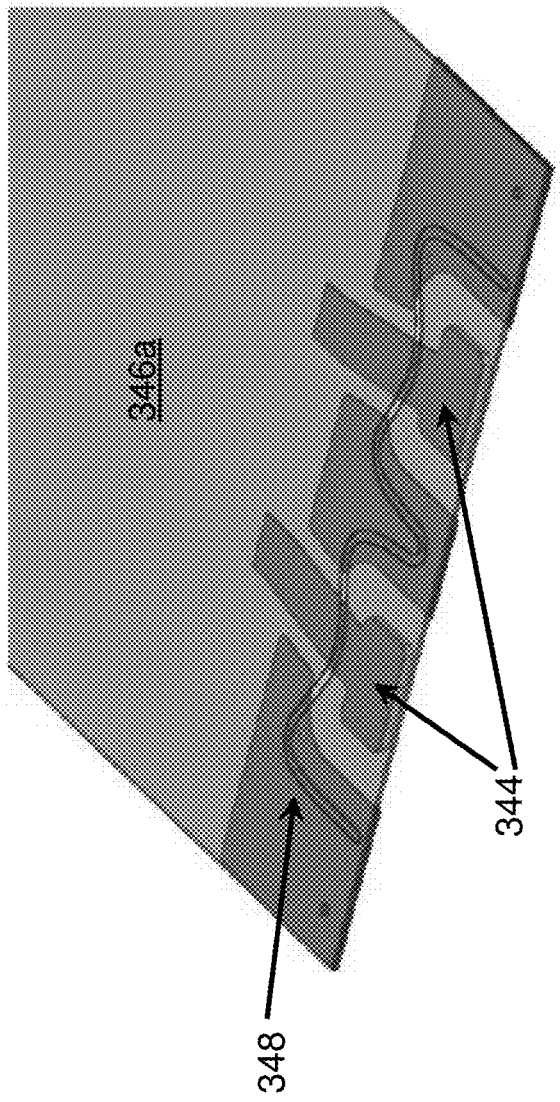

FIGS. 7D-7F schematically illustrate an example electrically and thermally conductive first layer 346a of the second plate 340 in accordance with certain embodiments described herein. As schematically illustrated by FIG. 7D, the heat source of certain embodiments comprises a pair of protrusions configured to be pressed against corresponding portions of a first region of the first layer 346a above the second tabs 344 of the second plate 340. The first layer 346a comprises an etched region 348 (e.g., an etched line) extending at least partially across the first portion 342 of the second plate 340. The etched region 348 is configured to be positioned between the first region of the first layer 346a against which the heat source is pressed (e.g., a region above the second tabs 344) and a second region of the first layer 346a extending away from the first region. The etched region 348 is configured to thermally insulate the second region of the first layer 346a from the first region of the first layer 346a (e.g., to reduce or prevent heat loss from the first region of the first layer 346a via heat conduction by the first layer 346a). For example, during the soldering process, the pair of protrusions of the heat source are pressed against the first region of the first layer 346a and heat up the solder material (e.g., solder with a hot air solder leveling (HASL) finish, solder preform, solder paste, solder flux, pre-flowed solder) of the second tabs 344 on the second layer 346b underneath the first region of the first layer 346a.

FIG. 7E schematically illustrates a top view of the first layer 346a and the etched region 348 in accordance with certain embodiments described herein and FIG. 7F schematically illustrates a perspective view of the first layer 346a and the etched region 348, with the first layer 346a and the electrically insulating layer 347 shown as being transparent so that the underlying second tabs 344 can be seen. As schematically illustrated by FIGS. 7E and 7F, the etched region 348 can at least partially bound two "tooth-shaped" areas of the first region of the first layer 346a, each above a corresponding second tab 344. Other shapes of the etched region 348 (e.g., linear; rectilinear; curved; serpentine) and the first region of the first layer 346a are also compatible with certain embodiments described herein. The width of the etched region 348 between the first and second regions of the first layer 346a is configured to provide sufficient thermal insulation to reduce (e.g., prevent) heat loss via heat conduction from the first region to the second region.

FIGS. 8A-8D schematically illustrate an example thermoelectric system in accordance with certain embodiments described herein. FIGS. 9A-9D schematically illustrate another example thermoelectric system in accordance with certain embodiments described herein. In certain embodiments (see, e.g., FIGS. 8A-8B and 9A-9B), the system comprises a gap 400 between the edge 240 of the PCB 200 and a first edge 370 of the at least one TED 300 and further comprises a compound 410 within the gap 400 and mechanically coupled to the edge 240 of the PCB 200 and the first edge 370 of the at least one TED 300. In certain embodiments, the gap 400 has a width (e.g., distance between the edge 240 of the PCB 200 and the first edge 370 of the TED 300) in a range of 0.3 mm to 2 mm or in a range of 0.3 mm to 1 mm (e.g., about 0.8 mm).

The compound 410 (e.g., sealing compound; epoxy) is configured to strengthen a mechanical coupling of the PCB 200 with the at least one TED 300 and to at least partially seal the two first tabs 230 and the two second tabs 344 that are in mechanical and electrical communication with the two first tabs 230. For example, the compound 410 can be inserted as a gel or liquid into the gap 400 after the TED 300 has been mounted to the PCB 200 (e.g., after the second tabs 344 of the TED 300 have been soldered to the corresponding first tabs 230 of the PCB 200), and the compound 410 can harden and affix to the first edge 370 of the TED 300 and to the edge 240 of the PCB 200 to form a rigid mechanical coupling between the TED 300 and the PCB 200. In certain embodiments (see, e.g., FIGS. 8B and 9B), the PCB 200 has a first thickness $T_1$ and the at least one TED 300 has a second thickness $T_2$ larger than the first thickness $T_1$. In certain embodiments, the compound 410 has a third thickness $T_3$ within the gap 400 that is smaller than the second thickness $T_2$ of the TED 300, and in certain such embodiments, the third thickness $T_3$ is smaller than the first thickness $T_1$ of the PCB 200 (see, e.g., FIGS. 8B and 9B). By having the third thickness $T_3$ of the compound 410 less than the second thickness $T_2$ of the TED 300, certain embodiments advantageously avoid the compound 410 from contacting the top surface of the first plate 330 and potentially interfering with the thermal communication between the top surface of the first plate 330 and the heat spreader 110 that is in thermal communication with the top surface of the first plate 330 (e.g., either the first heat spreader 110a or the second heat spreader 110b).

Figure 8A:
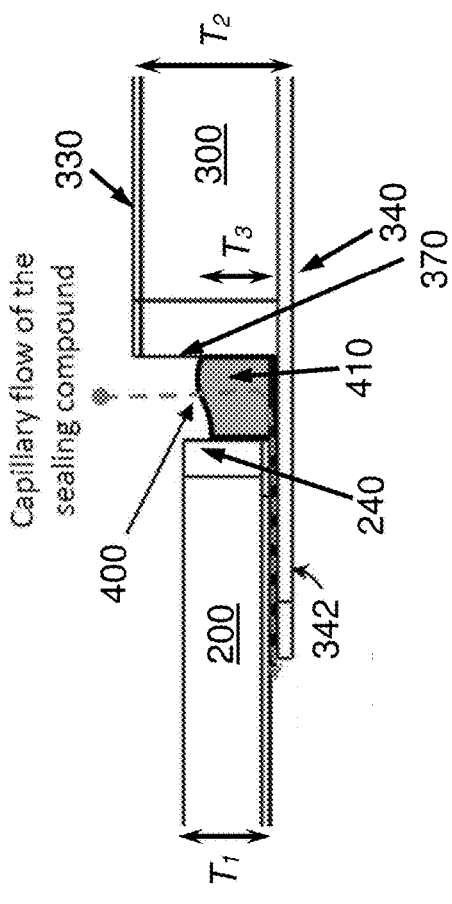
FIGS. 8A-8D schematically illustrate an example thermoelectric system in accordance with certain embodiments described herein.
Figure 8B:
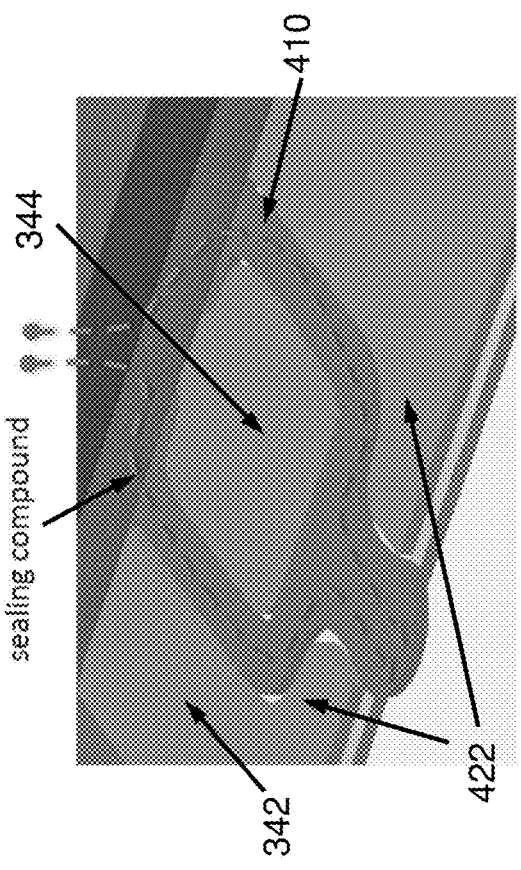
Figure 8C:
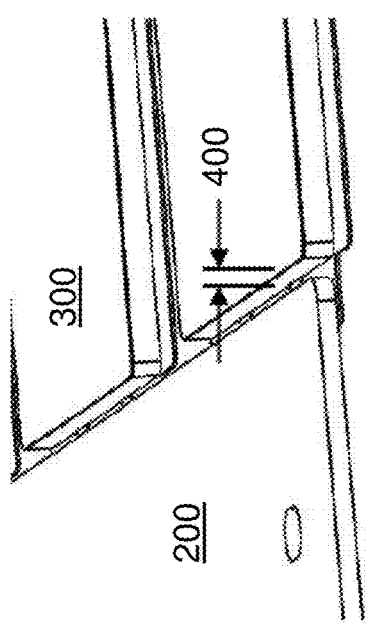
Figure 8D:
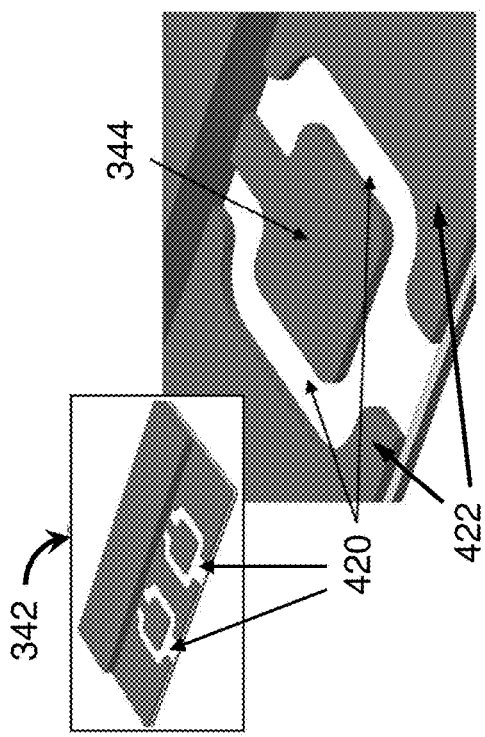

In certain embodiments, as schematically illustrated by FIGS. 8B-8D, at least one of the PCB 200 and the first portion 342 of the second plate 340 comprises at least two trenches 420 configured to facilitate capillary flow of the compound 410 from the gap 400 to an area between the first portion 342 of the second plate 340 and the surface of the PCB 200. For example, as schematically illustrated by FIG. 8C, the first portion 342 of the second plate 340 can comprise a copper layer and the trenches 420 can comprise recesses which have been etched into the copper layer and which extend along a copper trace (e.g., having a width in a range of 2 mm to 3 mm) of the second tab 344. For example, the trenches 420 can be etched during the same etching process that is used to create the copper traces and the first tabs 230 of the PCB 200 and/or the copper traces and the second tabs 344 of the second plate 340. The trenches 420 can have a width (e.g., along a direction generally parallel to the first edge 370 of the TED 300) in a range of 0.5 mm to 1.5 mm (e.g., about 0.75 mm) with the second tabs 344 having a length (e.g., along a direction generally perpendicular to the first edge 370 of the TED 300) in a range of 2 mm to 5 mm (e.g., about 3 mm) and a width (e.g., along a direction generally parallel to the first edge 370 of the TED 300) in a range of 2 mm to 5 mm (e.g., about 3 mm). As schematically illustrated by FIG. 8D, the trenches 420 extend at least partially around the second tabs 344 and can be configured for capillary flow of the compound 410 through the trenches 420 (e.g., as shown by the dashed arrows of FIGS. 8B and 8D). In certain such embodiments, the compound 410 in the gap 400 and in the trenches 420 forms a seal (e.g., a hermetic seal) between the first and second tabs 230, 344 and the ambient environment.

Alternatively or in addition to the trenches 420 of the first portion 342 of the second plate 340 of the TED 300, the PCB 200 can comprise trenches at least partially around the first tabs 230 and configured to facilitate capillary flow of the compound 410 through the trenches. As schematically illustrated by FIGS. 8C and 8D, the trenches and the tabs (e.g., trenches 420 and second tabs 344) can have rounded corners (e.g., to facilitate the capillary flow of the compound 410 through the trenches). In certain embodiments, as schematically illustrated by FIG. 8D, the two trenches 420 can meet at an edge of the first portion 342 of the second plate 340, providing a port through which an excess portion of the compound 410 can flow out from between the PCB 200 and the first portion 342 of the second plate 340.

In certain embodiments, upon hardening, the compound 410 within the trenches 420 provides further strengthening of the mechanical coupling of the PCB 200 with the TED 300 and provide further sealing of the first and second tabs 230, 344. The trenches 420 can have a depth in a range of less than 200 microns or less than 100 microns (e.g., about 70 microns), which can correspond to the thickness of the copper layer which has been etched away to form the trenches 420. In certain embodiments, the remaining portions 422 of the copper layer on either side of the second tab 344, which remain after the etching of the trenches 420, advantageously provide further rigidity to the first portion 342 of the second plate 340.

Figure 9B:
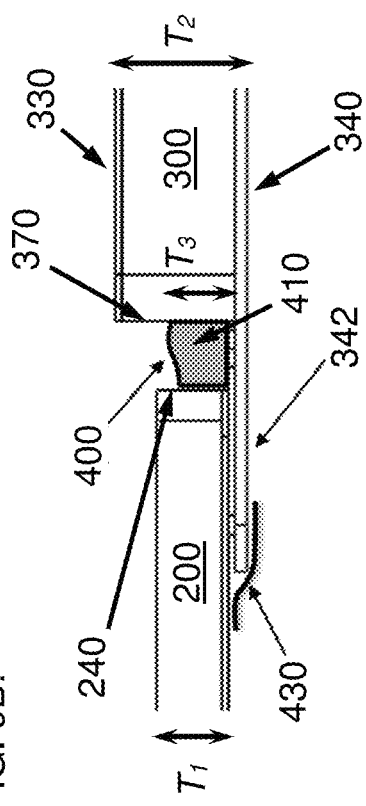
FIGS. 9A-9D schematically illustrate another example thermoelectric system in accordance with certain embodiments described herein.
Figure 9A:
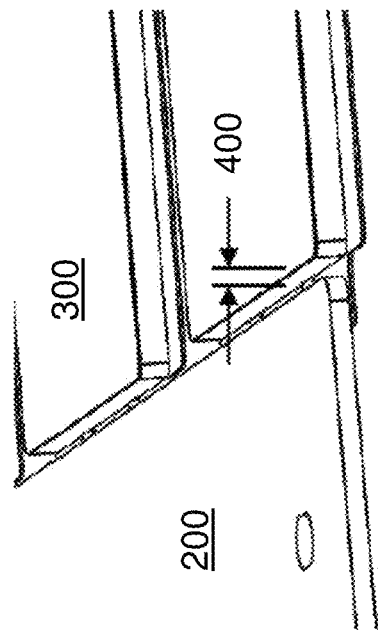
Figure 9D:
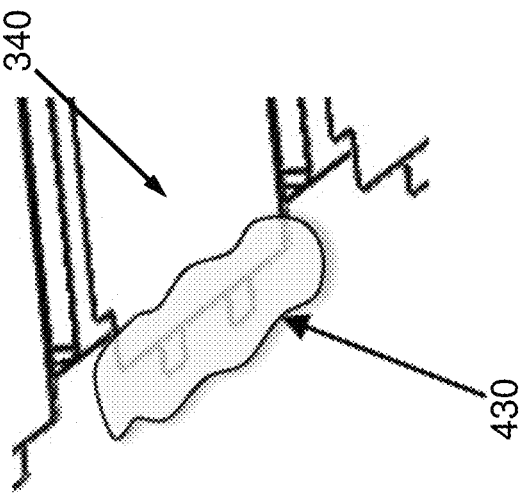
Figure 9C:
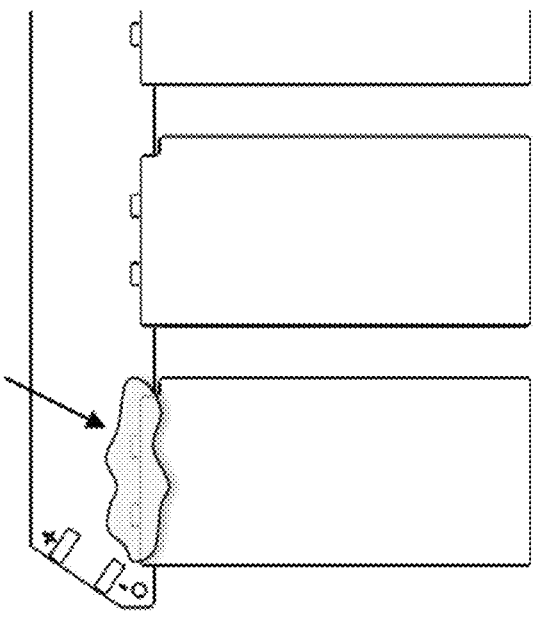

In certain embodiments, as schematically illustrated by FIGS. 9B-9D, a coating 430 extends over the first surface of the PCB 200 and the first portion 342 of the second plate 340 of the at least one TED 300. The coating 430 is configured to strengthen a mechanical coupling of the PCB 200 with the at least one TED 300 and to at least partially seal the two first tabs 230 and the two second tabs 344 that are in mechanical and electrical communication with the two first tabs 230. The coating 430 (e.g., encapsulating coating; conformal coating; epoxy; silicone) can encapsulate and/or be conformal with the first portion 344 of the second plate 340 and the surface of the PCB 200, as schematically illustrated by FIGS. 9B-9D. In certain embodiments, the combination of the compound 410 in the gap 400 and the coating 430 over the first portion 344 of the second plate 340 and the surface of the PCB 200 form a seal (e.g., a hermetic seal) between the first and second tabs 230, 344 and the ambient environment. In certain such embodiments, the coating 430 is sufficiently thick to form the seal while being positioned and/or being sufficiently thin so as to not adversely interfere with the thermal communication between the bottom surface of the second plate 340 and the second heat spreader 110b. In certain embodiments, the coating 430 is configured to further strengthen the mechanical coupling of the PCB 200 with the TED 300.

Figure 10C:
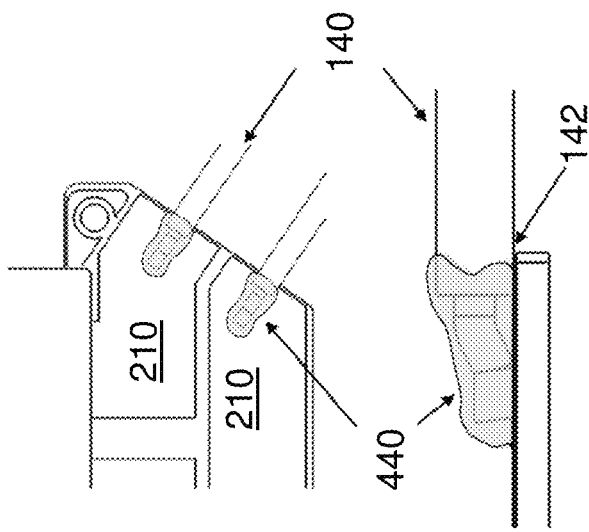
FIGS. 10A-10C schematically illustrate an example thermoelectric system comprising wire encapsulation in accordance with certain embodiments described herein.
Figure 10A:
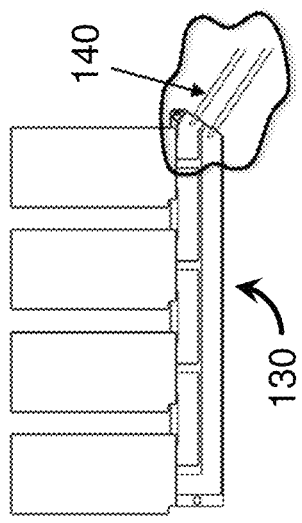
Figure 10B:
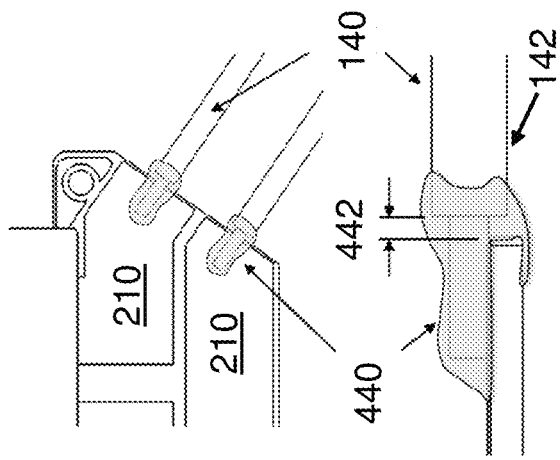

FIGS. 10A-10C schematically illustrate an example thermoelectric system comprising wire encapsulation in accordance with certain embodiments described herein. As shown in FIGS. 10A-10C, the system comprises two electrically conductive wires 140, each wire 140 having an end in electrical communication with a corresponding first tab 230 of the plurality of first tabs 230 (e.g., wire tabs 212), and the wires 140 are configured to provide electrical power to the PCB 200. In certain embodiments, instead of wires 140, the PCB 200 can have a connector coupled (e.g., soldered; staked) to the PCB 200. The system shown in FIGS. 10A-10C further comprises a coating 440 (e.g., encapsulating coating; epoxy) covering the ends of the two wires 140. The coating 440 is configured to strengthen a mechanical coupling of the two wires 140 with the PCB 200 and to seal the ends of the two wires 140 (e.g., to hermetically seal the ends of the two wires 140 from the ambient environment). As shown in FIGS. 10B and 10C, the end of the wire 140 can comprise a portion of the electrically conductive wire 140 that is exposed (e.g., has the electrical insulation sheath 142 removed) and is in electrical communication with (e.g., soldered to) a corresponding electrical conduit 210 of the PCB 200 (e.g., wire tabs 212). In FIG. 10B, the exposed portion of the wire 140 is substantially straight, the wire 140 is positioned such that the sheath 142 is spaced from an edge of the PCB 200 by a gap 442, and the encapsulating coating 440 covers the exposed portion of the wire 140, a portion of the PCB 200 surrounding the exposed portion of the wire 140, and extends across the gap 442 to cover a portion of the sheath 142. In FIG. 10C, the exposed portion of the wire 140 is bent, the wire 140 is positioned such that the sheath 142 overlaps the edge of the PCB 200, and the encapsulating coating 440 covers the exposed portion of the wire 140, a portion of the sheath 142, and a portion of the PCB 200 surrounding the exposed portion of the wire 140 and the portion of the sheath 142.

Figure 11C:
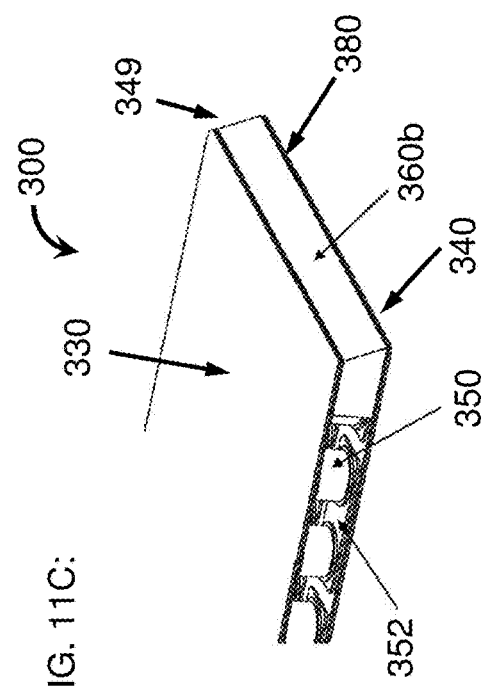
FIGS. 11A-11C schematically illustrate an example TED in accordance with certain embodiments described herein.
Figure 11A:
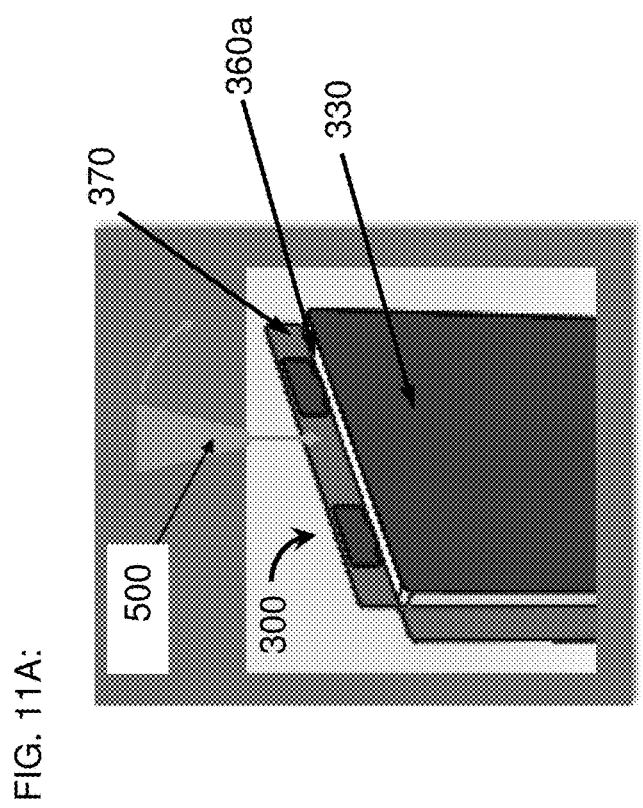
Figure 11B:
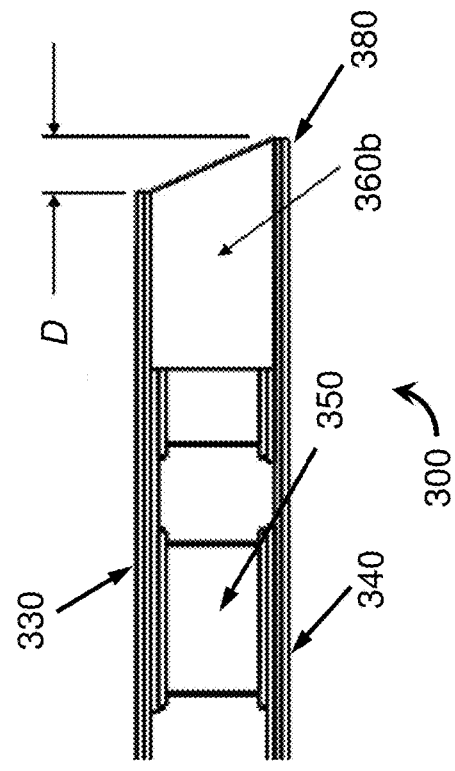

FIGS. 11A-11C schematically illustrate an example TED 300 in accordance with certain embodiments described herein. The second plate 340 of the example TED 300 of FIGS. 11A-11C comprises a second portion 349 extending beyond the perimeter of the first plate 330, the second portion 349 (also shown as distance D in FIG. 11B) along a second edge 380 of the TED 300, the second edge 380 opposite to the first edge 370 of the TED 300. The TED 300 further comprises a sealant 360a (e.g., epoxy; silicone) between the first plate 330 and the second plate 340 along the first edge 370 of the TED 300 and a sealant 360b along the second edge 380 of the TED 300. In FIG. 11A, a dispensing system comprising a dispensing needle 500 (e.g., either positioned substantially perpendicular to the first edge 370 or at another non-zero angle relative to the first edge 370) is used to deposit the sealant 360a between the first plate 330 and the second plate 340 along the first edge 370 of the TED 300. One or both of the dispensing needle 500 and the TED 300 can be moved relative to the other to deposit the sealant 360a,b between the first plate 330 and the second plate 340 along other edges of the TED 300. In certain other embodiments, the dispensing system can use other dispensing methods, including but not limited to, jetting (e.g., analogous to ink jet printing). As schematically illustrated by FIGS. 11B and 11C, along the second edge 380 of the TED 300 opposite to the first edge 370 of the TED 300, the second plate 340 extends (e.g., overhangs) the perimeter of the first plate 330 (e.g., by a distance D in a range less than 1 mm or in a range of 0.2 mm to 1 mm; by about 0.5 mm), thereby providing a portion 349 of the second plate 340 that can advantageously facilitate dispensing of the sealant 360b along the second edge 380 of the TED 300. In certain embodiments, the sealant 360a deposited along the first edge 370 of the TED 300 is the same as the sealant 360b deposited along the second edge 380 of the TED 300, while in certain other embodiments, the sealant 360a deposited along the first edge 370 is different from the sealant 360b deposited along the second edge 380. In certain embodiments, the sealant 360b is also applied along the other two sides of the TED 300 (e.g., the two longer sides of the TED 300).

Figure 12A:
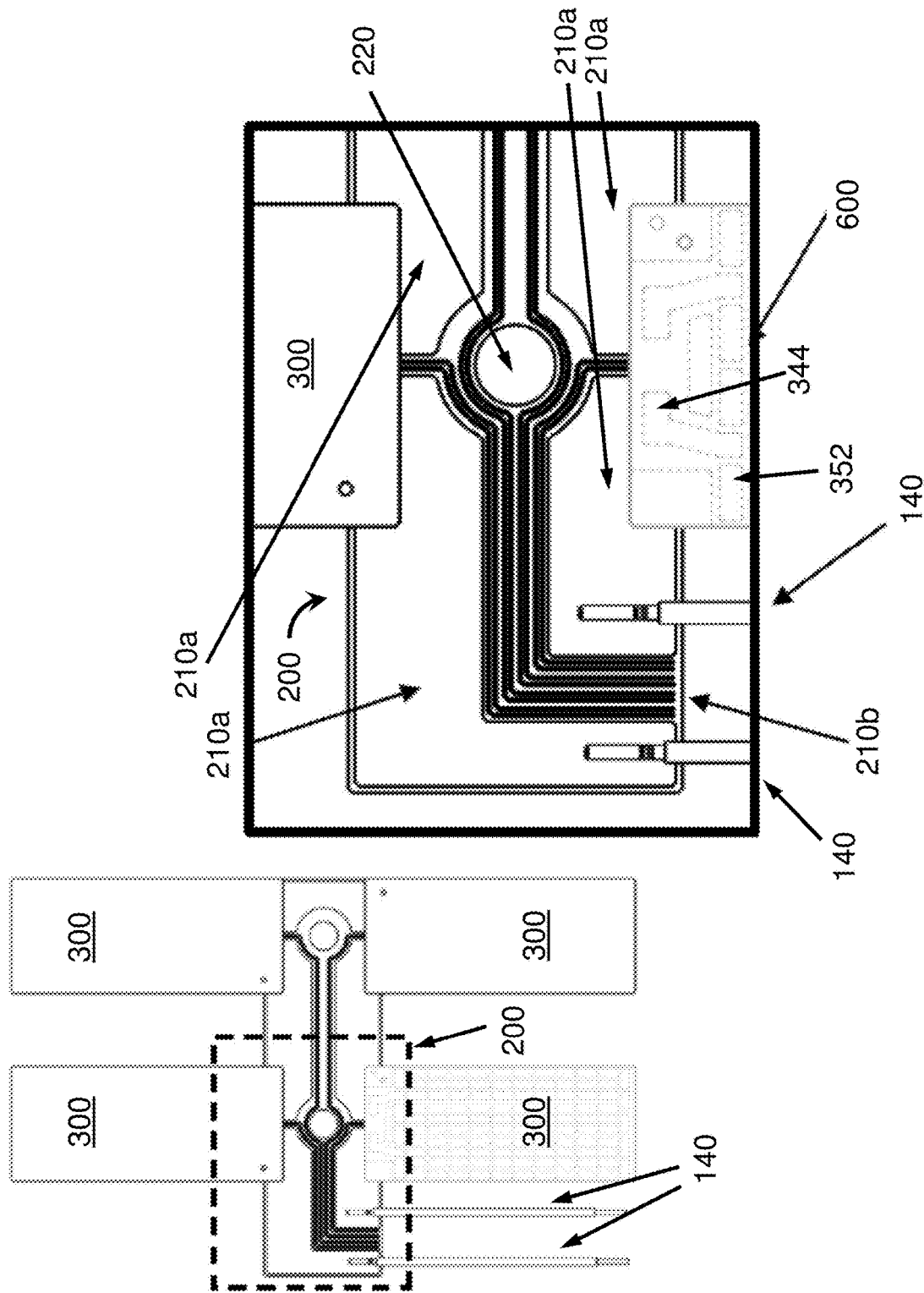
FIGS. 12A and 12B schematically illustrate an example thermoelectric system comprising electrical conduits in accordance with certain embodiments described herein.
Figure 12B:
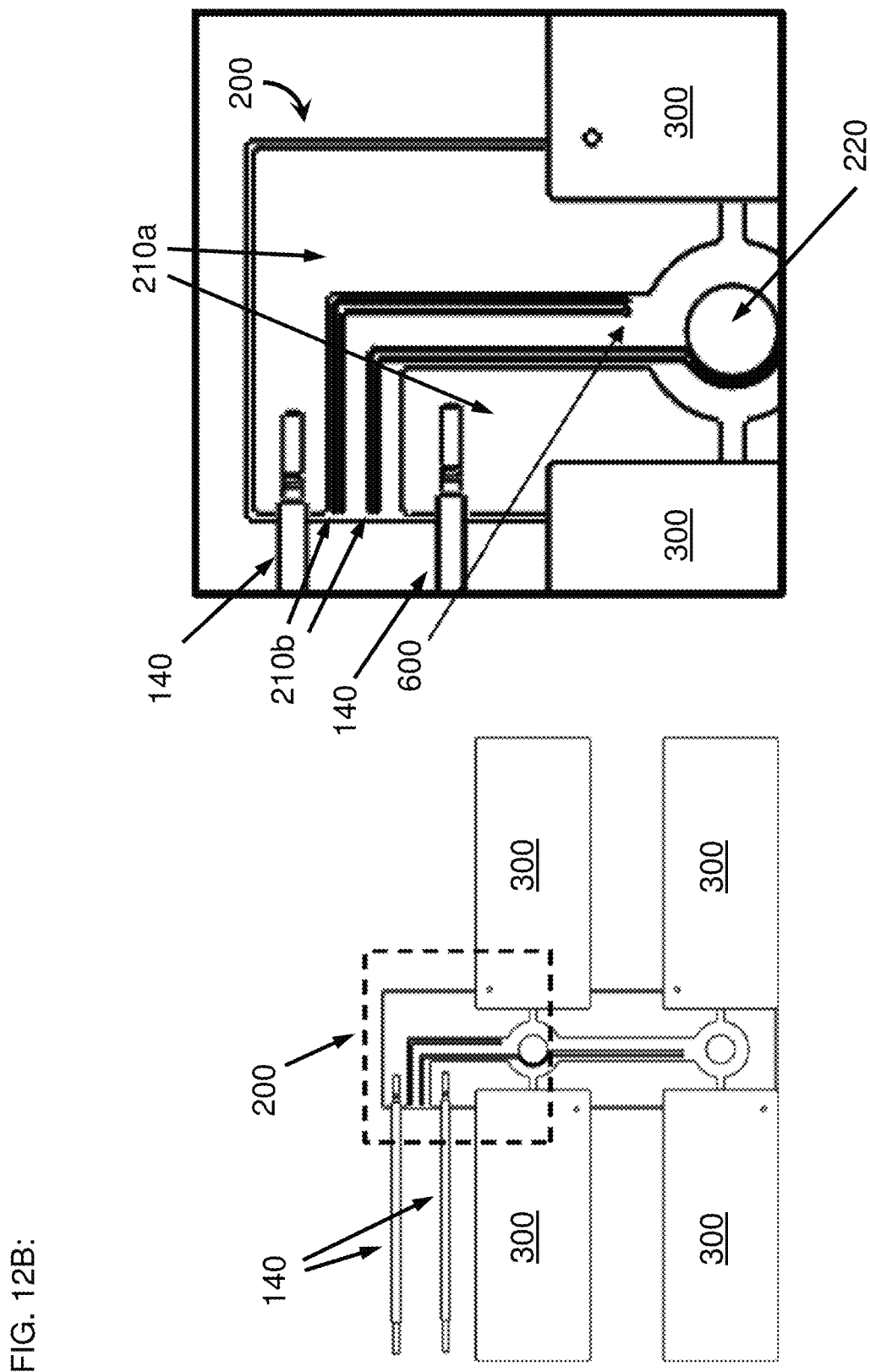

FIGS. 12A and 12B schematically illustrate an example thermoelectric system comprising electrical conduits 210a,b in accordance with certain embodiments described herein. The example thermoelectric system (e.g., a thermoelectric sub-assembly 130 as described herein with reference to FIGS. 2A-2B, 3A-3B, and 4A-4B) comprises a plurality of TEDs 300, each TED 300 of the plurality of TEDs 300 comprising a thermally conductive first plate 330, a thermally conductive second plate 340, and a plurality of TE elements 350 in thermal communication with and in a region between the first plate 330 and the second plate 340. The example thermoelectric system further comprises a PCB 200 comprising a plurality of first electrical conduits 210a and a plurality of second electrical conduits 210b. The first electrical conduits 210a are in electrical communication with the TE elements 350 of the plurality of TEDs 300 (e.g., and are configured to provide electrical power to the TE elements 350 of the plurality of TEDs 300). The second electrical conduits 210b are in electrical communication with at least one thermal sensor 600 (e.g., thermocouple; thermistor; negative-temperature-coefficient thermistor) on at least one TED 300 of the plurality of TEDs 300 and/or on the PCB 200. By providing a PCB 200 which integrates the first electrical conduits 210a configured to transmit power to the TE elements 350 and the second electrical conduits 210b configured to transmit signals from the thermal sensors 600, certain such embodiments advantageously simplify the wiring for the thermoelectric module assembly 100.

In the example system shown in FIG. 12A, the second electrical conduits 210b comprise four pairs of electrical conduits 210b, each pair in electrical communication with a corresponding thermal sensor 600 on a corresponding one of the four TEDs 300. The dashed lines of one of the TEDs 300 in FIG. 12A show the second tabs 344 on the first portion 342 of the second plate 340 and the shunts 352 on the second plate 340 in the region between the first plate 330 and the second plate 340. In certain embodiments, each of the second electrical conduits 210b comprises a solder tab (not shown in FIG. 12A) at an end located at the edge of the PCB 200 beneath the first portion 342 of the second plate 340 of the TED 300, the solder tabs configured to be soldered to corresponding solder tabs (not shown in FIG. 12A) of the second plate 340 of the TED 300. The other end of each second electrical conduit 210b can comprise an electrical connector (e.g., solder tab; not shown in FIG. 12A) that can be configured to be soldered to a corresponding wire or can be configured to mate with an electrical connector.

In the example system shown in FIG. 12B, the second electrical conduits 210b comprise two pairs of electrical conduits 210b, each pair in electrical communication with a corresponding thermal sensor 600 on the PCB 200. In certain embodiments, each of the second electrical conduits 210b comprises an electrical connection (e.g., solder tab; not shown in FIG. 12B) at an end located at the edge of the PCB 200. The electrical connection can be configured to be soldered to a corresponding wire or can be configured to mate with an electrical connector.

As schematically illustrated by FIGS. 12A and 12B, in certain embodiments, the second electrical conduits 210b extend between the first electrical conduits 210a. For example, a first set of the first electrical conduits 210a can extend along a first edge of the PCB 200 and a second set of the first electrical conduits 210a extend along a second edge of the PCB 200, the second edge opposite to the first edge, and at least some of the second electrical conduits 210b can extend between the first set of the first electrical conduits 210a and the second set of the first electrical conduits 210a (e.g., with portions of the second electrical conduits 210b parallel and adjacent to one another without the first electrical conduits 210a therebetween). In certain embodiments, the PCB 200 comprises at least one hole 220 extending through the PCB 200 (e.g., configured to mate with a corresponding protrusion of a mounting fixture and/or the thermoelectric module assembly 100), and the second electrical conduits 210b comprise curved portions that extend at least partially around the at least one hole 220.

Figure 13:
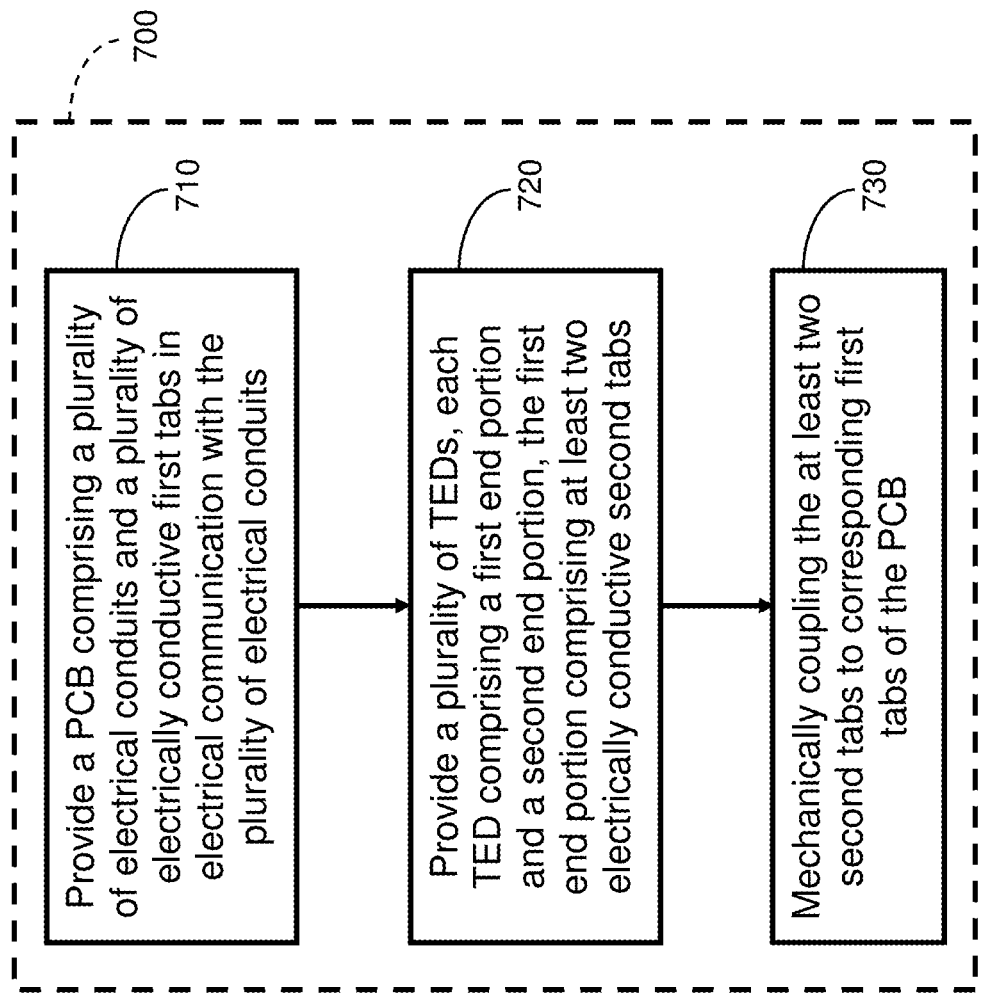
FIG. 13 is a flow diagram of an example method of fabricating at least one thermoelectric sub-assembly in accordance with certain embodiments described herein.

FIG. 13 is a flow diagram of an example method 700 of fabricating at least one thermoelectric sub-assembly 130 comprising a printed circuit board 200 and a plurality of thermoelectric devices 300 in accordance with certain embodiments described herein. In an operational block 710, the method 700 comprises providing the printed circuit board 200. The printed circuit board 200 comprises a plurality of electrical conduits 210 and a plurality of electrically conductive first tabs 230 in electrical communication with the plurality of electrical conduits 210. In an operational block 720, the method 700 further comprises providing the plurality of thermoelectric devices 300. Each thermoelectric device 300 comprises a first end portion 310 and a second end portion 320. The second end portion 320 is opposite to the first end portion 310, and the first end portion 310 comprises at least two electrically conductive second tabs 344. In an operational block 730, the method 700 further comprises mechanically coupling the at least two second tabs 344 of each thermoelectric device 300 of the plurality of thermoelectric devices 300 to corresponding first tabs 230 of the printed circuit board 200 such that the at least two second tabs 344 are in electrical communication with the corresponding first tabs 230 and the second end portion 320 is spaced from the printed circuit board 200.

Figure 14:
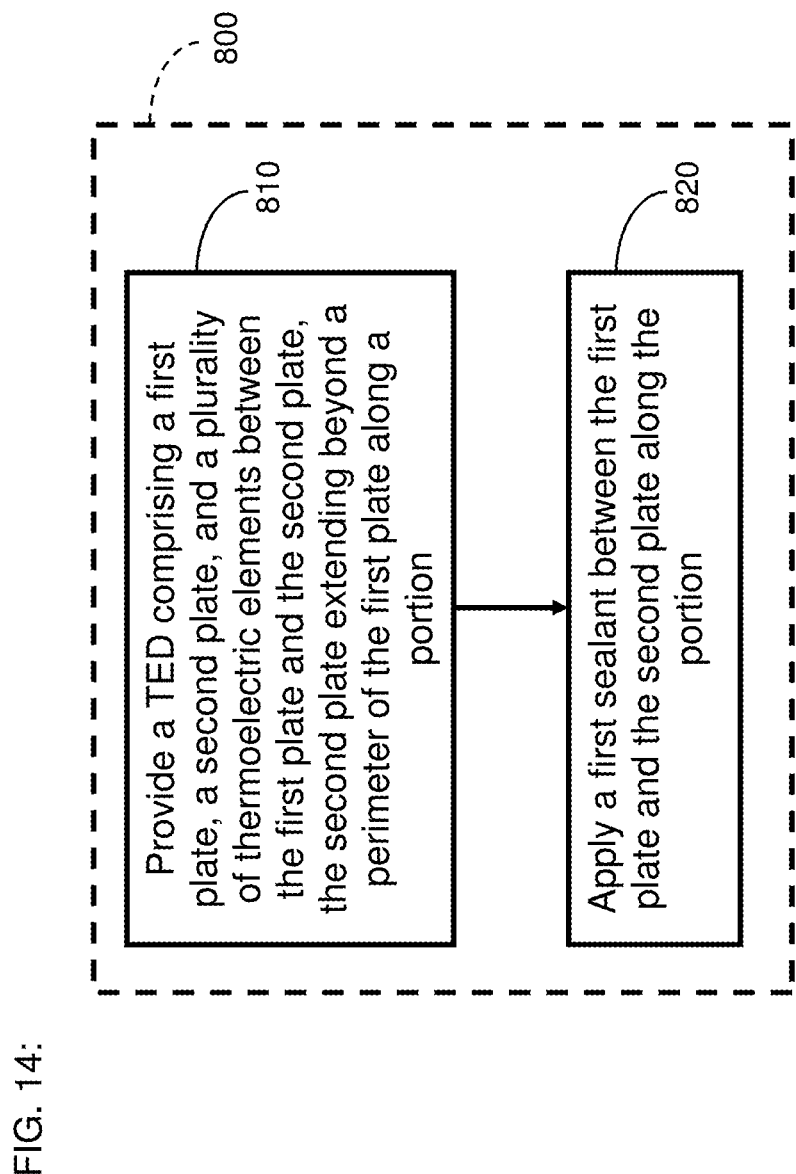
FIG. 14 is a flow diagram of an example method of fabricating a thermoelectric device in accordance with certain embodiments described herein.

FIG. 14 is a flow diagram of an example method 800 of fabricating a thermoelectric device 300 comprising a first plate 330, a second plate 340, and a plurality of thermoelectric elements 350 between and in electrical communication between the first plate 330 and the second plate 340 in accordance with certain embodiments described herein. The method 800 comprises providing the thermoelectric device 300. The second plate 340 extends beyond a perimeter of the first plate 330 along a portion 349 (e.g., a second edge 380) of the thermoelectric device 300. In an operational block 820, the method 800 further comprises applying a first sealant 360a between the first plate 330 and the second plate 340 along the portion 349.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures. Various features and aspects of the disclosed embodiments can be combined with or substituted for one another. Any methods disclosed herein need not be performed in the order recited.

The ranges disclosed herein also encompass any and all overlap, sub-ranges, and combinations thereof. Language such as "up to," "at least," "greater than," "less than," "between," and the like includes the number recited. With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity. In general, terms used herein are generally intended as "open" terms (e.g., the term "including" should be interpreted as "including but not limited to," the term "having" should be interpreted as "having at least," the term "includes" should be interpreted as "includes but is not limited to," etc.). If a specific number is intended, such an intent will be explicitly recited in the embodiment, and in the absence of such recitation, no such intent is present.

Various embodiments have been described above. Although the inventions have been described with reference to these specific embodiments, the descriptions are intended to be illustrative and are not intended to be limiting. Various modifications and applications may occur to those skilled in the art without departing from the spirit and scope of the inventions as defined in the appended claims.

What is claimed is:

1. A thermoelectric system comprising:
    a printed circuit board comprising a plurality of electrically conductive first tabs at a surface of the printed circuit board; and
    at least one thermoelectric device mechanically coupled to the printed circuit board, the at least one thermoelectric device comprising:
        a thermally conductive first plate;
        a thermally conductive second plate comprising a first portion extending beyond a perimeter of the first plate and over an edge of the printed circuit board and over two first tabs of the plurality of first tabs, the first portion comprising two electrically conductive second tabs, each of the two second tabs in mechanical and electrical communication with a corresponding first tab of the two first tabs; and
        a plurality of thermoelectric elements in thermal communication with and in a region between the first plate and the second plate.

2. The system of claim 1, wherein the first plate of the at least one thermoelectric device does not extend over the surface of the printed circuit board.

3. The system of claim 1, wherein the printed circuit board comprises a plurality of electrical conduits in electrical communication with the plurality of first tabs, the plurality of electrical conduits configured to provide electrical power to the at least one thermoelectric device.

4. The system of claim 1, wherein the printed circuit board has a first thickness and the at least one thermoelectric device has a second thickness larger than the first thickness.

5. The system of claim 1, further comprising a gap between the edge of the printed circuit board and a first edge of the first plate of the at least one thermoelectric device, the system further comprising a compound within the gap and mechanically coupled to the edge of the printed circuit board and the first edge of the at least one thermoelectric device, the compound is configured to strengthen a mechanical coupling of the printed circuit board with the at least one thermoelectric device and to at least partially seal the two first tabs and the two second tabs that are in mechanical and electrical communication with two first tabs.

6. The system of claim 5, wherein at least one of the printed circuit board and the first portion of the second plate comprises at least two trenches configured to facilitate capillary flow of the compound from the gap to an area between the first portion of the second plate and the surface of the printed circuit board.

7. The system of claim 6, wherein the at least two trenches are on the printed circuit board and extend at least partially around the two first tabs and/or the at least two trenches are on the first portion of the second plate and extend at least partially around the two second tabs.

8. The system of claim 5, further comprising a coating extending over the surface of the printed circuit board and the first portion of the second plate of the at least one thermoelectric device, the coating configured to strengthen a mechanical coupling of the printed circuit board with the at least one thermoelectric device and to at least partially seal the two first tabs and the two second tabs that are in mechanical and electrical communication with the two first tabs.

9. The system of claim 1, wherein the printed circuit board and the at least one thermoelectric device are substantially planar with one another.

10. The system of claim 1, wherein the at least one thermoelectric device extends from the printed circuit board in a same direction as at least one other thermoelectric device extending from the printed circuit board, the at least one other thermoelectric device in mechanical and electrical communication with the printed circuit board, wherein the at least one thermoelectric device and the at least one other thermoelectric device extend from a same side of the printed circuit board.

11. The system of claim 10, wherein the at least one thermoelectric device is in series electrical communication with the at least one other thermoelectric device.

12. The system of claim 1, wherein the printed circuit board comprises a plurality of electrical conduits in electrical communication with the first tabs to provide electrical power to the at least one thermoelectric device.

13. The system of claim 1, wherein the at least one thermoelectric device is in thermal communication with a first heat spreader and a second heat spreader.

14. The system of claim 13, wherein an insulator plate is positioned between the first and second heat spreaders, the insulator plate having a hole configured to hold the at least one thermoelectric device.

15. The system of claim 13, wherein the first and second heat spreaders bound a region between the first and second heat spreaders, the at least one thermoelectric device wholly within the region.

16. The system of claim 13, wherein the printed circuit board comprises one or more holes configured to mate with corresponding one or more protrusions of a heat exchanger in thermal communication with the first heat spreader or the second heat spreader.

17. The system of claim 1, wherein the second plate comprises an etched line extending at least partially across the second plate to thermally insulate at least a portion of the second plate.

* * * * *